(12) United States Patent
Takaishi

(10) Patent No.: US 8,729,605 B2
(45) Date of Patent: May 20, 2014

(54) SEMICONDUCTOR SWITCH DEVICE

(75) Inventor: Masaru Takaishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/493,103

(22) Filed: Jun. 11, 2012

(65) Prior Publication Data

US 2012/0267710 A1  Oct. 25, 2012

Related U.S. Application Data

(63) Continuation of application No. 12/664,841, filed as application No. PCT/JP2008/060881 on Jun. 13, 2008, now Pat. No. 8,217,419.

(30) Foreign Application Priority Data

| Jun. 15, 2007 | (JP) | 2007-158185 |
| Jun. 19, 2007 | (JP) | 2007-160891 |
| Jun. 20, 2007 | (JP) | 2007-162885 |

(51) Int. Cl.

| H01L 29/66 | (2006.01) |
| H01L 29/78 | (2006.01) |
| H01L 29/866 | (2006.01) |
| H01L 29/06 | (2006.01) |
| H01L 29/10 | (2006.01) |
| H01L 27/02 | (2006.01) |

(52) U.S. Cl.
CPC .............. *H01L 29/78* (2013.01); *H01L 29/866* (2013.01); *H01L 29/7813* (2013.01); *H01L 29/0696* (2013.01); *H01L 29/1095* (2013.01); *H01L 27/0255* (2013.01)

USPC ........... 257/199; 257/249; 257/288; 257/401; 257/481; 257/551; 257/594; 257/603; 257/E29.335

(58) Field of Classification Search
CPC ... H01L 29/78; H01L 29/866; H01L 29/7813; H01L 29/0696; H01L 29/1095; H01L 27/0255
USPC ......... 257/106, 199, 249, 288, 401, 481, 551, 257/594, 603, E29.335, E21.356, E21.355
See application file for complete search history.

(56) References Cited

U.S. PATENT DOCUMENTS

| 4,928,159 | A | * | 5/1990 | Mihara et al. .................. 257/370 |
| 5,101,244 | A | | 3/1992 | Mori et al. |
| 5,731,970 | A | | 3/1998 | Mori et al. |
| 5,929,519 | A | | 7/1999 | Mori et al. |

(Continued)

FOREIGN PATENT DOCUMENTS

| JP | 64-061956 | 3/1989 |
| JP | 03-038881 | 2/1991 |

(Continued)

*Primary Examiner* — Michelle Mandala
(74) *Attorney, Agent, or Firm* — Fish & Richardson P.C.

(57) ABSTRACT

Provided is a semiconductor device in which on-resistance is largely reduced. In a region (2a) of an N type epitaxial layer (2) of the semiconductor device 20, each region between neighboring trenches (3) is blocked with a depletion layer (14) formed around a trench (3) so that a current passage (12) is interrupted, while a part of the depletion layer (14) formed around the trench (3) is deleted so that the current passage (12) is opened. In a region (2b), a junction portion (8) between the N type epitaxial layer (2) and a P+ type diffusion region (7) makes a Zener diode (8).

10 Claims, 27 Drawing Sheets

(56) References Cited

U.S. PATENT DOCUMENTS

| | | | |
|---|---|---|---|
| 6,057,558 A | 5/2000 | Yamamoto et al. | |
| 6,400,026 B1 | 6/2002 | Andou et al. | |
| 6,707,128 B2 | 3/2004 | Moriguchi et al. | |
| 6,743,703 B2 * | 6/2004 | Rodov et al. | 438/527 |
| 6,747,315 B1 | 6/2004 | Sakamoto | |
| 6,979,863 B2 | 12/2005 | Ryu | |
| 7,326,995 B2 * | 2/2008 | Darwish et al. | 257/330 |
| 2002/0036326 A1 * | 3/2002 | DeJong et al. | 257/369 |
| 2002/0190340 A1 | 12/2002 | Moriguchi et al. | |
| 2002/0195657 A1 | 12/2002 | Williams et al. | |
| 2004/0212011 A1 | 10/2004 | Ryu | |
| 2005/0127481 A1 | 6/2005 | Yoshimochi | |
| 2006/0118864 A1 | 6/2006 | Hirler et al. | |
| 2008/0197439 A1 | 8/2008 | Goerlach et al. | |
| 2009/0045457 A1 | 2/2009 | Bobde | |
| 2010/0181606 A1 | 7/2010 | Takaishi | |
| 2010/0193837 A1 | 8/2010 | Takaishi | |

FOREIGN PATENT DOCUMENTS

| | | |
|---|---|---|
| JP | 03-250670 A | 11/1991 |
| JP | 08-316470 A | 11/1996 |
| JP | 2001-007149 A | 1/2001 |
| JP | 2002-373989 A | 12/2002 |
| JP | 2003-224277 A | 8/2003 |
| JP | 2003-229570 A | 8/2003 |
| JP | 2005-175301 A | 6/2005 |
| JP | 2006-524432 A | 10/2006 |
| WO | WO 01/06569 A1 | 1/2001 |
| WO | WO 2004/097944 A3 | 11/2004 |

* cited by examiner

SEMICONDUCTOR SWITCH DEVICE

CROSS-REFERENCE TO RELATED APPLICATION(S)

This application is a continuation of U.S. Ser. No. 12/664,841, filed Dec. 15, 2009, which is a 371 of international application PCT/JP2008/060881 filed on Jun. 13, 2008, which in turn claims the benefit of Japanese Application No. 2007-162885, filed Jun. 20, 2007, and Japanese Application No. 2007-160891, filed Jun. 19, 2007, and Japanese Application No. 2007-158185, filed Jun. 15, 2007.

TECHNICAL FIELD

The present invention relates to a semiconductor device, and more particularly, to a semiconductor device having a switching function or the like.

BACKGROUND ART

Conventionally, a metal oxide semiconductor field effect transistor (MOSFET) is known as a semiconductor device having a switching function (see, for example, Patent Document 1). The Patent Document 1 discloses a trench gate MOSFET (semiconductor device) in which a gate electrode is embedded in a trench formed in a semiconductor layer.

FIG. 46 is a cross sectional view illustrating a structure of a conventional MOSFET (semiconductor device) disclosed in the Patent Document 1. With reference to FIG. 46, the conventional MOSFET (semiconductor device) includes an $N^+$ type semiconductor substrate 301 and an epitaxial layer (semiconductor layer) 302 formed on the upper surface of the semiconductor substrate 301. This epitaxial layer 302 includes an $N^-$ type impurity region (drain region) 302a, a P type impurity region 302b and an $N^+$ type impurity region (source region) 302c formed in this order from the semiconductor substrate 301 side.

In addition, the epitaxial layer 302 is provided with a trench 303 that is formed so as to penetrate the $N^+$ type impurity region 302c and the P type impurity region 302b and to reach a halfway depth of the $N^-$ type impurity region 302a. A gate electrode 305 is embedded in the trench 303 via a gate insulator film 304. In addition, an interlayer insulator film 306 is formed on the upper surface of the epitaxial layer 302 so as to close the opening end of the trench 303.

In addition, a source electrode 307 is formed on the upper surface of the epitaxial layer 302 so as to cover the interlayer insulator film 306. In addition, a drain electrode 308 is formed on the back surface of the semiconductor substrate 301.

In the conventional MOSFET having the above-mentioned structure, applied voltage to the gate electrode 305 is changed for on-off control.

Specifically, when a predetermined positive potential is applied to the gate electrode 305, minority carrier (electrons) in the P type impurity region 302b is attracted to the trench 303 side, and an inversion layer 309 is formed, which connects the $N^-$ type impurity region (drain region) 302a with the $N^+$ type impurity region (source region) 302c. Thus, current can flow between the source electrode 307 and the drain electrode 308 via the inversion layer 309. As a result, the MOSFET is turned on.

In this way, in the conventional MOSFET, the inversion layer 309, which is formed so as to connect the $N^-$ type impurity region (drain region) 302a with the $N^+$ type impurity region (source region) 302c, is made to function as a channel.

In addition, when the application of the predetermined positive potential to the gate electrode 305 is stopped from the above-mentioned state, the inversion layer (channel) 309 disappears so that the current flowing between the source electrode 307 and the drain electrode 308 can be interrupted. As a result, the MOSFET is turned off.

Patent Document 1: JP-A-2001-7149

DISCLOSURE OF THE INVENTION

Problem to be Solved by the Invention

However, in the conventional structure illustrated in FIG. 46, the inversion layer (channel) 309 formed in the turned-on state is very thin, so there is a disadvantage that it is difficult to reduce resistance against the current flowing in the inversion layer (channel) 309. As a result, there is a problem that it is difficult to improve on-resistance.

The present invention is created to solve the above-mentioned problem, and it is an object of the present invention to provide a semiconductor device that can largely reduce on-resistance based on a new principle of operation.

Means for Solving the Problem

In order to achieve the above-mentioned purpose, a semiconductor device according to a first aspect of the present invention includes a semiconductor layer of one conductivity type including an inside region and an outside region disposed outside the inside region, a plurality of trenches formed in the inside region of the semiconductor layer so as to be arranged with predetermined spaces, an opening end of each of the trenches being positioned on an upper surface side of the semiconductor layer, a plurality of diffusion regions of an inverse conductivity type formed in the outside region of the semiconductor layer so as to be arranged with predetermined spaces, an upper surface of each of the diffusion regions being exposed to the upper surface side of the semiconductor layer, a plurality of embedded electrodes filled in the plurality of trenches, and an electrode layer formed on the upper surface of the semiconductor layer so as to cover the inside region and the outside region of the semiconductor layer. Further, the inside region of the semiconductor layer has a structure in which each region between the neighboring trenches in the semiconductor layer becomes a current passage, and each region between the neighboring trenches in the semiconductor layer is blocked with a depletion layer formed around the trench so that the current passage is interrupted, while at least a part of the depletion layer formed around the trench is deleted so that the current passage is opened. A junction portion between the semiconductor layer and the diffusion region makes a Zener diode in the outside region of the semiconductor layer.

In the semiconductor device according to the first aspect, as described above, the plurality of trenches filled with the embedded electrode are formed in the inside region of the semiconductor layer of one conductivity type. Each region between the neighboring trenches in the semiconductor layer is blocked with the depletion layer formed around the trench so that the current passage (each region between the neighboring trenches in the semiconductor layer) is interrupted, while at least a part of the depletion layer formed around the trench is deleted so that the current passage (each region between the neighboring trenches in the semiconductor layer) is opened. For instance, if the embedded electrode is formed on the inner surface of the trench via an insulator film, a formation state of the depletion layer formed around the trench changes in accordance with applied voltage to the embedded electrode. Therefore, by controlling the applied voltage to the embedded electrode, it is possible to switch from the turned-on state (in which the current passage is opened) to the turned-off state (in which the current passage is interrupted), and to switch in the opposite direction. In other words, the semiconductor device can be used as a switch device (switching transistor). Further, in the above-mentioned structure, in the turned-on state, current can flow through the entire part of the current passage (each region between the neighboring trenches in the semiconductor layer) in which the depletion layer is deleted. Therefore, compared with the conventional MOSFET (semiconductor device) in which a very thin inversion layer functions as the channel (current passage), resistance against current can be reduced largely. Thus, compared with the conventional MOSFET (semiconductor device) in which a very thin inversion layer functions as the channel (current passage), on-resistance can be reduced largely.

In addition, in the semiconductor device according to the first aspect, as described above, a plurality of diffusion regions of an inverse conductivity type is formed in the outside region disposed outside the inside region in the semiconductor layer of one conductivity type, and the junction portion between the semiconductor layer and the diffusion region makes a Zener diode. Thus, it is possible to connect the Zener diode between the source and the drain of the switching transistor. Thus, even if noise voltage, surge voltage or the like enters the semiconductor device, the noise voltage, the surge voltage or the like can be absorbed by the Zener diode. Thus, it is possible to suppress malfunction such as breakage of the semiconductor device due to the noise voltage, the surge voltage or the like entering the semiconductor device.

In addition, in the above-mentioned structure, the switching transistor and the Zener diode are integrated, so it is not necessary to dispose another region or the like for forming a wiring member for connecting the switching transistor with the Zener diode. Thus, an area of the circuit including the switching transistor and the Zener diode that are connected to each other can be reduced.

In the semiconductor device according to the first aspect, preferably, a junction portion between each region between the neighboring diffusion regions of the semiconductor layer and the electrode layer makes a Schottky barrier diode in the outside region of the semiconductor layer. With this structure, between the source and the drain of the switching transistor, the Schottky barrier diode having shorter reverse recovery time than the Zener diode can further be connected in addition to the Zener diode. Thus, a decrease of the switching speed can be suppressed.

In addition, in the above-mentioned structure, the switching transistor, the Zener diode and the Schottky barrier diode are integrated. Therefore, it is not necessary to dispose another region or the like for forming a wiring member for connecting the switching transistor, the Zener diode and the Schottky barrier diode with each other. Thus, an area of the circuit including the switching transistor, the Zener diode and the Schottky barrier diode that are connected to each other can be reduced.

In this case, preferably, when a reverse bias is applied to the junction portion between each region between the neighboring diffusion regions of the semiconductor layer and the electrode layer in the outside region of the semiconductor layer, each region between the neighboring diffusion regions of the semiconductor layer is blocked with a depletion layer formed around the diffusion region. With this structure, when the reverse bias is applied to the Schottky barrier diode, current flowing through each region between the neighboring diffusion regions in the semiconductor layer can be interrupted. Thus, occurrence of leak current in the Schottky barrier diode can be suppressed.

Further, in the above-mentioned case, preferably, when the reverse bias is applied to the junction portion between each region between the neighboring diffusion regions of the semiconductor layer and the electrode layer in the outside region of the semiconductor layer, the depletion layers formed around the neighboring diffusion regions are connected to each other. With this structure, each region between the neighboring diffusion regions in the semiconductor layer can securely be blocked with the depletion layers.

Further, in the above-mentioned case, preferably, in the outside region of the semiconductor layer, a distance between the neighboring diffusion regions is set so that the depletion layers formed around the neighboring diffusion regions are overlapped with each other. With this structure, the depletion layers formed around the neighboring diffusion regions can easily be connected to each other.

In the semiconductor device according to the first aspect, it is possible to adopt the structure in which each region between the neighboring trenches is blocked with every depletion layer formed around each of the plurality of trenches so that the current passage is interrupted, while every depletion layer formed around each of the plurality of trenches is deleted so that the current passage is opened.

In the semiconductor device according to the first aspect, it is possible to adopt the structure in which the plurality of embedded electrodes include two types that are first embedded electrodes and second embedded electrodes to which voltages are applied separately, and each region between the neighboring trenches is blocked with the depletion layer formed around every trench among the plurality of trenches so that the current passage is interrupted, while the depletion layer formed around the trench filled with the first embedded electrode among the plurality of trenches is deleted so that the current passage is opened.

In this case, the second embedded electrode may have a Schottky contact with the semiconductor layer inside the trench.

The semiconductor device according to the first aspect may further include a current passage interrupting diffusion region of an inverse conductivity type formed in each region between the neighboring trenches of the semiconductor layer so as to be disposed with a predetermined space to the trench, in which each region between the neighboring trenches is blocked with depletion layers formed around the trench and around the current passage interrupting diffusion region so that the current passage is interrupted, while the depletion layer formed around the trench is deleted so that the current passage is opened.

Further, the semiconductor device according to the first aspect may have the structure in which when the current passage is interrupted, the depletion layers formed around the neighboring trenches are connected to each other. With this structure, each region between the neighboring trenches in the semiconductor layer can securely be blocked with the depletion layers.

Further, in the semiconductor device according to the first aspect, a distance between the neighboring trenches may be set so that the depletion layers formed around the neighboring trenches are overlapped with each other. With this structure, the depletion layers formed around the neighboring trenches can easily be connected to each other.

In addition, the semiconductor device according to the first aspect may further include an interlayer insulator film for insulating between the embedded electrode and the electrode layer, in which the embedded electrode is filled in the trench to a halfway depth, and the interlayer insulator film is filled in the remaining part of the trench that is not filled with the embedded electrode so that the upper surface of the interlayer insulator film becomes flush with the upper surface of the semiconductor layer. With this structure, even if a distance between the neighboring trenches is made to be small, the part of the upper surface side of the semiconductor layer (upper end portion of the region between the neighboring trenches in the semiconductor layer) is not entirely covered with the interlayer insulator film. Thus, the distance between the neighboring trenches can be reduced, so that the depletion layers formed around the neighboring trenches can easily be connected to each other.

A semiconductor device according to a second aspect of the present invention includes a semiconductor layer including first region of one conductivity type, and a second region of one conductivity type as well as a third region of an inverse conductivity type formed on the first region, a plurality of trenches formed in at least the second region of the semiconductor layer so as to be arranged with predetermined spaces, an opening end of each of the trenches being positioned on an upper surface side of the semiconductor layer, and a plurality of embedded electrodes filled in the plurality of trenches. Further, each region between the neighboring trenches in the second region becomes a current passage, and each region between the neighboring trenches in the second region is blocked with a depletion layer formed around the trench so that the current passage is interrupted, while the at least a part of the depletion layer formed around the trench is deleted so that the current passage is opened. A bidirectional Zener diode constituted of the plurality of diffusion regions is formed in the third region of the semiconductor layer. Note that the semiconductor layer of the present invention includes the semiconductor substrate.

In the semiconductor device according to the second aspect, as described above, at least in the second region of the semiconductor layer of one conductivity type, a plurality of trenches filled with the embedded electrode are formed, and each region between the neighboring trenches in the semiconductor layer is blocked with the depletion layer formed around the trench so that the current passage (each region between the neighboring trenches in the semiconductor layer) is interrupted, while at least a part of the depletion layer formed around the trench is deleted so that the current passage (each region between the neighboring trenches in the semiconductor layer) is opened. Thus, if the embedded electrode is formed on the inner surface of the trench via the insulator film for example, a formation state of the depletion layer formed around the trench changes in accordance with the applied voltage to the embedded electrode. Therefore, by controlling the applied voltage to the embedded electrode, it is possible to switch from the turned-on state (in which the current passage is opened) to the turned-off state (in which the current passage is interrupted), and to switch in the opposite direction. In other words, the semiconductor device can be used as a switch device (switching transistor). Further, in the above-mentioned structure, in the turned-on state, current can flow through the entire part of the current passage (each region between the neighboring trenches in the semiconductor layer) in which the depletion layer is deleted. Therefore, compared with the conventional MOSFET (semiconductor device) in which a very thin inversion layer functions as the channel (current passage), on-resistance can be reduced largely.

In addition, in the semiconductor device according to the second aspect, as described above, the bidirectional Zener diode made of a plurality of diffusion regions is formed in the third region so that the bidirectional Zener diode can be connected between the source and the drain as well as between the source and the gate of the switching transistor. Thus, even if static electricity, surge voltage or the like enters the semiconductor device, the static electricity, the surge voltage or the like can be absorbed by the bidirectional Zener diode. Therefore, it is possible to suppress dielectric breakdown or the like due to the static electricity, the surge voltage or the like entering the semiconductor device. As a result, it is possible to suppress occurrence of a malfunction such as a breakage of the semiconductor device due to dielectric breakdown or the like.

In addition, in the above-mentioned structure, the switching transistor and the bidirectional Zener diode are integrated, so it is not necessary to dispose another region or the like for forming a wiring member for connecting the switching transistor with the bidirectional Zener diode. Thus, an area of the circuit including the switching transistor and the bidirectional Zener diode that are connected to each other can be reduced.

The semiconductor device according to the second aspect may further include an electrode layer formed on at least the second region of the semiconductor layer, so that the second region of the semiconductor layer and a first part of the plurality of diffusion regions constituting the bidirectional Zener diode can be electrically connected via the electrode layer.

In this case, preferably, there is further provided a fourth region of one conductivity type formed on the first region, and a second part of the plurality of diffusion regions constituting the bidirectional Zener diode is electrically connected to the first region via the fourth region. With this structure, the bidirectional Zener diode can easily be connected between the source and the drain of the switching transistor.

In the above-mentioned structure including the electrode layer, preferably, a third part of the plurality of diffusion regions constituting the bidirectional Zener diode is electrically connected a predetermined embedded electrode among the plurality of embedded electrodes. With this structure, the bidirectional Zener diode can easily be connected between the gate and the source of the switching transistor.

In the semiconductor device according to the second aspect, preferably, the plurality of diffusion regions constituting the bidirectional Zener diode include first diffusion regions of one conductivity type and second diffusion regions of an inverse conductivity type. The first diffusion regions are arranged with predetermined spaces, and the second diffusion region is arranged between the neighboring first diffusion regions so as to contact with the first diffusion regions in a plan view. With this structure, the bidirectional Zener diode can easily be formed in the third region.

In addition, in the above-mentioned structure, by changing the number of the formed first diffusion regions and second diffusion regions, Zener voltage (breakdown voltage) of the bidirectional Zener diode can easily be adjusted. Therefore, the bidirectional Zener diode having a predetermined Zener voltage (breakdown voltage) can easily be connected between the source and the drain of the switching transistor as well as between the source and the gate of the same.

In the above-mentioned structure including the fourth region, the third region may be formed in a region outside the second region so as to enclose the second region in a plan view, and the fourth region may be formed in a region outside the third region so as to enclose the third region in a plan view.

The semiconductor device according to the second aspect may have the structure in which each region between the neighboring trenches is blocked with every depletion layer formed around each of the plurality of trenches so that the current passage is interrupted, while every depletion layer formed around each of the plurality of trenches is deleted so that the current passage is opened.

The semiconductor device according to the second aspect may have the structure in which the plurality of embedded electrodes include two types that are first embedded electrodes and second embedded electrodes to which voltages are applied separately, and each region between the neighboring trenches is blocked with the depletion layer formed around every trench among the plurality of trenches so that the current passage is interrupted, while the depletion layer formed around the trench filled with the first embedded electrode among the plurality of trenches is deleted so that the current passage is opened.

In this case, the second embedded electrode may have a Schottky contact with the semiconductor layer inside the trench.

The semiconductor device according to the second aspect may further include a current passage interrupting diffusion region of an inverse conductivity type formed in each region between the neighboring trenches of the semiconductor layer so as to be disposed with a predetermined space to the trench, in which each region between the neighboring trenches is blocked with depletion layers formed around the trench and around the current passage interrupting diffusion region so that the current passage is interrupted, while the depletion layer formed around the trench is deleted so that the current passage is opened.

Note that in the semiconductor device according to the second aspect, when current flowing through each region between the neighboring trenches in the second region is to be interrupted, the depletion layers formed around the neighboring trenches may be connected to each other. With this structure, each region between the neighboring trenches in the semiconductor layer can securely be blocked with the depletion layers formed around the neighboring trenches.

In addition, the semiconductor device according to the second aspect may further include an interlayer insulator film formed on the upper surface of the embedded electrode, in which the embedded electrode is filled in the trench to a halfway depth, and the interlayer insulator film is filled in the remaining part of the trench that is not filled with the embedded electrode so that the upper surface of the interlayer insulator film becomes flush with the upper surface of the semiconductor layer. With this structure, even if a distance between the neighboring trenches is made to be small, the part of the upper surface side of the semiconductor layer (upper end portion of the region between the neighboring trenches in the semiconductor layer) is not entirely covered with the interlayer insulator film. Thus, the distance between the neighboring trenches can be reduced, so that the depletion layers formed around the neighboring trenches can easily be connected to each other.

A semiconductor device according to a third aspect of the present invention includes a semiconductor layer including first region of one conductivity type, a second region of one conductivity type formed on the first region and a third region of an inverse conductivity type, a plurality of trenches formed in at least the second region of the semiconductor layer so as to be arranged with predetermined spaces, and a plurality of embedded electrodes filled in the plurality of trenches. Further, each region between the neighboring trenches in the semiconductor layer becomes a current passage, and each region between the neighboring trenches is blocked with a depletion layer formed around the trench so that the current passage is interrupted, while at least a part of the depletion layer formed around the trench is deleted so that the current passage is opened. A junction portion between the first region and the third region makes a Zener diode.

In the semiconductor device according to the third aspect, as described above, a plurality of trenches filled with the embedded electrode are formed in the second region of one conductivity type that is formed on the first region of one conductivity type, and each region between the neighboring trenches is blocked with the depletion layer formed around the trench so that the current passage (each region between the neighboring trenches in the semiconductor layer) is interrupted, while at least a part of the depletion layer formed around the trench is deleted so that the current passage (each region between the neighboring trenches in the semiconductor layer) is opened. Thus, if the embedded electrode is formed on the inner surface of the trench via the insulator film for example, a formation state of the depletion layer formed around the trench changes in accordance with the applied voltage to the embedded electrode. Therefore, by controlling the applied voltage to the embedded electrode, it is possible to switch from the turned-on state (in which the current passage is opened) to the turned-off state (in which the current passage is interrupted), and to switch in the opposite direction. In other words, the semiconductor device can be used as a switch device (switching transistor). Further, in the above-mentioned structure, in the turned-on state, current can flow through the entire part of the current passage (each region between the neighboring trenches in the semiconductor layer) in which the depletion layer is deleted. Therefore, compared with the conventional MOSFET (semiconductor device) in which a very thin inversion layer functions as the channel (current passage), on-resistance can be reduced largely.

In addition, the semiconductor device according to the third aspect, as described above, the third region of an inverse conductivity type is further disposed in addition to the second region of one conductivity type on the first region of one conductivity type, and the junction portion between the first region of one conductivity type and the third region of an inverse conductivity type makes a Zener diode. Thus, a Zener diode can be connected between the source and the drain of the switching transistor. Thus, even if static electricity, surge voltage or the like enters the semiconductor device, the static electricity, the surge voltage or the like can be absorbed by the Zener diode. Thus, it is possible to suppress dielectric breakdown or the like due to the static electricity, the surge voltage or the like entering the semiconductor device. As a result, it is possible to suppress a breakage of the semiconductor device.

In addition, in the above-mentioned structure, the switching transistor and the Zener diode are integrated, so it is not necessary to dispose another region or the like for forming a wiring member for connecting the switching transistor with the Zener diode. Thus, an area of the circuit including the switching transistor and the Zener diode that are connected to each other can be reduced.

In the semiconductor device according to the third aspect, preferably, the electrode layer may further be formed on the upper surface of the semiconductor layer, so that the second region and the third region are electrically connected to each other via the electrode layer. With this structure, the Zener diode can easily be connected between the source and the drain of the switching transistor.

In the semiconductor device according to the third aspect, preferably, the semiconductor layer includes the first region of one conductivity type, the second region of one conductivity type, the third region of an inverse conductivity type, and as well a Zener diode diffusion region of one conductivity type disposed in the third region of an inverse conductivity type. The junction portion between the third region and the Zener diode diffusion region makes a Zener diode. With this structure, the Zener diode can be connected between the source and the gate of the switching transistor as well as between the source and the drain of the switching transistor. Thus, it is possible to suppress dielectric breakdown or the like of the semiconductor device due to static electricity, surge voltage or the like.

In this case, preferably, the Zener diode diffusion region is electrically connected to a predetermined embedded electrode among the plurality of embedded electrodes. With this structure, the Zener diode can easily be connected between the source and the gate of the switching transistor.

The semiconductor device according to the third aspect may have the structure in which each region between the neighboring trenches is blocked with every depletion layer formed around each of the plurality of trenches so that the current passage interrupted, while every depletion layer formed around each of the plurality of trenches is deleted so that the current passage is opened.

The semiconductor device according to the third aspect may have the structure in which the plurality of embedded electrodes include two types that are first embedded electrodes and second embedded electrodes to which voltages are applied separately, and each region between the neighboring trenches is blocked with the depletion layer formed around every trench among the plurality of trenches so that the current passage is interrupted, while the depletion layer formed around the trench filled with the first embedded electrode among the plurality of trenches is deleted so that the current passage is opened.

In this case, second embedded electrode may have a Schottky contact with the semiconductor layer inside the trench.

The semiconductor device according to the third aspect may further include a current passage interrupting diffusion region of an inverse conductivity type formed in each region between the neighboring trenches of the semiconductor layer so as to be disposed with a predetermined space to the trench, in which each region between the neighboring trenches is blocked with depletion layers formed around the trench and around the current passage interrupting diffusion region so that the current passage is interrupted, while the depletion layer formed around the trench is deleted so that the current passage is opened.

Note that the semiconductor device according to the third aspect may have the structure in which when the current passage is interrupted, the depletion layers formed around the neighboring trenches are connected to each other. With this structure, the current passage (each region between the neighboring trenches in the semiconductor layer) can securely be blocked with the depletion layer.

Further, in the semiconductor device according to the third aspect, a distance between the neighboring trenches may be set so that the depletion layers formed around the neighboring trenches are overlapped with each other. With this structure, the depletion layers formed around the neighboring trenches can easily be connected to each other.

Effects of the Invention

As described above, according to the present invention, the semiconductor device that can largely reduce on-resistance based on a new principle of operation can easily be obtained.

EXPLANATION OF NUMERALS

Figure 1:
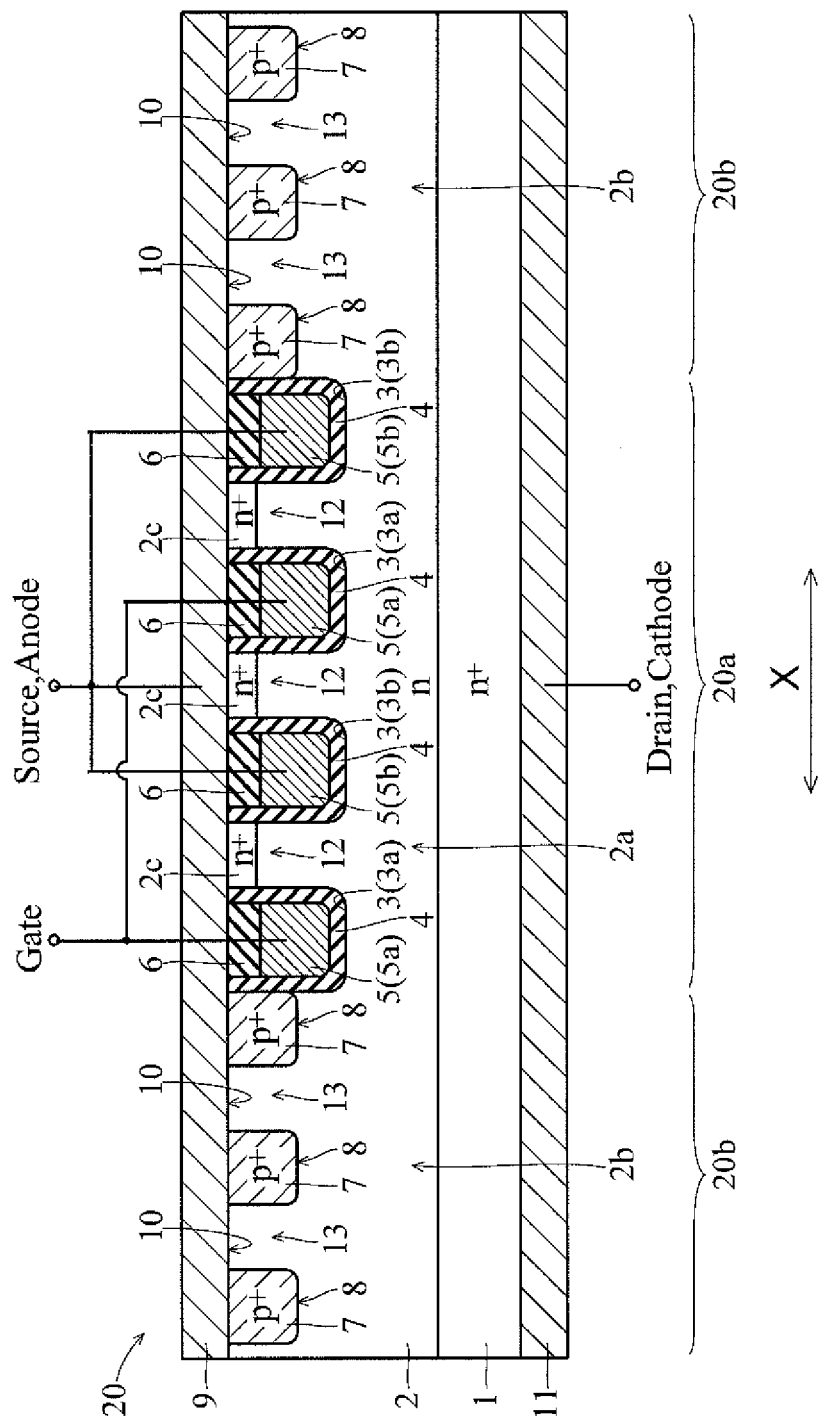
FIG. 1 is a cross sectional view illustrating a semiconductor device according to a first embodiment of the present invention.

1 $N^+$ type silicon substrate (semiconductor layer)
2, 102, 202 N type epitaxial layer (semiconductor layer)
2a region (inside region)
2b region (outside region)
3, 3a, 3b, 3c, 103, 103a, 103b, 103c, 203, 203a, 203b, 203c trench
5, 105, 205 embedded electrode
5a, 105a, 205a embedded electrode (first embedded electrode)
5b, 105b, 205b embedded electrode (second embedded electrode)
7 $P^+$ type diffusion region (diffusion region)
8 junction portion (Zener diode)
9, 41 upper surface electrode layer (electrode layer)
10 junction portion (Schottky barrier diode)
12, 32, 42, 52, 113, 132, 142, 152, 212, 242, 252, 262 current passage
14, 14a, 14b, 14c, 14d, 14e, 114, 114a, 114b, 114c, 114d, 213, 213a, 213b, 213c, 213d depletion layer
20, 30, 40, 50, 120, 130, 140, 150, 220, 230, 240, 250, 260 semiconductor device
41a, 141a, 251a embedded portion (second embedded electrode)
51, 151, 261 $P^+$ type diffusion region (diffusion region for current passage interruption)
101, 201 $N^+$ type silicon substrate (semiconductor layer, first region)
102a, 202a N type well region (second region)
102b, 202b $P^-$ type region (third region)
102c N type well region (fourth region)
107 $N^+$ type diffusion region (diffusion region, first diffusion region)
107a $N^+$ type diffusion region (first part)
107b $N^+$ type diffusion region (second part)
107c $N^+$ type diffusion region (third part)
108 $P^+$ type diffusion region (diffusion region, second diffusion region)
109, 141, 209, 251 source electrode (electrode layer)
207a $N^+$ type diffusion region (Zener diode diffusion region)

BEST MODE FOR CARRYING OUT THE INVENTION

First Embodiment

Hereinafter, with reference to FIGS. 1 to 3, a structure of a semiconductor device 20 according to a first embodiment will be described.

Figure 2:
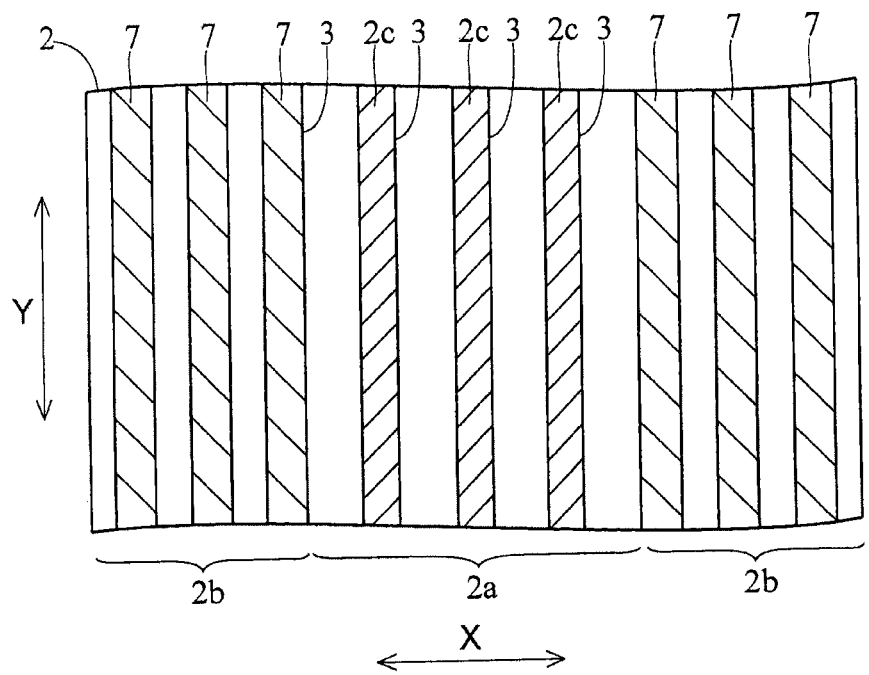
FIG. 2 is a plan view illustrating a plane shape of a trench and a diffusion region of the semiconductor device according to the first embodiment illustrated in FIG. 1.

The semiconductor device 20 according to the first embodiment includes a region 20a and a region 20b disposed outside of the region 20a as illustrated in FIGS. 1 and 2. Further, the region 20a of the semiconductor device 20 is adapted to function as normally-off type switching transistors, and the region 20b of the semiconductor device 20 is adapted to function as diodes (Zener diodes and Schottky barrier diodes). In other words, the semiconductor device 20 of the first embodiment has a structure in which the switching transistors and diodes (Zener diodes and Schottky barrier diodes) are disposed integrally.

As a concrete structure, in the semiconductor device 20 of the first embodiment, an N type epitaxial layer 2 made of N type silicon having a thickness of approximately 1 to 10 μm is formed on an upper surface of an N$^+$ type silicon substrate 1. An N type impurity is doped into the N$^+$ type silicon substrate 1 at high concentration so as to have a good ohmic contact with a back surface electrode layer 11 that will be described later. In addition, an N type impurity is doped into the N type epitaxial layer 2 at a concentration (approximately $5\times10^{15}$ to $1\times10^{18}$ cm$^3$) that is lower than the concentration in the N$^+$ type silicon substrate 1. In addition, the N type epitaxial layer 2 includes a region 2a (corresponding to the region 20a of the semiconductor device 20) and a region 2b (corresponding to the region 20b of the semiconductor device 20) disposed outside of the region 2a. Note that the N$^+$ type silicon substrate 1 and the N type epitaxial layer 2 is an example of the "semiconductor layer of one conductivity type" in the present invention. In addition, the regions 2a and 2b are examples of the "inside region" and the "outside region" in the present invention, respectively.

In addition, in the region 2a of the N type epitaxial layer 2, there are formed a plurality of trenches 3, which are dug in the thickness direction of the N type epitaxial layer 2. The plurality of trenches 3 are formed by etching the N type epitaxial layer 2 from the upper surface (principal surface) side. In other words, opening ends of the plurality of trenches 3 are positioned on the upper surface side of the N type epitaxial layer 2.

In addition, in a plan view, each of the plurality of trenches 3 is formed in an elongated shape extending in a predetermined direction (Y direction) that is parallel to the upper surface of the N type epitaxial layer 2. In addition, the plurality of trenches 3 are arranged in the direction (X direction) that is parallel to the upper surface of the N type epitaxial layer 2 and is perpendicular to the extending direction of the trench 3 (Y direction) with spaces of approximately 0.05 to 0.3 μm. Further, a depth of each of the plurality of trenches 3 is set to approximately 0.5 to 12 μm. The depth of the trench 3 of the first embodiment is set to be smaller than the thickness of the N type epitaxial layer 2 (approximately 1 to 10 μm). Note that the trench 3 may penetrate the N type epitaxial layer 2 so as to reach the N$^+$ type silicon substrate 1 (not shown). In addition, a width of each of the plurality of trenches 3 in the X direction is set to approximately 0.1 to 1 μm. The above-mentioned trenches 3 are formed only in the region 2a of the N type epitaxial layer 2 and are not formed in the region 2b of the N type epitaxial layer 2.

In addition, on the inner surface of each of the plurality of trenches 3, there is formed a silicon oxide film (insulator film) 4 obtained by a thermal oxidation process of the N type silicon constituting the N type epitaxial layer 2, at a thickness of approximately 10 to 100 nm.

In addition, on the inner surface of each of the plurality of trenches 3, there is formed an embedded electrode 5 made of P type polysilicon via the silicon oxide film 4. Each of the plurality of embedded electrodes 5 is filled in the corresponding trench 3 to a halfway depth thereof. Note that a metal or the like can be used instead of the P type polysilicon as a structural material of the embedded electrode 5.

In the structure of the first embodiment in which the plurality of embedded electrodes 5 are disposed, by controlling the applied voltage to the plurality of embedded electrodes 5, it is possible to form a depletion layer around each of the plurality of trenches 3 or to delete the formed depletion layer. Further, in the first embodiment, the distance between the neighboring trenches 3 is set so that when the depletion layer is formed around each of the plurality of trenches 3, the depletion layers formed around neighboring trenches 3 are overlapped with each other. In other words, when the depletion layer is formed around each of the plurality of trenches 3, the depletion layers formed around neighboring trenches 3 are connected to each other. Therefore, in the first embodiment, when the depletion layer is formed around each of the plurality of trenches 3, each region between the neighboring trenches 3 in the N type epitaxial layer 2 can be blocked with the depletion layers.

In addition, the plurality of embedded electrodes 5 of the first embodiment are divided into two types of embedded electrodes 5a and 5b that are applied with voltages separately. One type of embedded electrode 5a is adapted to be applied with a voltage corresponding to a predetermined control signal (for switching between on and off). In addition, the other type of embedded electrode 5b is electrically connected to an upper surface electrode layer 9 that will be described later. In other words, other type embedded electrodes 5b is adapted to be the same potential as the upper surface electrode layer 9. In addition, the embedded electrodes 5a and 5b are arranged alternately one by one in the X direction. Therefore, one embedded electrode 5b (5a) is disposed between the two embedded electrode 5a (5b). Note that the embedded electrodes 5a and 5b are examples of the "first embedded electrode" and the "second embedded electrode" in the present invention, respectively.

In addition, an interlayer insulator film 6 made of a silicon oxide film is embedded in the remaining part that is not filled with the embedded electrode 5 of each of the plurality of trenches 3 (part over the embedded electrode 5). Each of the plurality of interlayer insulator films 6 is provided for insulating between the corresponding embedded electrode 5 and the upper surface electrode layer 9 that will be described later. In addition, the thickness of each of the plurality of interlayer insulator films 6 is set to be the same as the depth of the remaining part that is not filled with the embedded electrode 5 of the corresponding trench 3 (part over the embedded electrode 5). Therefore, the upper surface of each of the plurality of interlayer insulator films 6 is flush with the upper surface of the N type epitaxial layer 2 (upper surface of the upper end portion of each region between the neighboring trenches 3).

In addition, on the upper surface portion of the region 2a of the N type epitaxial layer 2 (upper end portion of each region between the neighboring trenches 3), there is formed a high concentration region 2c in which the N type impurity is doped at high concentration by ion injection so that a low concentration region is not exposed on the upper surface side of the region 2a of the N type epitaxial layer 2. The concentration of the high concentration region 2c of the N type epitaxial layer 2 is set so that a good ohmic contact can be obtained with the upper surface electrode layer 9 that will be described later, and is higher than concentration of the N type impurity in other part of the N type epitaxial layer 2. Further, the thickness of the high concentration region 2c of the N type epitaxial layer 2 (depth of the ion injection) is set to be smaller than the thickness of the interlayer insulator film 6. In other words, the lower end portion of the high concentration region 2c of the N type epitaxial layer 2 is positioned higher than the upper end portion of the embedded electrode 5.

On the other hand, in the region 2b of the N type epitaxial layer 2, there is formed a plurality of P+ type diffusion regions 7 in which P type impurity is doped at high concentration (approximately $1 \times 10^{17}$ to $1 \times 10^{20}$ cm$^{-3}$). Each of the plurality of P+ type diffusion regions 7 is formed by ion injection of P type impurity from the upper surface side of the N type epitaxial layer 2. In other words, the upper surface of each of the plurality of P+ type diffusion regions 7 is exposed on the upper surface side of the region 2b of the N type epitaxial layer 2. In addition, concentration of each of the plurality of P+ type diffusion regions 7 is set so as to obtain a good ohmic contact with the upper surface electrode layer 9 that will be described later. Note that the P+ type diffusion region 7 is an example of the "diffusion region of an inverse conductivity type" in the present invention.

In addition, in a plan view, each of the plurality of P+ type diffusion regions 7 is formed in an elongated shape extending in the same direction as the extending direction (Y direction) of the elongated trench 3. In addition, the plurality of P+ type diffusion regions 7 are arranged with predetermined spaces in the same direction as the arrangement direction (X direction) of the plurality of trenches 3. Further, the thickness of each of the plurality of P+ type diffusion regions 7 (depth of the ion injection) is set to approximately 0.5 to 10 μm. In addition, the width of each of the plurality of P+ type diffusion regions 7 in the X direction is set to approximately 0.1 to 2 μm. Note that the plurality of P+ type diffusion regions 7 are formed only in the region 2b of the N type epitaxial layer 2 and are not formed in the region 2a of the N type epitaxial layer 2.

In the structure of the first embodiment in which the plurality of P+ type diffusion regions 7 are disposed, it is possible to make each junction portion 8 between each of the plurality of P+ type diffusion regions 7 and the N type epitaxial layer 2 function as a Zener diode. In the following description, the junction portion 8 is referred to as a Zener diode 8. Note that in the first embodiment, breakdown voltage of the Zener diode 8 is set to be lower than withstand voltage of the silicon oxide film 4.

Further, in the structure of the first embodiment in which the plurality of P+ type diffusion regions 7 are disposed, the applied voltage to the plurality of P+ type diffusion regions 7 is controlled, so that the depletion layer can be formed around each of the plurality of P+ type diffusion regions 7 or the formed depletion layer can be deleted. Then, in the first embodiment, the distance between the neighboring P+ type diffusion regions 7 is set so that the depletion layers formed around the neighboring P+ type diffusion regions 7 are overlapped with each other when the depletion layer is formed around each of the plurality of P+ type diffusion regions 7. In other words, when the depletion layer is formed around each of the plurality of P+ type diffusion regions 7, the depletion layers formed around the neighboring P+ type diffusion regions 7 are connected to each other. Therefore, in the first embodiment, when the depletion layer is formed around each of the plurality of P+ type diffusion regions 7, each region between the neighboring P+ type diffusion regions 7 in the N type epitaxial layer 2 is blocked with the depletion layer.

In addition, on the upper surface of the N type epitaxial layer 2, there is formed the upper surface electrode layer 9 constituted of a metal layer (e.g., aluminum layer) or the like. The upper surface electrode layer 9 is formed so as to cover both the regions 2a and 2b of the N type epitaxial layer 2. Note that the upper surface electrode layer 9 is an example of the "electrode layer" in the present invention.

The upper surface electrode layer 9 covers opening ends of the plurality of trenches 3 in the region 2a of the N type epitaxial layer 2, and has an ohmic contact with the upper end portion of each region between the neighboring trenches 3 (upper surface of the high concentration region 2a) of the N type epitaxial layer 2. In contrast, in the region 2b of the N type epitaxial layer 2, the upper surface electrode layer 9 has an ohmic contact with the exposed upper surface of each of the plurality of P+ type diffusion regions 7.

Further, in the region 2b of the N type epitaxial layer 2, the upper surface electrode layer 9 has a Schottky contact with the upper end portion of each region between the neighboring P+ type diffusion regions 7 in the N type epitaxial layer 2 (upper surface of the low concentration region). Therefore, each junction portion 10 between the upper surface electrode layer 9 and the upper end portion of each region between the neighboring P+ type diffusion regions 7 in the N type epitaxial layer 2 functions as a Schottky barrier diode. In the following description, the junction portion 10 is referred to as a Schottky barrier diode 10.

Note that the upper surface electrode layer 9 functions as one of source and drain electrodes of the switching transistor (e.g., a source electrode) in the region 20a functioning as a switching transistor of the semiconductor device 20. In contrast, in the region 20b functioning as a diode of the semiconductor device 20, the upper surface electrode layer 9 functions as anode electrodes of the Zener diode 8 and the Schottky barrier diode 10.

In addition, on the back surface of the N+ type silicon substrate 1, there is formed a back surface electrode layer 11 having a multilayer structure in which a plurality of metal layers are laminated. The back surface electrode layer 11 has an ohmic contact with the back surface of the N+ type silicon substrate 1 over the entire region. Note that the back surface electrode layer 11 functions as the other electrode of source and drain electrodes of the switching transistor (e.g., a drain electrode) in the region 20a functioning as a switching transistor of the semiconductor device 20. In contrast, in the region 20b functioning as a diode of the semiconductor device 20, the back surface electrode layer 11 functions as cathode electrodes of the Zener diode 8 and the Schottky barrier diode 10.

In the structure described above, in the region 20a functioning as a switching transistor of the semiconductor device 20, when a voltage is applied between the upper surface electrode layer 9 and the back surface electrode layer 11, current flowing between the upper surface electrode layer 9 and the back surface electrode layer 11 (current flowing in the thickness direction of the N type epitaxial layer 2) passes through each region between the neighboring trenches 3 in the N type epitaxial layer 2. In other words, each region between the neighboring trenches 3 in the N type epitaxial layer 2 functions as a current passage (channel) 12 of the switching transistor.

In addition, in the region 20b functioning as a diode of the semiconductor device 20, when a voltage is applied between the upper surface electrode layer 9 and the back surface electrode layer 11 (when the applied voltage of the Zener diode 8 and the Schottky barrier diode 10 is a forward bias), current that passes through the Schottky barrier diode 10 flows in each region between the neighboring P+ type diffusion regions 7 in the N type epitaxial layer 2. In other words, each region between the neighboring P+ type diffusion regions 7 in the N type epitaxial layer 2 functions as a current passage 13 for the current that passes through the Schottky barrier diode 10 to flow.

Figure 3:
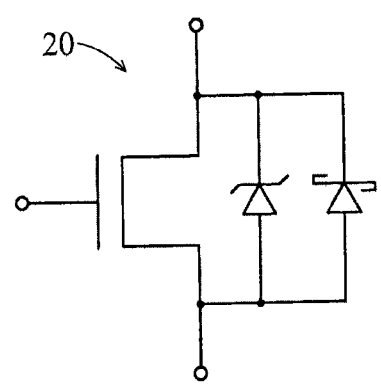
FIG. 3 is an equivalent circuit diagram of the semiconductor device according to the first embodiment illustrated in FIG. 1.

Further, the semiconductor device 20 of the first embodiment having the above-mentioned structure can be represented by the equivalent circuit as illustrated in FIG. 3. In other words, as illustrated in FIG. 3, the semiconductor device 20 of the first embodiment has the circuit in which the Zener diode and the Schottky barrier diode are electrically connected between the source and the drain of the switching transistor. Note that the part of the switching transistor of the semiconductor device 20 is represented by a circuit symbol of a MOSFET in FIG. 3 for convenience' sake.

Next, with reference to FIGS. 4 and 5, an operation of the region 20a functioning as a switching transistor of the semiconductor device 20 according to the first embodiment will be described. Note that FIG. 4 illustrates the case where the region 20a functioning as a switching transistor of the semiconductor device 20 is in the turned-off state while FIG. 5 illustrates the case where the region 20a functioning as a switching transistor of the semiconductor device 20 is in the turned-on state.

Figure 4:
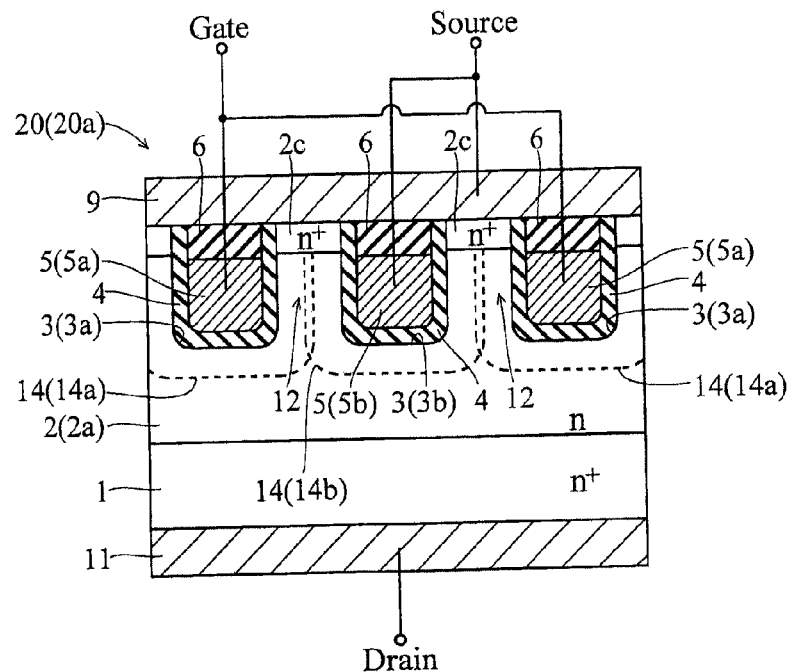
FIG. 4 is a cross sectional view illustrating an operation of a region functioning as a switching transistor of the semiconductor device according to the first embodiment of the present invention.
Figure 5:
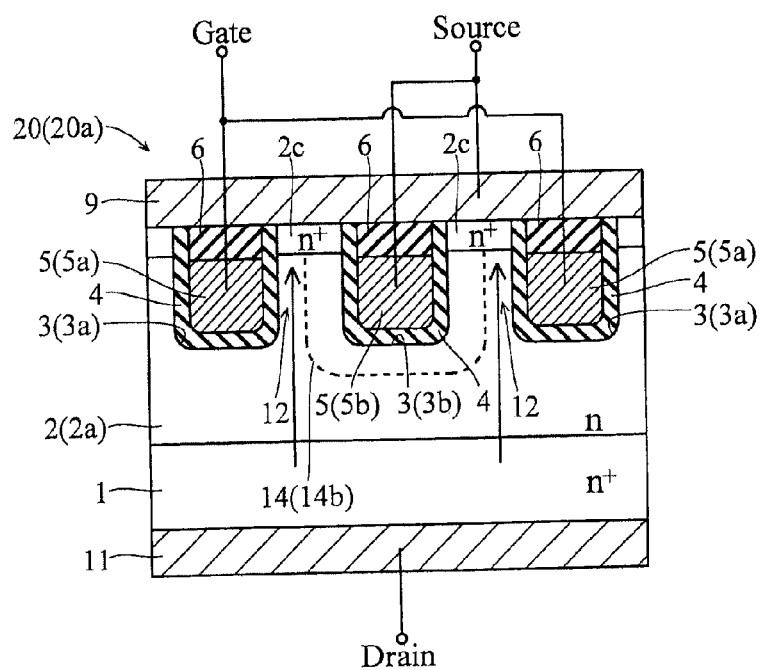
FIG. 5 is a cross sectional view illustrating an operation of the region functioning as a switching transistor of the semiconductor device according to the first embodiment of the present invention.

First, as illustrated in FIGS. 4 and 5, in the region 20a functioning as a switching transistor, it is supposed that a negative potential and a positive potential are applied to the upper surface electrode layer (source electrode) 9 and the back surface electrode layer (drain electrode) 11, respectively. Then, the negative potential is applied to the embedded electrode 5b because the embedded electrode 5b is electrically connected to the upper surface electrode layer (source electrode) 9. Therefore, majority carrier is decreased around the trench 3 filled with the embedded electrode 5b (hereinafter referred to as a trench 3b). In other words, a depletion layer 14 (14b) is formed around the trench 3b regardless of the turned-on state or the turned-off state.

Further, as illustrated in FIG. 4, in the region 20a functioning as a switching transistor, if the semiconductor device 20 is in the turned-off state, the applied voltage to the embedded electrode 5a is controlled so that majority carrier existing around the trench 3 (hereinafter referred to as a trench 3a) filled with the embedded electrode 5a is decreased. Thus, a depletion layer 14 (14a) is formed around the trench 3a similarly to the depletion layer 14b formed around the trench 3b.

In this case, in the region 20a functioning as a switching transistor, the depletion layers 14a and 14b formed around the trenches 3a and 3b are overlapped with each other in the region between the trench 3a and the trench 3b. In other words, in the region between the trench 3a and the trench 3b, the depletion layers 14a and 14b are connected to each other. Thus, current flowing through the current passage 12 can be interrupted because the current passage 12 is blocked with the depletion layers 14a and 14b. Therefore, the semiconductor device 20 is turned off.

Next, as illustrated in FIG. 5, in the region 20a functioning as a switching transistor, if the semiconductor device 20 is to be switched from the turned-off state to the turned-on state, a predetermined positive potential is applied to the embedded electrode 5a so that the depletion layer 14a formed around the trench 3a (see FIG. 4) is deleted. In other words, the depletion layer 14a that blocks the part of the current passage 12 on the embedded electrode 5a side is deleted. Thus, current can flow through the part of the current passage 12 on the embedded electrode 5a side in the arrow direction in FIG. 5, so that the semiconductor device 20 can be turned on.

In addition, if the semiconductor device 20 is to be switched from the turned-on state to the turned-off state in the region 20a functioning as a switching transistor, the application of the predetermined positive potential to the embedded electrode 5a is stopped. Thus, the state illustrated in FIG. 4 is restored, so that the semiconductor device 20 can be turned off.

Next, with reference to FIGS. 6 and 7, an operation of the region 20b functioning as a diode of the semiconductor device 20 according to the first embodiment will be described. Note that FIG. 6 illustrates the state where a reverse bias is applied to the region 20b functioning as a diode of the semiconductor device 20 while FIG. 7 illustrates the state where a forward bias is applied to the region 20b functioning as a diode of the semiconductor device 20.

Figure 6:
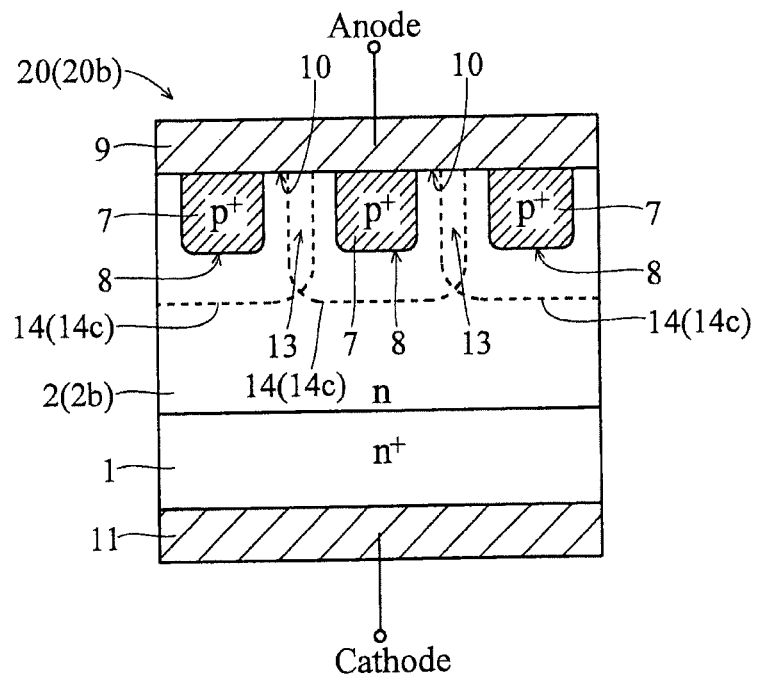
FIG. 6 is a cross sectional view illustrating an operation of a region functioning as a diode of the semiconductor device according to the first embodiment of the present invention.

First, as illustrated in FIG. 6, in the region 20b functioning as a diode, when the reverse bias is applied to between the upper surface electrode layer (anode electrode) 9 and the back surface electrode layer (cathode electrode) 11, the negative potential is applied to the $P^+$ type diffusion region 7 because the $P^+$ type diffusion region 7 is electrically connected the upper surface electrode layer (anode electrode) 9. Therefore, majority carrier is decreased around the $P^+$ type diffusion region 7. In other words, a depletion layer 14 (14c) is formed around the $P^+$ type diffusion region 7.

In this case, in the region 20b functioning as a diode, the depletion layers 14c formed around the neighboring $P^+$ type diffusion regions 7 are overlapped with each other in the region between the neighboring $P^+$ type diffusion regions 7. In other words, in the region between the neighboring $P^+$ type diffusion regions 7, the depletion layers 14c formed around the neighboring $P^+$ type diffusion regions 7 are connected to each other. Thus, the current passage 13 is blocked with the depletion layers 14c, so that occurrence of leak current in the Schottky barrier diode 10 is suppressed.

Figure 7:
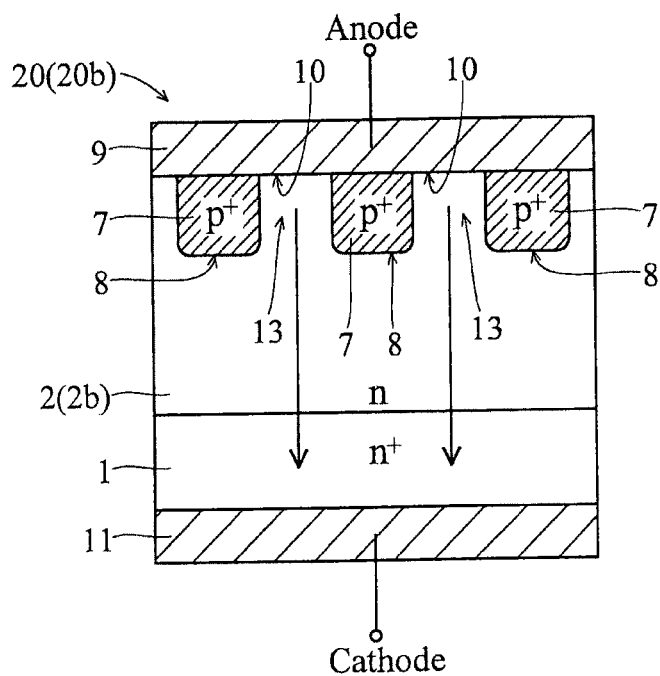
FIG. 7 is a cross sectional view illustrating an operation of a region functioning as the diode of the semiconductor device according to the first embodiment of the present invention.

In addition, as illustrated in FIG. 7, in the region 20b functioning as a diode, when a forward bias is applied between the upper surface electrode layer (anode electrode) 9 and the back surface electrode layer (cathode electrode) 11, the positive potential is applied to the $P^+$ type diffusion region 7 because the $P^+$ type diffusion region 7 is electrically connected to the upper surface electrode layer (anode electrode) 9. Therefore, the depletion layer 14c (see FIG. 6) formed around the $P^+$ type diffusion region 7 is deleted. In other words, the depletion layer 14c that blocks the current passage 13 is deleted. Thus, the current that passes through the Schottky barrier diode 10 flows through the current passage 13 in the arrow direction in FIG. 7.

In the first embodiment as described above, each region between the neighboring trenches 3 in the N type epitaxial layer 2 is blocked with the depletion layer 14 formed around the trench 3 in the region 2a of the N type epitaxial layer 2, so that the current passage 12 is interrupted. In contrast, at least a part of the depletion layer 14 formed around the trench 3 (depletion layer 14a formed around the trench 3a) is deleted so that the current passage 12 is opened. Thus, a formation state of the depletion layer 14 formed around the trench 3 changes in accordance with the applied voltage to the embedded electrode 5. Therefore, by controlling the applied voltage to the embedded electrode 5, it is possible to switch from the turned-on state (in which the current passage 12 is opened) to the turned-off state (in which the current passage 12 is interrupted), and to switch in the opposite direction. In other words, the semiconductor device 20 can be used as a switch device (switching transistor). Further, in the above-mentioned structure, in the turned-on state, current can flow through the entire part of the current passage 12 in which the depletion layer 14 is deleted. Therefore, compared with the conventional MOSFET (semiconductor device) in which a very thin inversion layer functions as the channel (current passage), resistance against current can be reduced largely. Thus, compared with the conventional MOSFET (semiconductor device) in which a very thin inversion layer functions as the channel (current passage), on-resistance can be reduced largely.

In addition, in the first embodiment, as described above, in the region 2b disposed on the outside of the region 2a in the N type epitaxial layer 2, the junction portion 8 between the N type epitaxial layer 2 and the P+ type diffusion region 7 is adapted to be the Zener diode 8, so that the Zener diode 8 is connected between the source and the drain of the switching transistor. Thus, even if noise voltage, surge voltage or the like enters the semiconductor device 20, the noise voltage, the surge voltage or the like can be absorbed by the Zener diode 8. Thus, it is possible to suppress malfunction such as breakage of the semiconductor device 20 due to the noise voltage or the surge voltage entering the semiconductor device 20.

In addition, in the first embodiment, as described above, the junction portion 10 between the each region between the neighboring P+ type diffusion regions 7 in the N type epitaxial layer 2 and the upper surface electrode layer 9 constitutes the Schottky barrier diode 10 in the region 2b of the N type epitaxial layer 2, so that the Zener diode 8 and a Schottky barrier diode 10 having a reverse recovery time shorter than that of the Zener diode 8 are connected between the source and the drain of the switching transistor. Thus, it is possible to suppress a decrease of switching speed.

In addition, according to the structure of the first embodiment described above, the switching transistor, the Zener diode 8 and the Schottky barrier diode 10 are integrated. Therefore, it is not necessary to dispose another region or the like for forming a wiring member for connecting the switching transistor, the Zener diode 8 and the Schottky barrier diode 10 to each other. Thus, an area of the circuit including the switching transistor, the Zener diode 8 and the Schottky barrier diode 10 that are connected to each other can be reduced.

In addition, in the first embodiment, as described above, when a reverse bias is applied to Schottky barrier diode 10 in the region 2b of the N type epitaxial layer 2, each region between the neighboring P+ type diffusion regions 7 in the N type epitaxial layer 2 is blocked with the depletion layer 14 formed around the P+ type diffusion region 7. Thus, when the reverse bias is applied to the Schottky barrier diode 10, current flowing through each region between the neighboring P+ type diffusion regions 7 in the N type epitaxial layer 2 can be interrupted. Thus, occurrence of leak current in the Schottky barrier diode 10 can be suppressed. In this case, the depletion layers 14 formed around the neighboring P+ type diffusion regions 7 are connected to each other, so that each region between the neighboring P+ type diffusion regions 7 in the N type epitaxial layer 2 can securely be blocked with the depletion layers 14.

In addition, in the first embodiment, as described above, the distance between the neighboring P+ type diffusion regions 7 is set so that the depletion layers 14 formed around the neighboring P+ type diffusion regions 7 are overlapped with each other in the region 2b of the N type epitaxial layer 2. Thus, the depletion layers 14 formed around the neighboring P+ type diffusion regions 7 can easily be connected to each other.

In addition, in the first embodiment, as described above, when the current passage 12 is to be interrupted in the region 2a of the N type epitaxial layer 2, the depletion layers 14 formed around the neighboring trenches 3 are connected to each other, so that the current passage 12 can securely be blocked with the depletion layers 14.

In addition, in the first embodiment, as described above, the distance between the neighboring trenches 3 is set so that the depletion layers 14 formed around the neighboring trenches 3 are overlapped with each other in the region 2a of the N type epitaxial layer 2. Thus, the depletion layer 14 formed around the neighboring trenches 3 can easily be connected to each other.

In addition, in the first embodiment, as described above, the interlayer insulator film 6 is filled in the trench 3 so that the upper surface of the interlayer insulator film 6 becomes flush with the upper surface of the N type epitaxial layer 2 in the region 2a of the N type epitaxial layer 2. Thus, even if the distance between the neighboring trenches 3 is made to be small, the part of the N type epitaxial layer 2 on the upper surface side (upper end portion of the region between the neighboring trenches 3) is not entirely covered with the interlayer insulator film 6. Thus, the distance between the neighboring trenches 3 can be reduced, so that the depletion layers 14 formed around the neighboring trenches 3 can easily be connected to each other.

Figure 8:
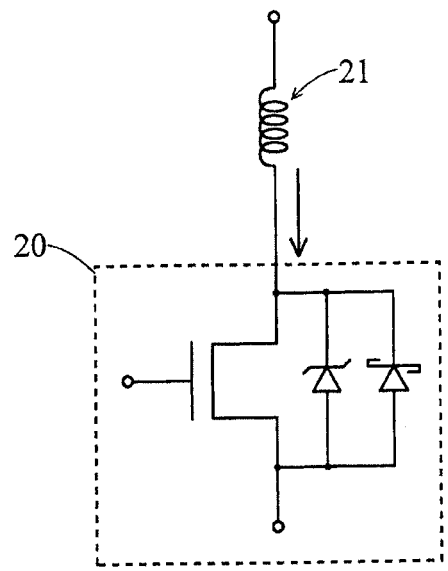
FIG. 8 is a diagram illustrating an effect of the semiconductor device according to the first embodiment of the present invention.

In addition, as illustrated in FIG. 8, if a coil 21 or the like is connected to the semiconductor device 20 of the first embodiment, energy from the coil 21 (illustrated by the arrow in FIG. 8) can be absorbed by the Zener diode 8.

Second Embodiment

Hereinafter, with reference to FIG. 9, a structure of the region 30a functioning as a switching transistor of the semiconductor device 30 according to the second embodiment will be described.

Figure 9:
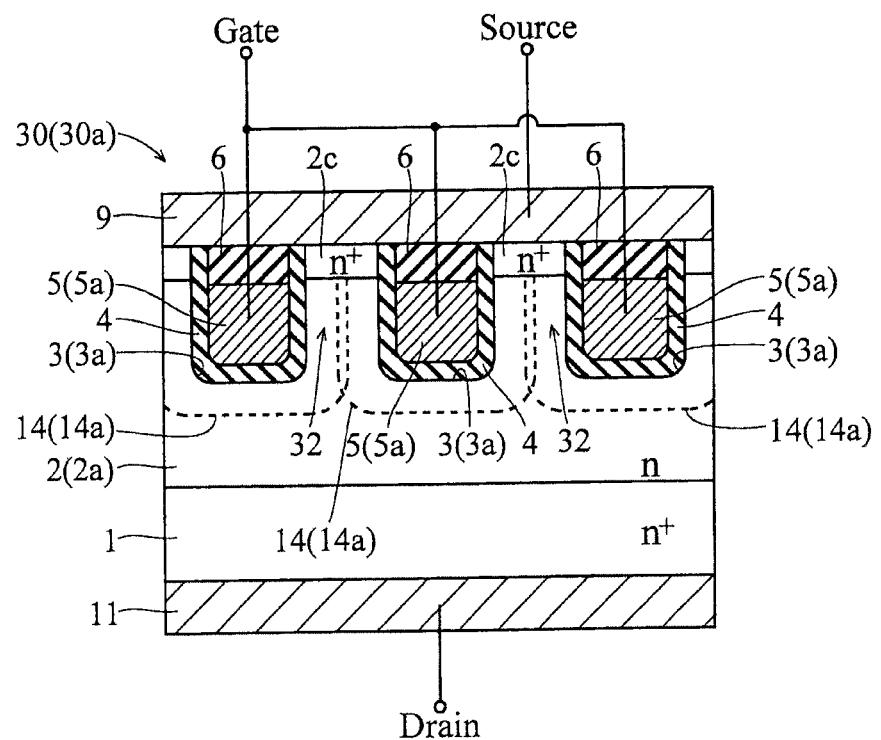
FIG. 9 is a cross sectional view illustrating a structure of a region functioning as a switching transistor of a semiconductor device according to a second embodiment of the present invention.

In the semiconductor device of the second embodiment 30, as illustrated in FIG. 9, there is disposed only the trench 3 (3a) filled with the embedded electrode 5 (5a) to which a predetermined control signal (signal for switching on and off) is applied in the region 30a functioning as a switching transistor.

Further, in the second embodiment, when a voltage is applied between the upper surface electrode layer 9 and the back surface electrode layer 11, current flows between the upper surface electrode layer 9 and the back surface electrode layer 11 to as to pass through each region between the neighboring trenches 3a. In other words, in the second embodiment, each region between the neighboring trenches 3a functions as the current passage 32.

Note that other structure of the region 30a functioning as a switching transistor of the semiconductor device 30 of the second embodiment is the same as the structure of the region 20a functioning as a switching transistor of the semiconductor device 20 of the first embodiment described above. In addition, the structure of the region functioning as a diode of the semiconductor device 30 of the second embodiment (not shown) is the same as the structure of the region 20b functioning as a diode of the semiconductor device 20 of the first embodiment.

Next, an operation of the region 30a functioning as a switching transistor of the semiconductor device 30 of the second embodiment will be described with reference to FIGS. 9 and 10.

First, in case of the turned-off state, as illustrated in FIG. 9, a negative potential is applied to every embedded electrode 5a so that the depletion layer 14 (14a) is formed around every trench 3a. Thus, the current passage 32 is blocked with the depletion layer 14a, so that the current flowing through the current passage 32 can be interrupted.

Figure 10:
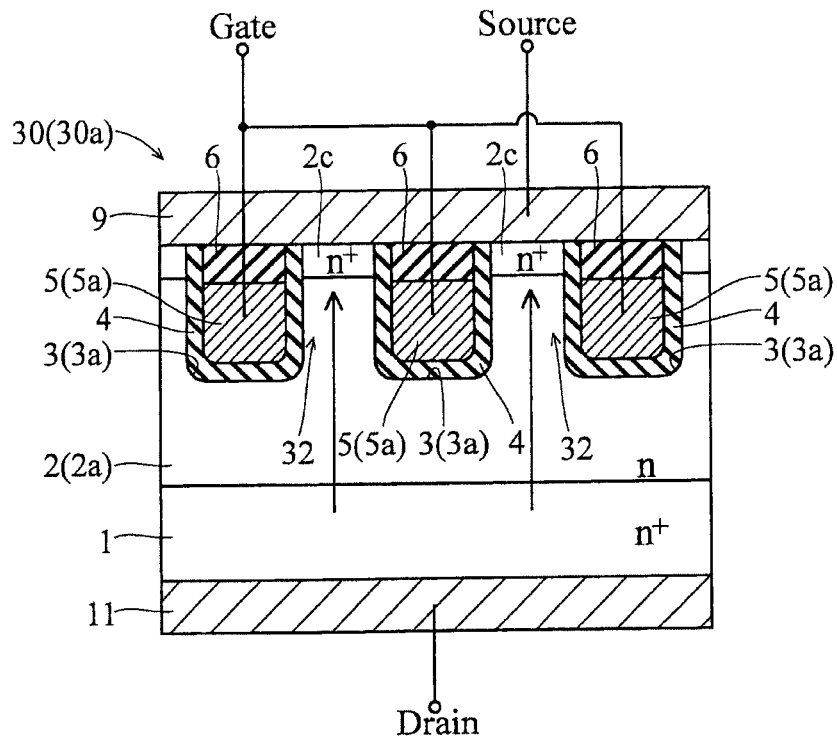
FIG. 10 is a cross sectional view illustrating an operation of the region functioning as a switching transistor of the semiconductor device according to the second embodiment of the present invention.

Further, in case of switching from the turned-off state to the turned-on state, as illustrated in FIG. 10, a positive potential is applied to every embedded electrode 5a, so that every depletion layer 14a illustrated in FIG. 9 is deleted. Thus, if the negative potential and the positive potential are applied to the upper surface electrode layer 9 and the back surface electrode layer 11, respectively, current can flow through the current passage 32 in the arrow direction in FIG. 10.

The effect of the second embodiment is the same as the effect of the first embodiment described above.

Third Embodiment

Hereinafter, with reference to FIG. 11, a structure of the region 40a functioning as a switching transistor of the semiconductor device 40 according to the third embodiment will be described.

Figure 11:
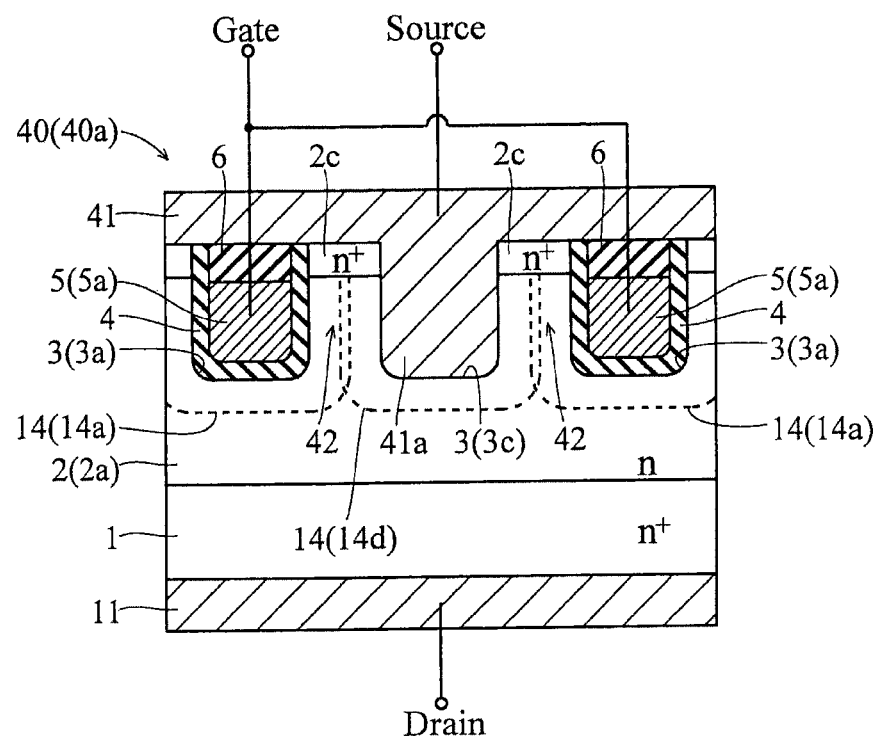
FIG. 11 is a cross sectional view illustrating a structure of a region functioning as a switching transistor of a semiconductor device according to a third embodiment of the present invention.

In the semiconductor device 40 of the third embodiment, as illustrated in FIG. 11, the region 40a functioning as a switching transistor includes a trench 3 (3a) filled with an embedded electrode 5 (5a) to which a predetermined control signal is applied and a trench 3 (3c) filled with a part of the upper surface electrode layer 41 (hereinafter referred to as an embedded portion 41a). The trenches 3a and 3c are arranged with predetermined spaces alternately one by one. In addition, the embedded portion 41a of the upper surface electrode layer 41 has a Schottky contact with the epitaxial layer 2 inside the trench 3c. Note that the upper surface electrode layer 41 is an example of the "electrode layer" in the present invention, and the embedded portion 41a is an example of the "second embedded electrode" in the present invention.

Further, in the third embodiment, when a voltage is applied between the upper surface electrode layer 41 and the back surface electrode layer 11, current flows between the upper surface electrode layer 41 and the back surface electrode layer 11 so as to pass through each region between the trench 3a and the trench 3c. In other words, in the third embodiment, each region between the trench 3a and the trench 3c functions as the current passage 42.

Note that other structure of the region 40a functioning as a switching transistor of the semiconductor device 40 of the third embodiment is the same as the structure of the region 20a functioning as a switching transistor of the semiconductor device 20 of the first embodiment described above. In addition, the structure of the region functioning as a diode of the semiconductor device 40 of the third embodiment (not shown) is the same as the structure of the region 20b functioning as a diode of the semiconductor device 20 of the first embodiment.

Next, with reference to FIGS. 11 and 12, an operation of the region 40a functioning as a switching transistor of the semiconductor device 40 according to the third embodiment will be described.

Note that it is supposed that a negative potential and a positive potential are applied to the upper surface electrode layer 41 and the back surface electrode layer 11, respectively, in the following description of the operation. In other words, a depletion layer 14 (14d) is formed around the trench 3c filled with the embedded portion 41a in the upper surface electrode layer 41 regardless of the turned-on state or the turned-off state.

First, in case of the turned-off state, as illustrated in FIG. 11, a negative potential is applied to the embedded electrode 5a so that the depletion layer 14 (14a) is formed around the trench 3a. Thus, the current passage 42 is blocked with depletion layers 14a and 14d, so that current flowing through the current passage 42 can be interrupted.

Figure 12:
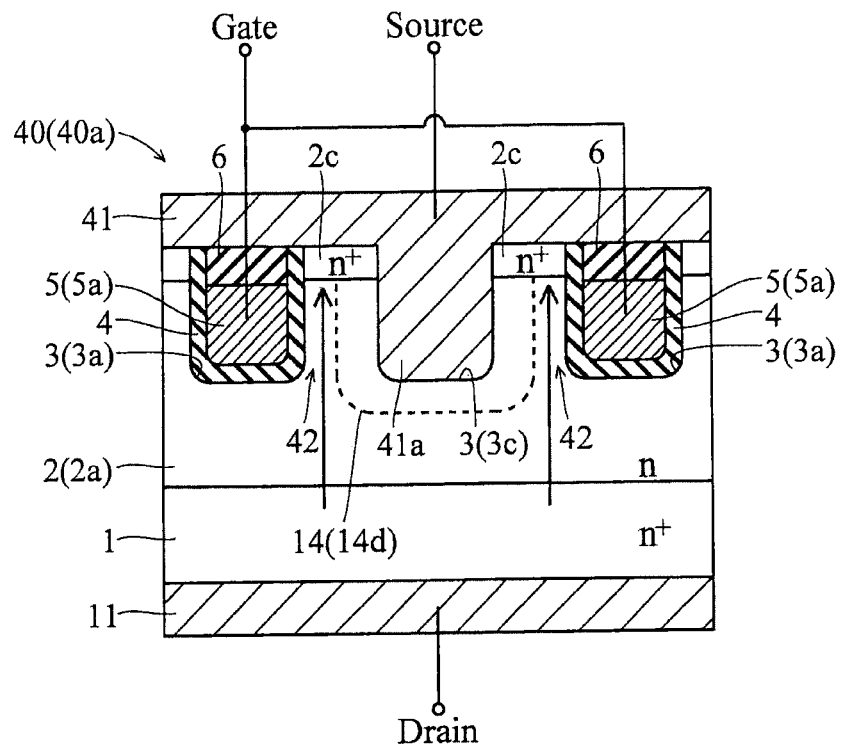
FIG. 12 is a cross sectional view illustrating an operation of the region functioning as a switching transistor of the semiconductor device according to the third embodiment of the present invention.

Further, in case of switching from the turned-off state to the turned-on state, as illustrated in FIG. 12, a positive potential is applied to the embedded electrode 5a so that the depletion layer 14a illustrated in FIG. 11 is deleted. Thus, current can flow through the part of the current passage 42 on the embedded electrode 5a side in the arrow direction in FIG. 12.

The effect of the third embodiment is the same as the effect of the first embodiment.

Fourth Embodiment

Hereinafter, with reference to FIG. 13, a structure of a region 50a functioning as a switching transistor of a semiconductor device 50 according to a fourth embodiment will be described.

Figure 13:
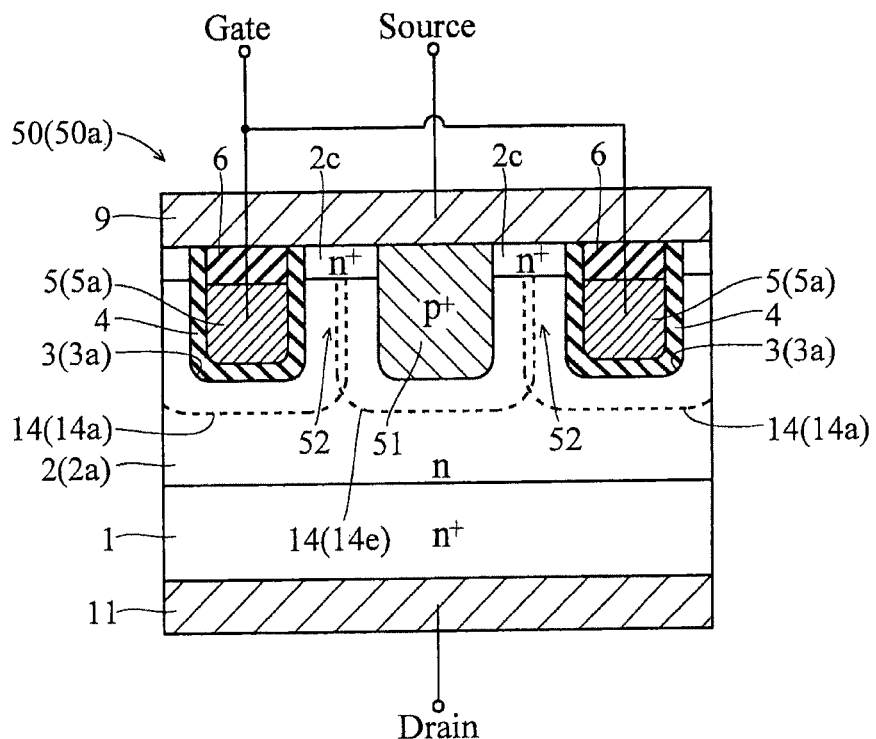
FIG. 13 is a cross sectional view illustrating a structure of a region functioning as a switching transistor of the semiconductor device according to a fourth embodiment of the present invention.

In the semiconductor device 50 of the fourth embodiment, as illustrated in FIG. 13, the region 50a functioning as a switching transistor includes the trench 3 (3a) filled with the embedded electrode 5 (5a) to which a predetermined control signal is applied as well as a $P^+$ type diffusion region 51 into which P type impurity is doped at high concentration. The $P^+$ type diffusion region 51 is disposed in each region between the neighboring trenches 3a with a predetermined apace to the trench 3a by one to one. In addition, the $P^+$ type diffusion region 51 has an ohmic contact with the upper surface electrode layer 9. Note that $P^+$ type diffusion region 51 is an example of the "current passage interrupting diffusion region" in the present invention.

Further, in the fourth embodiment, when a voltage is applied between the upper surface electrode layer 9 and the back surface electrode layer 11, the current flowing between the upper surface electrode layer 9 and the back surface electrode layer 11 passes through each region between the trench 3a and the $P^+$ type diffusion region 51. In other words, in the fourth embodiment, each region between the trench 3a and the $P^+$ type diffusion region 51 functions as a current passage 52.

Note that other structure of the region 50a functioning as a switching transistor of the semiconductor device 50 of the fourth embodiment is the same as the structure of the region 20a functioning as a switching transistor of the semiconductor device 20 of the first embodiment. In addition, a structure of the region functioning as a diode of the semiconductor device 50 of the fourth embodiment (not shown) is the same as the structure of the region 20b functioning as a diode of the semiconductor device 20 of the first embodiment.

Next, with reference to FIGS. 13 and 14, an operation of the region 50a functioning as a switching transistor of the semiconductor device 50 according to the fourth embodiment will be described.

Note that it is supposed that a negative potential and a positive potential are applied to the upper surface electrode layer 9 and the back surface electrode layer 11, respectively, in the following description of the operation. In other words, a depletion layer 14 (14e) is formed around the $P^+$ type diffusion region 51, regardless of the turned-on state or the turned-off state.

First, in case of the turned-off state, as illustrated in FIG. 13, a negative potential is applied to the embedded electrode 5a so that the depletion layer 14 (14a) is formed around the trench 3a. Thus, the current passage 52 is blocked with the depletion layers 14a and 14e, so that the current flowing through the current passage 52 can be interrupted.

Figure 14:
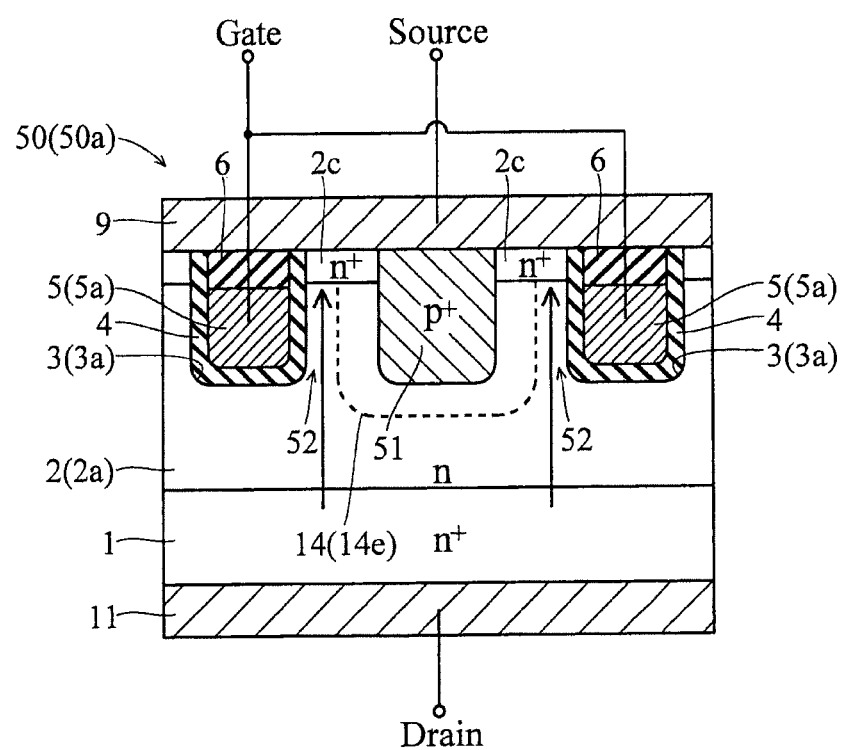
FIG. 14 is a cross sectional view illustrating an operation of a region functioning as a switching transistor of a semiconductor device according to a fourth embodiment of the present invention.

Further, in case of switching from the turned-off state to the turned-on state, as illustrated in FIG. 14, a positive potential is applied to the embedded electrode 5a, so that the depletion layer 14a illustrated in FIG. 13 is deleted. Thus, the current can flow through the part of the current passage 52 on the embedded electrode 5a side in the arrow direction in FIG. 14.

The effect of the fourth embodiment is the same as the effect of the first embodiment.

Fifth Embodiment

Hereinafter, with reference to FIGS. 15 to 19, a structure of a semiconductor device 120 according to a fifth embodiment of the present invention will be described.

Figure 15:
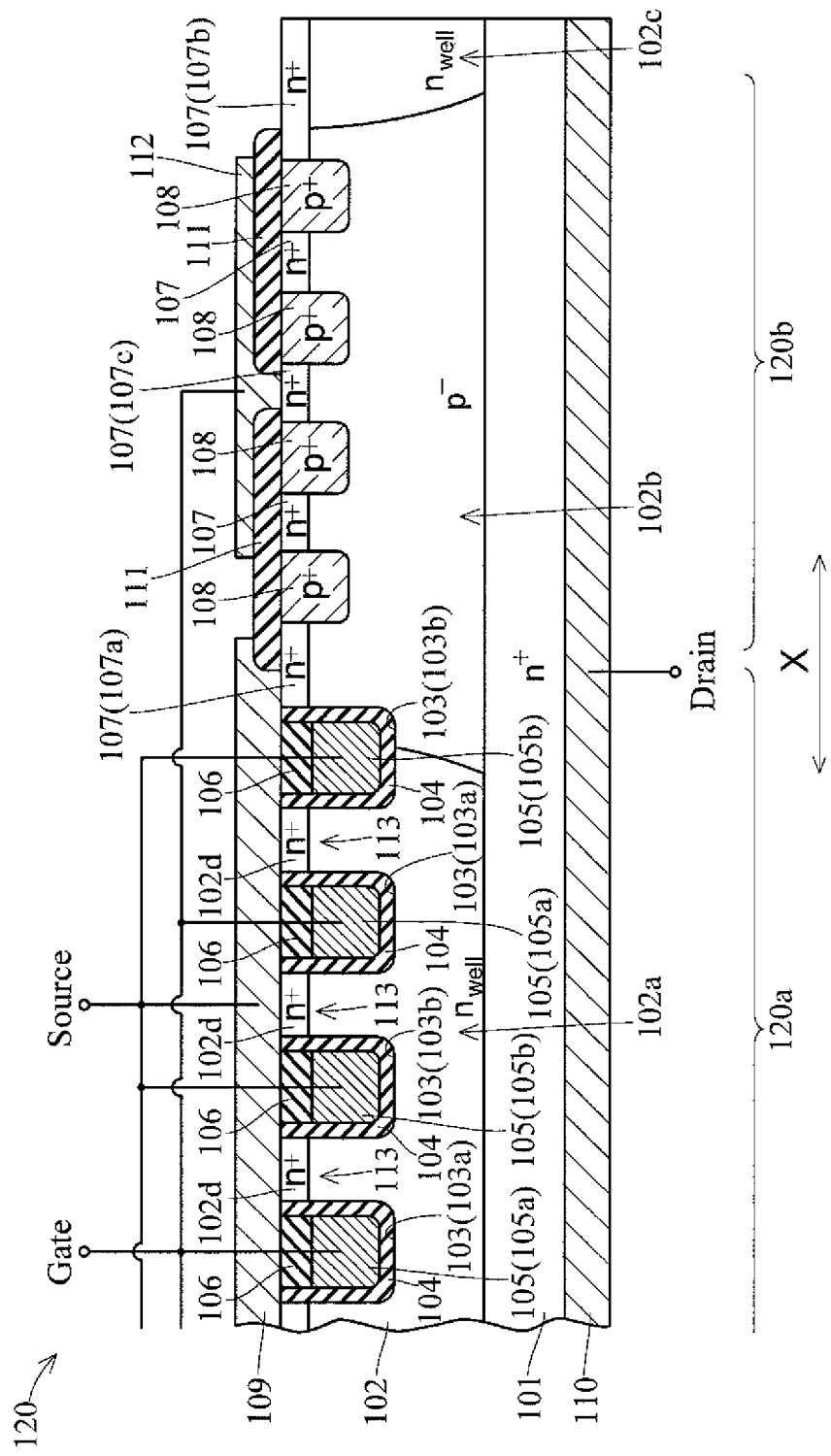
FIG. 15 is a cross sectional view illustrating a semiconductor device according to a fifth embodiment of the present invention.
Figure 16:
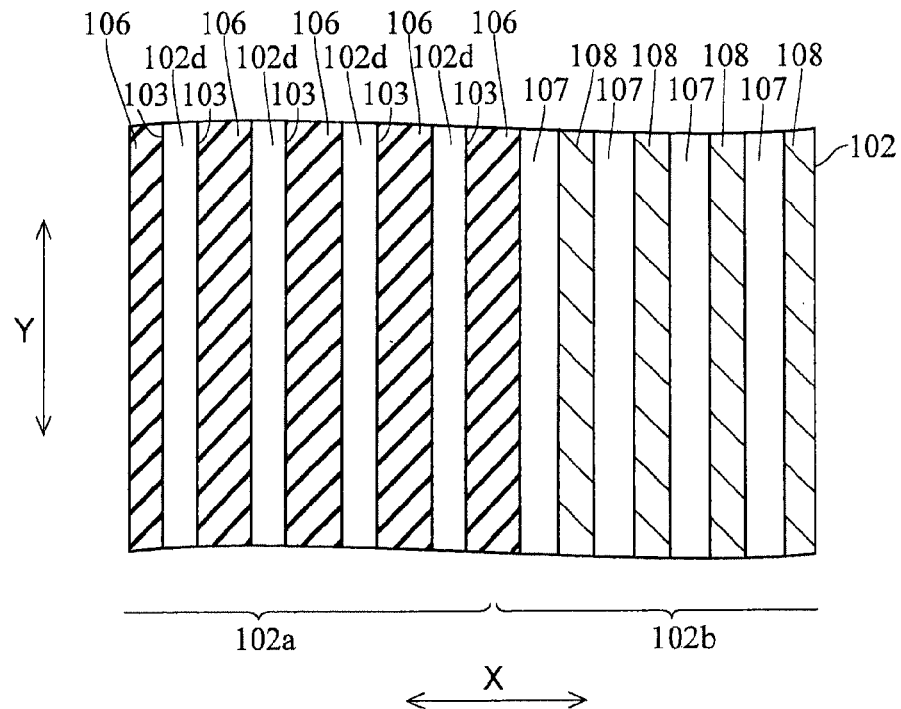
FIG. 16 is a plan view illustrating a plane shape of a trench and a diffusion region of the semiconductor device according to the fifth embodiment illustrated in FIG. 15.
Figure 17:
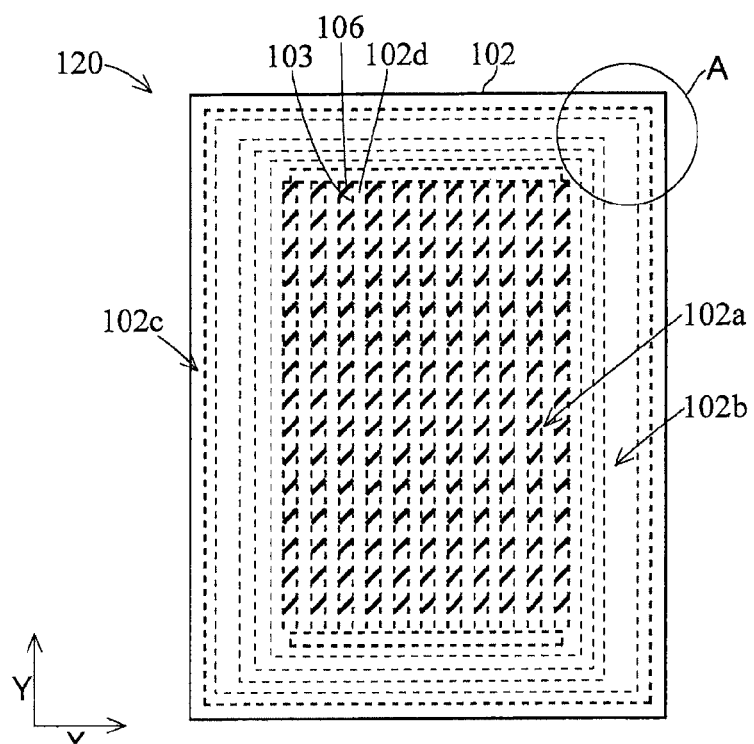
FIG. 17 is a plan view illustrating the semiconductor device according to the fifth embodiment illustrated in FIG. 15 in a simplified manner.

As illustrated in FIGS. 15 to 17, the semiconductor device 120 according to the fifth embodiment includes a region 120a and a region 120b that is disposed outside the region 120a so as to enclose the region 120a in a plan view. Further, the region 120a of the semiconductor device 120 is adapted to function as a normally-off type switching transistor. The region 120b of the semiconductor device 120 is adapted to function as a bidirectional Zener diode. In other words, the semiconductor device 120 of the fifth embodiment has a structure in which the switching transistor and the bidirectional Zener diode are disposed integrally.

As a concrete structure, in the semiconductor device 120 of the fifth embodiment, an epitaxial layer 102 made of P− type silicon having a thickness of approximately 1 to 10 μm is formed on the upper surface of the N+ type silicon substrate 101. N type impurity is doped into the N+ type silicon substrate 101 at high concentration so as to have a good ohmic contact with the drain electrode 110 that will be described later. Note that the N+ type silicon substrate 101 and the epitaxial layer 102 are an example of the "semiconductor layer" in the present invention.

In addition, as illustrated in FIGS. 15 and 17, the epitaxial layer 102 includes N type well regions 102a and 102c that are formed by doping the N type impurity, and a P− type region 102b that is a P− type silicon region constituting the epitaxial layer 102. In addition, the N type well regions 102a and 102c are formed respectively by doping N type impurity by ion injection from the upper surface side of the epitaxial layer 102 to a depth reaching the upper surface of the N+ type silicon substrate 101. Note that N type impurity concentrations in the N type well regions 102a and 102c are, for example, approximately $5 \times 10^{15}$ to $1 \times 10^{18}$ cm$^{-3}$, while P type impurity concentration in the P− type region 102b is, for example, approximately $5 \times 10^{15}$ to $1 \times 10^{18}$ cm$^{-3}$.

In addition, the N type well region 102a is formed in the region corresponding to the region 120a of the semiconductor device 120, while the P− type region 102b is formed in the region corresponding to the region 120b of the semiconductor device 120. In other words, the P− type region 102b is formed in the region outside the N type well region 102a so as to enclose the N type well region 102a in a plan view. In addition, the N type well region 102c is formed in the region outside the P− type region 102b so as to enclose the P− type region 102b in a plan view. In other words, the N type well region 102a, the P− type region 102b and the N type well region 102c are formed in the epitaxial layer 102 so that the P− type region 102b is sandwiched between the N type well region 102a and the N type well region 102c. Note that the N+ type silicon substrate 101 is an example of the "first region of one conductivity type" in the present invention, and the N type well region 102a is an example of the "second region of one conductivity type" in the present invention. In addition, the P− type region 102b is an example of the "third region of an inverse conductivity type" in the present invention, and the N type well region 102c is an example of the "fourth region of one conductivity type" in the present invention.

In addition, in the N type well region 102a of the epitaxial layer 102, there are formed a plurality of trenches 103 that are dug in the thickness direction of the epitaxial layer 102. However, among the plurality of trenches 103, the trench 103 on each end side is formed at a boundary part between the N type well region 102a and the P− type region 102b in the epitaxial layer 102. The plurality of trenches 103 are formed by etching the epitaxial layer 102 from the upper surface (principal surface) side. In other words, opening ends of the plurality of trenches 103 are disposed on the upper surface side of the epitaxial layer 102.

In addition, as illustrated in FIG. 16, each of the plurality of trenches 103 is formed in an elongated shape so as to extend in a predetermined direction (Y direction) parallel to the upper surface of the epitaxial layer 102 in a plan view. In addition, the plurality of trenches 103 are arranged with spaces of approximately 0.05 to 0.3 μm in the direction (X direction) that is parallel to the upper surface of the epitaxial layer 102 and is perpendicular to the extending direction of the trench 103 (Y direction). Further, the depth of each of the plurality of trenches 103 is set to approximately 0.5 to 5 μm so as to be smaller than the thickness of the epitaxial layer 102 (approximately 1 to 10 μm). In addition, the width of each of the plurality of trenches 103 in the X direction is set to approximately 0.1 to 1 μm.

In addition, on the upper surface of each of the plurality of trenches 103, there is formed a silicon oxide film 104 at a thickness of approximately 10 to 100 nm obtained by thermal oxidation process of silicon forming the epitaxial layer 102.

In addition, on the inner surface of each of the plurality of trenches 103, there is formed an embedded electrode (gate electrode) 105 made of P type polysilicon via the silicon oxide film 104. Each of the plurality of embedded electrodes 105 is filled in the opposed trench 103 to a halfway depth. Note that a metal or the like can be used instead of the P type polysilicon as a material of the embedded electrode 105.

In the structure of the fifth embodiment including the plurality of embedded electrodes 105 as described above, the applied voltage to the plurality of embedded electrodes 105 is controlled so as to form a depletion layer around each of the plurality of trenches 103 or to delete the formed depletion layer. Further, in the fifth embodiment, a distance between the neighboring trenches 103 is set to a distance such that the depletion layers formed around the neighboring trenches 103 are connected with each other when the depletion layer is formed around each of the plurality of trenches 103. Therefore, in the fifth embodiment, when the depletion layer is formed around each of the plurality of trenches 103, each region between the neighboring trenches 103 in the epitaxial layer 102 is blocked with the depletion layer.

In addition, the plurality of embedded electrodes 105 of the fifth embodiment include two types of embedded electrodes 105a and 105b to which voltages are applied separately. One type embedded electrode 105a is adapted to be applied with a voltage corresponding to a predetermined control signal (signal for switching on and off). In addition, other type embedded electrodes 105b is adapted to be electrically connected a source electrode 109 that will be described later. In other words, the other type embedded electrodes 105b is adapted to be the same potential as the source electrode 109. In addition, the embedded electrodes 105a and 105b are arranged alternately one by one in the X direction. Therefore, one embedded electrode 105b (105a) is disposed between two embedded electrode 105a (105b). Note that the embedded electrodes 105a and 105b are examples of the "first embedded electrode" and the "second embedded electrode" in the present invention.

In addition, an interlayer insulator film 106 made of a silicon oxide film is filled in the remaining part that is not filled with the embedded electrode 105 in each of the plurality of trenches 103 (part over the embedded electrode 105). Each of the plurality of interlayer insulator films 106 is provided for insulating between the corresponding embedded electrode 105 and the source electrode 109 that will be described later. In addition, the thickness of each of the plurality of interlayer insulator films 106 is set to be the same as the depth of the remaining part that is not filled with the embedded electrode 105 of the corresponding trench 103 (part over the embedded electrode 105). Therefore, the upper surface of each of the plurality of interlayer insulator films 106 is flush with the upper surface of the epitaxial layer 102 (upper surface of the upper end portion of each region between the neighboring trenches 103).

In addition, on the upper surface portion of the N type well region 102a in the epitaxial layer 102 (upper end portion of each region between the neighboring trenches 103), there is formed a high concentration region 102d in which N type impurity is doped at high concentration by ion injection so that a low concentration region is not exposed on the upper surface side of the N type well region 102a in the epitaxial layer 102. The concentration of the high concentration region 102d in the epitaxial layer 102 is set so that a good ohmic contact can be obtained with the source electrode 109 that will be described later, and is higher than N type impurity concentration in other part of the N type well region 102a in the epitaxial layer 102. Further, the thickness of the high concentration region 102d in the epitaxial layer 102 (depth after diffusion by the ion injection) is set to be smaller than the thickness of the interlayer insulator film 106. In other words, the lower end portion of the high concentration region 102d in the epitaxial layer 102 is positioned higher than the upper end portion of the embedded electrode 105.

On the other hand, as illustrated in FIG. 15, in the P⁻ type region 102b of the epitaxial layer 102, there are formed a plurality of N⁺ type diffusion regions 107 in which N type impurity is doped at high concentration (e.g., approximately $1\times10^{17}$ to $1\times10^{20}$ cm$^{-3}$) and a plurality of P⁺ type diffusion regions 108 in which P type impurity is doped at high concentration (e.g., approximately $1\times10^{17}$ to $1\times10^{20}$ cm$^{-3}$). Each of the plurality of N⁺ type diffusion regions 107 is formed by ion injection of the N type impurity into the epitaxial layer 102 from the upper surface side thereof, and each of the plurality of P⁺ type diffusion regions 108 is formed by ion injection of the P type impurity into the epitaxial layer 102 from the upper surface side thereof. In addition, the thickness of each of the plurality of P type diffusion regions 108 (depth after diffusion by the ion injection) is set to be larger than the thickness of the N⁺ type diffusion region 107 (depth after diffusion by the ion injection). In other words, the lower end portion of the P⁺ type diffusion region 108 is positioned lower than the lower end portion of the N⁺ type diffusion region 107.

Figure 18:
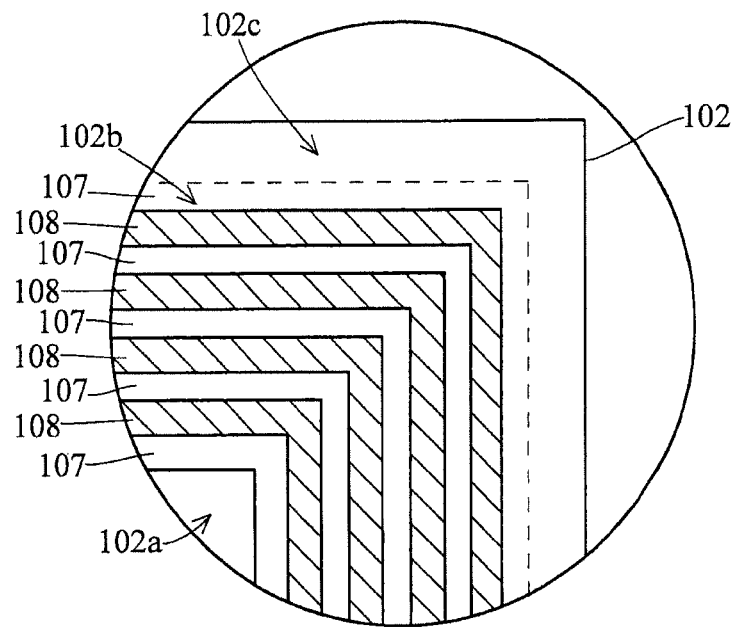
FIG. 18 is an enlarged plan view of an A-part of FIG. 17.

In addition, each of the N⁺ type diffusion regions 107 and each of the P⁺ type diffusion regions 108 are formed so as to enclose the N type well region 102a in a plan view as illustrated in FIGS. 17 and 18. Further, the N⁺ type diffusion regions 107 and the P⁺ type diffusion regions 108 are arranged alternately in a plan view. Specifically, as illustrated in FIGS. 15 and 18, one P⁺ type diffusion region 108 is disposed between two N⁺ type diffusion regions 107 so as to contact with the N⁺ type diffusion regions 107. Thus, the bidirectional Zener diodes constituted of the plurality of N⁺ type diffusion regions 107 and the plurality of P⁺ type diffusion regions 108 are formed in the P⁻ type region 102b of the epitaxial layer 102. Note that the plurality of N⁺ type diffusion regions 107 and the plurality of P⁺ type diffusion regions 108 are examples of the "plurality of diffusion regions" in the present invention. In addition, the N⁺ type diffusion region 107 and the P⁺ type diffusion region 108 are examples of the "first diffusion region" and the "second diffusion region", respectively, in the present invention.

In addition, as illustrated in FIG. 15, on the upper surface of the epitaxial layer 102 (on the region corresponding to the region 120a of the semiconductor device 120), there is formed a source electrode 109 made of an aluminum layer or the like so as to cover the opening end of each of the plurality of trenches 103. The source electrode 109 has an ohmic contact with the high concentration region 102c in the epitaxial layer 102 (upper end portion of each region between the neighboring trenches 103) and also has an ohmic contact with the N⁺ type diffusion region 107a that is closest to the N type well region 102a among the plurality of N⁺ type diffusion regions 107 constituting the bidirectional Zener diode. Note that the source electrode 109 is an example of the "electrode layer" in the present invention, and the N⁺ type diffusion region 107a that is closest to the N type well region 102a is an example of the "first part" in the present invention.

In addition, on the lower surface (back surface) of the N⁺ type silicon substrate 101, there is formed a drain electrode 110 having a multilayer structure in which a plurality of metal layers are laminated. The drain electrode 110 has an ohmic contact with the lower surface (back surface) of the N⁺ type silicon substrate 101 over the entire region.

In addition, on the upper surface of the P⁻ type region 102b in the epitaxial layer 102, there is formed an SiO₂ layer 111 so as to cover a predetermined region of the N⁺ type diffusion region 107 and the P⁺ type diffusion region 108. The SiO₂ layer 111 is formed so that a part of the upper surface of a predetermined N⁺ type diffusion region 107c among the plurality of N⁺ type diffusion regions 107 constituting the bidirectional Zener diode is exposed. Note that the predetermined N⁺ type diffusion region 107c among the plurality of N⁺ type diffusion regions 107 is an example of the "third part" in the present invention.

Here, the N⁺ type diffusion region 107b that is closest to the N type well region 102c among the plurality of N⁺ type diffusion regions 107 constituting the bidirectional Zener diode is formed also in the N type well region 102c. Therefore, the N⁺ type diffusion region 107b and the N⁺ type silicon substrate 101 (drain electrode 110) are electrically connected to each other via the N type well region 102c. Thus, the bidirectional Zener diode is electrically connected between the source and the drain of the switching transistor in the semiconductor device 120. Note that the N⁺ type diffusion region 107b that is closest to the N type well region 102c is an example of the "second part" in the present invention.

In addition, in a predetermined region on the upper surface of the P⁻ type region 102b in the epitaxial layer 102, there is formed a metal layer 112 that is electrically connected the embedded electrode 105a. A part of the metal layer 112 has an ohmic contact with a part of the upper surface of the exposed N⁺ type diffusion region 107c. In other words, the metal layer 112 that is electrically connected to the embedded electrode 105a is also electrically connected to the predetermined N⁺ type diffusion region 107c among the plurality of N⁺ type diffusion regions 107 constituting the bidirectional Zener diode. Thus, the bidirectional Zener diode is electrically connected between the source and the gate of the switching transistor in the semiconductor device 120.

In the structure described above, when a voltage is applied between the source electrode 109 and the drain electrode 110 in the region 120a functioning as a switching transistor in the semiconductor device 120, current flowing between the source electrode 109 and the drain electrode 110 (current flowing in the thickness direction of the epitaxial layer 102)

passes through each region between the neighboring trenches 103 in the epitaxial layer 102. In other words, each region between the neighboring trenches 103 in the epitaxial layer 102 functions as a current passage (channel) 113 of the switching transistor.

Figure 19:
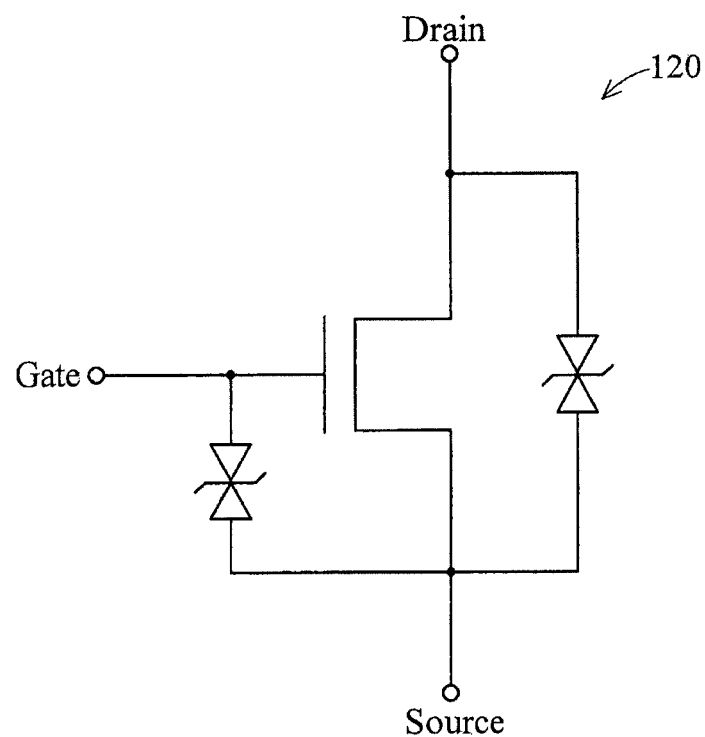
FIG. 19 is an equivalent circuit diagram of the semiconductor device according to the fifth embodiment illustrated in FIG. 15.

Further, the semiconductor device 120 of the fifth embodiment having the above-mentioned structure can be represented by the equivalent circuit as illustrated in FIG. 19. In other words, as illustrated in FIG. 19, the semiconductor device 120 of the fifth embodiment has a circuit in which the bidirectional Zener diode is connected between the source and the drain of the switching transistor as well as between the source and the gate of the same. Note that the part of the switching transistor of the semiconductor device 120 is represented by a circuit symbol of a MOSFET for convenience' sake in FIG. 19.

Next, with reference to FIGS. 20 and 21, an operation of the region 120a functioning as a switching transistor in the semiconductor device 120 of the fifth embodiment will be described. Note that FIG. 20 illustrates the case where the semiconductor device that functions as a switch device is in the turned-off state, and FIG. 21 illustrates the case where the semiconductor device that functions as a switch device is in the turned-on state.

Figure 20:
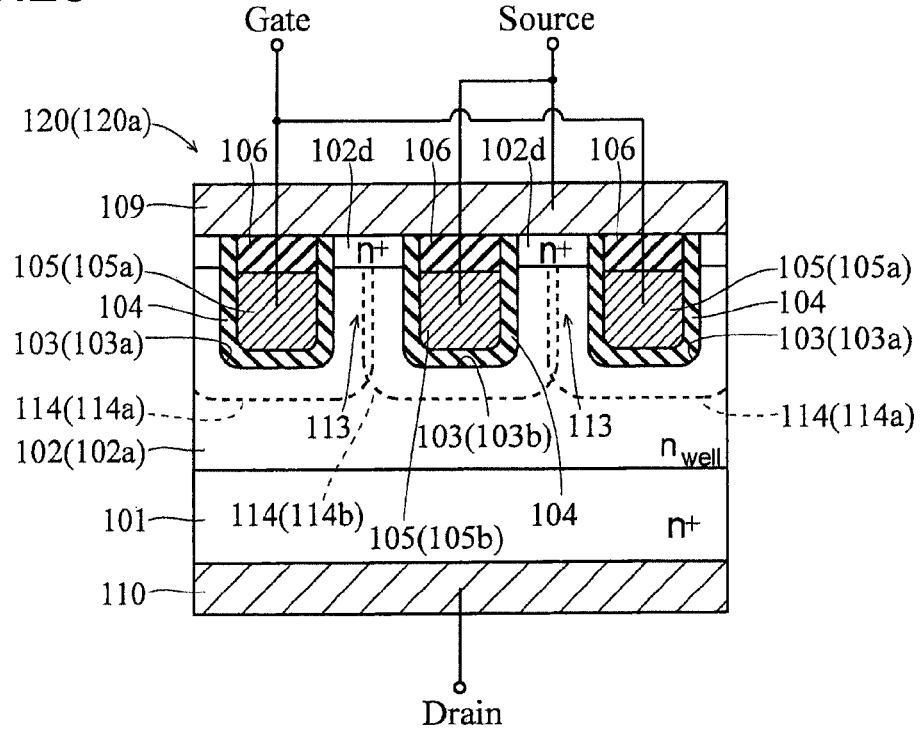
FIG. 20 is a cross sectional view illustrating an operation of the semiconductor device according to the fifth embodiment of the present invention.
Figure 21:
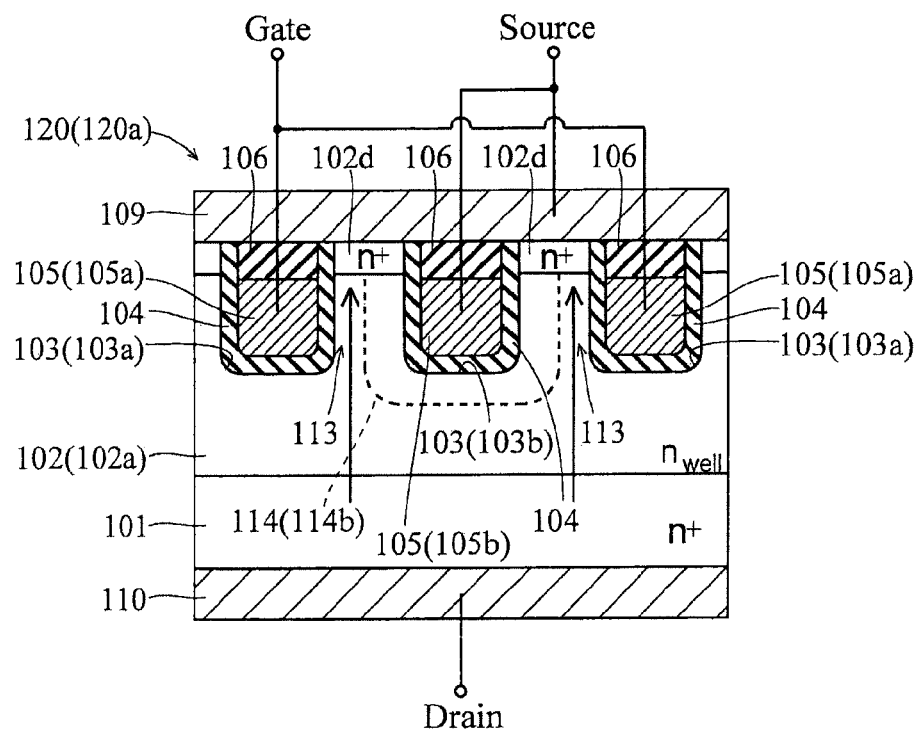
FIG. 21 is a cross sectional view illustrating an operation of the semiconductor device according to the fifth embodiment of the present invention.

First, as illustrated in FIGS. 20 and 21, it is supposed that a negative potential and a positive potential are applied to the source electrode 109 and the drain electrode 110, respectively. Then, the negative potential is applied to the embedded electrode 105b because the embedded electrode 105b is electrically connected to the source electrode 109. Therefore, majority carrier is decreased around the trench 103 filled with the embedded electrode 105b (hereinafter referred to as a trench 103b). In other words, a depletion layer 114 (114b) is formed the trench 103b regardless of the turned-on state or the turned-off state.

Further, as illustrated in FIG. 20, if the semiconductor device 120 is in the turned-off state, the applied voltage to the embedded electrode 105a is controlled so that majority carrier existing around the trench 103 filled with the embedded electrode 105a (hereinafter referred to as a trench 103a) is decreased. Thus, the depletion layer 114 (114a) is formed around the trench 103a similarly to the depletion layer 114 (114b) formed around the trench 103b.

In this case, the depletion layers 114a and 114b formed around the trenches 103a and 103b are overlapped with each other in the region between the trench 103a and the trench 103b. In other words, the depletion layers 114a and 114b are connected to each other in the region between the trench 103a and the trench 103b. Thus, the current passage 113 is blocked with the depletion layers 114a and 114b, so that the current flowing through the current passage 113 can be interrupted. Therefore, the semiconductor device 120 is turned off.

Next, as illustrated in FIG. 21, in case of switching the semiconductor device 120 from the turned-off state to the turned-on state, a predetermined positive potential is applied to the embedded electrode 105a so that the depletion layer 114a formed around the trench 103a (see FIG. 20) is deleted. In other words, the depletion layer 114a blocks the part on the embedded electrode 105a side of the current passage 113 is deleted. Thus, current can flow through the part on the embedded electrode 105a side of the current passage 113 in the arrow direction in FIG. 21, so that the semiconductor device 120 can be turned on.

In addition, in case of switching the semiconductor device 120 from the turned-on state to the turned-off state, the application of the predetermined positive potential to the embedded electrode 105a is stopped. Thus, the state illustrated in FIG. 20 is restored, so that the semiconductor device 120 can be turned off.

In the fifth embodiment, as described above, each region between the neighboring trenches 103 in the epitaxial layer 102 is blocked with the depletion layer 114 formed around the trench 103 in the N type well region 102a of the epitaxial layer 102, so that the current passage 113 is interrupted. In contrast, at least a part of the depletion layer 114 formed around the trench 103 (depletion layer 114a formed around the trench 103a) is deleted so that the current passage 113 is opened. Thus, a formation state of the depletion layer 114 formed around the trench 103 changes in accordance with the applied voltage to the embedded electrode 105. Therefore, by controlling the applied voltage to the embedded electrode 105, it is possible to switch from the turned-on state (in which the current passage 113 is opened) to the turned-off state (in which the current passage 113 is closed), and to switch in the opposite direction. In other words, the semiconductor device 120 can be used as a switch device (switching transistor). Further, in the above-mentioned structure, in the turned-on state, the current can flow through the entire part of the current passage 113 in which the depletion layer 114 is deleted. Therefore, compared with the conventional MOSFET (semiconductor device) in which a very thin inversion layer functions as the channel (current passage), resistance against current can be reduced largely. Thus, compared with the conventional MOSFET (semiconductor device) in which a very thin inversion layer functions as the channel (current passage), on-resistance can be reduced largely.

In addition, in the fifth embodiment, as described above, the bidirectional Zener diodes in which the N$^+$ type diffusions region 107 and the P$^+$ type diffusion regions 108 are arranged alternately are formed in the P$^-$ type region 102b of the epitaxial layer 102. Thus, the bidirectional Zener diode is connected between the source and the drain of the switching transistor in the semiconductor device 120 as well as between the source and the gate thereof. Thus, even if static electricity, surge voltage or the like enters the semiconductor device 120, the bidirectional Zener diode can absorb the static electricity or the surge voltage. Therefore, it is possible to suppress dielectric breakdown or the like due to the input of the static electricity or the surge voltage into the semiconductor device 120. As a result, it is possible to suppress malfunction such as breakage of the semiconductor device 120 due to the dielectric breakdown or the like.

In addition, in the structure of the fifth embodiment described above, by changing the number of the formed N$^+$ type diffusion regions 107 and P$^+$ type diffusion regions 108, Zener voltage (breakdown voltage) of the bidirectional Zener diode can easily be adjusted. Therefore, the bidirectional Zener diode having a predetermined Zener voltage (breakdown voltage) can easily be connected between the source and the drain of the switching transistor as well as between the source and the gate of the same.

Further, in the structure of the fifth embodiment described above, the switching transistor and the bidirectional Zener diode are integrated. Therefore, it is not necessary to dispose another region or the like for forming a wiring member for connecting the switching transistor and the bidirectional Zener diode. Thus, an area of the circuit including the switching transistor and the bidirectional Zener diode that are connected to each other can be reduced.

In addition, in the fifth embodiment, as described above, when the current passage 113 is to be interrupted, the depletion layers 114 formed around the neighboring trenches 103 are connected to each other. Thus, the current passage 113 can securely be blocked with the depletion layers 114 formed around the neighboring trenches 103.

In addition, in the fifth embodiment, as described above, the interlayer insulator film 106 is filled in each of the trenches 103 so that the upper surface of the interlayer insulator film 106 becomes flush with the upper surface of the epitaxial layer 102. Thus, even if the distance between the neighboring trenches 103 is made to be small, the upper surface side portion of the epitaxial layer 102 (upper end portion of the region between the neighboring trenches 103) is not covered completely with the interlayer insulator film 106. Thus, the distance between the neighboring trenches 103 can be reduced, so that the depletion layer 114 formed around the neighboring trenches 103 can easily be connected to each other.

Sixth Embodiment

Hereinafter, with reference to FIG. 22, a structure of a region 130a functioning as a switching transistor of a semiconductor device 130 according to a sixth embodiment will be described.

In the semiconductor device 130 of the sixth embodiment, the region 130a functioning as a switching transistor includes only the trench 103 (103a) filled with the embedded electrode 105 (105a) to which a predetermined control signal (signal for switching on and off) is applied.

Further, in the sixth embodiment, when a voltage is applied between the source electrode 109 and the drain electrode 110, current flowing between the source electrode 109 and the drain electrode 110 passes through each region between neighboring trenches 103a. In other words, in the sixth embodiment, each region between neighboring trenches 103a functions as a current passage 132.

Note that other structure of the region 130a functioning as a switching transistor in the semiconductor device 130 of the sixth embodiment is the same as the structure of the region 120a functioning as a switching transistor in the semiconductor device 120 of the fifth embodiment. In addition, a structure of the region functioning as a bidirectional Zener diode in the semiconductor device 130 of the sixth embodiment (not shown) is the same as the structure of the region 120b functioning as a bidirectional Zener diode in the semiconductor device 120 of the fifth embodiment.

Next, with reference to FIGS. 22 and 23, an operation of the region 130a functioning as a switching transistor in the semiconductor device 130 of the sixth embodiment will be described.

Figure 22:
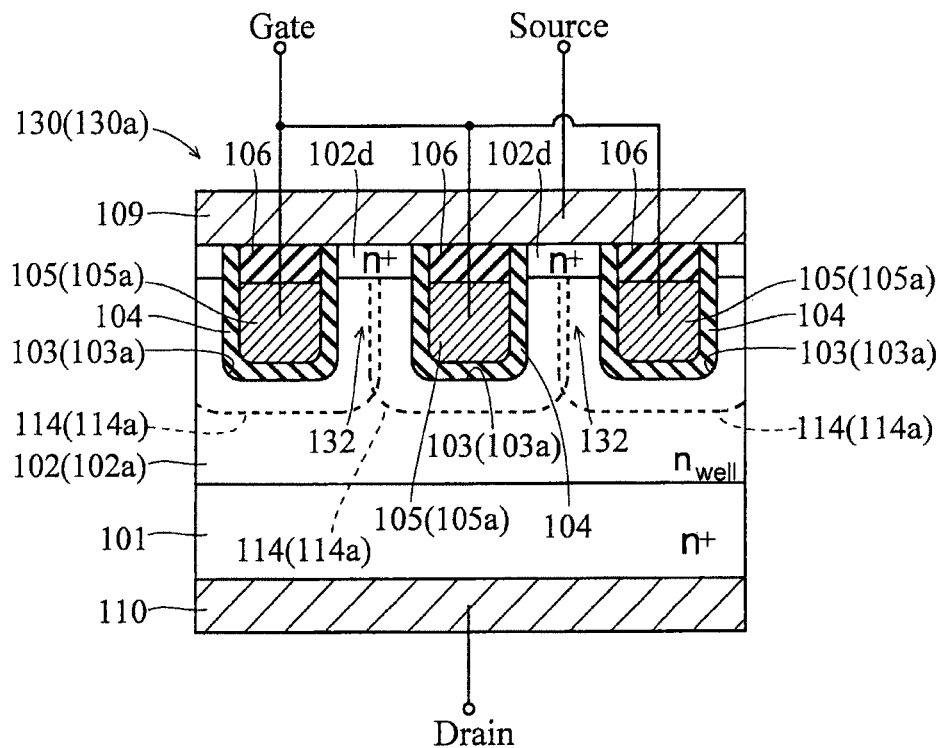
FIG. 22 is a cross sectional view illustrating a structure of a region functioning as a switching transistor of a semiconductor device according to a sixth embodiment of the present invention.

First, in case of the turned-off state, as illustrated in FIG. 22, a negative potential is applied to every embedded electrode 105a so that the depletion layer 114 (114a) is formed around every trench 103a. Thus, the current passage 132 is blocked with the depletion layer 114a, so that current flowing through the current passage 132 can be interrupted.

Figure 23:
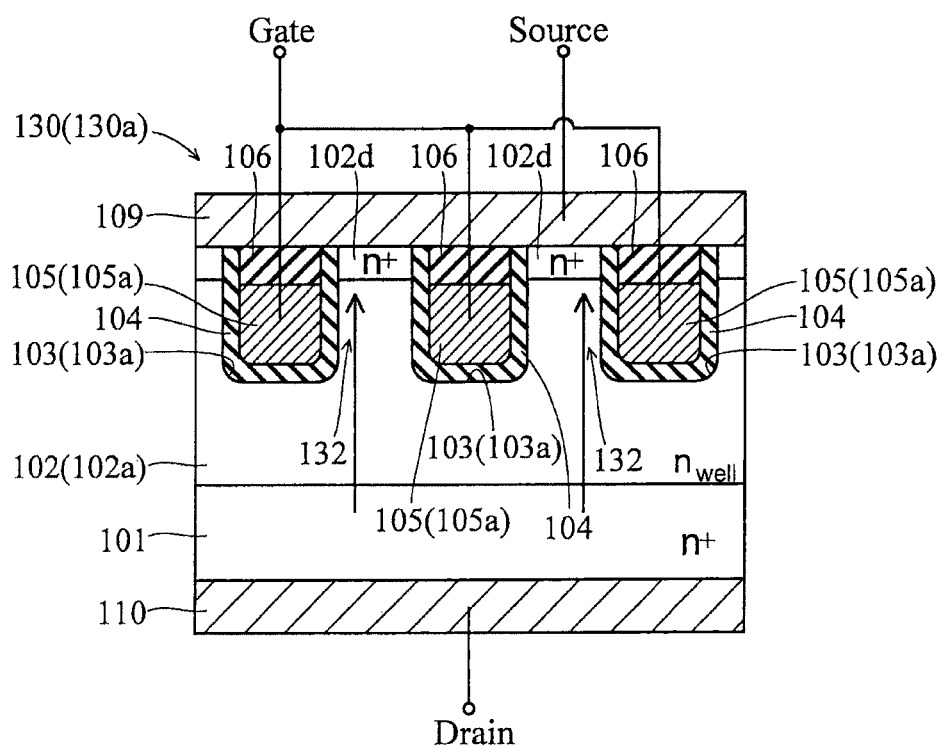
FIG. 23 is a cross sectional view illustrating an operation of the region functioning as a switching transistor of the semiconductor device according to the sixth embodiment of the present invention.

Further, in case of switching from the turned-off state to the turned-on state, as illustrated in FIG. 23, a positive potential is applied to every embedded electrode 105a, so that every depletion layer 114a illustrated in FIG. 22 is deleted. Thus, if a negative potential and a positive potential are applied to the source electrode 109 and the drain electrode 110, current can flow through the current passage 132 in the arrow direction illustrated in FIG. 23.

The effect of the sixth embodiment is the same as the effect of the fifth embodiment described above.

Seventh Embodiment

Hereinafter, with reference to FIG. 24, a structure of a region 140a functioning as a switching transistor of a semiconductor device 140 according to a seventh embodiment will be described.

In the semiconductor device 140 of the seventh embodiment, the region 140a functioning as a switching transistor includes a trench 103 (103a) filled with an embedded electrode 105 (105a) to which a predetermined control signal (signal for switching on and off) is applied, and a trench 103 (103c) filled with a part of a source electrode 141 (hereinafter referred to as an embedded portion 141a). The trenches 103a and 103c are arranged with predetermined spaces alternately one by one. In addition, the embedded portion 141a of the source electrode 141 has a Schottky contact with the epitaxial layer 102 inside the trench 103c. Note that the embedded portion 141a of the source electrode 141 is an example of the "second embedded electrode" in the present invention.

Further, in the seventh embodiment, when a voltage is applied between the source electrode 141 and the drain electrode 110, current flows between the source electrode 141 and the drain electrode 110 so as to pass through each region between the trench 103a and the trench 103c. In other words, in the seventh embodiment, each region between the trench 103a and the trench 103c functions as a current passage 142.

Other structure of the region 140a functioning as a switching transistor in the semiconductor device 140 of the seventh embodiment is the same as the structure of the region 120a functioning as a switching transistor in the above-mentioned semiconductor device 120 of the fifth embodiment. In addition, a structure of the region functioning as a bidirectional Zener diode in the semiconductor device 140 of the seventh embodiment (not shown) is the same as the structure of the region 120b functioning as a bidirectional Zener diode in the above-mentioned semiconductor device 120 of the fifth embodiment.

Next, with reference to FIGS. 24 and 25, an operation of the region 140a functioning as a switching transistor in the semiconductor device 140 of the seventh embodiment will be described.

Note that in the following description of the operation, it is supposed that a negative potential and a positive potential are applied to each of the source electrode 141 and the drain electrode 110. In other words, a depletion layer 114 (114c) is formed around the trench 103c filled with the embedded portion 141a of the source electrode 141, regardless of the turned-on state or the turned-off state.

Figure 24:
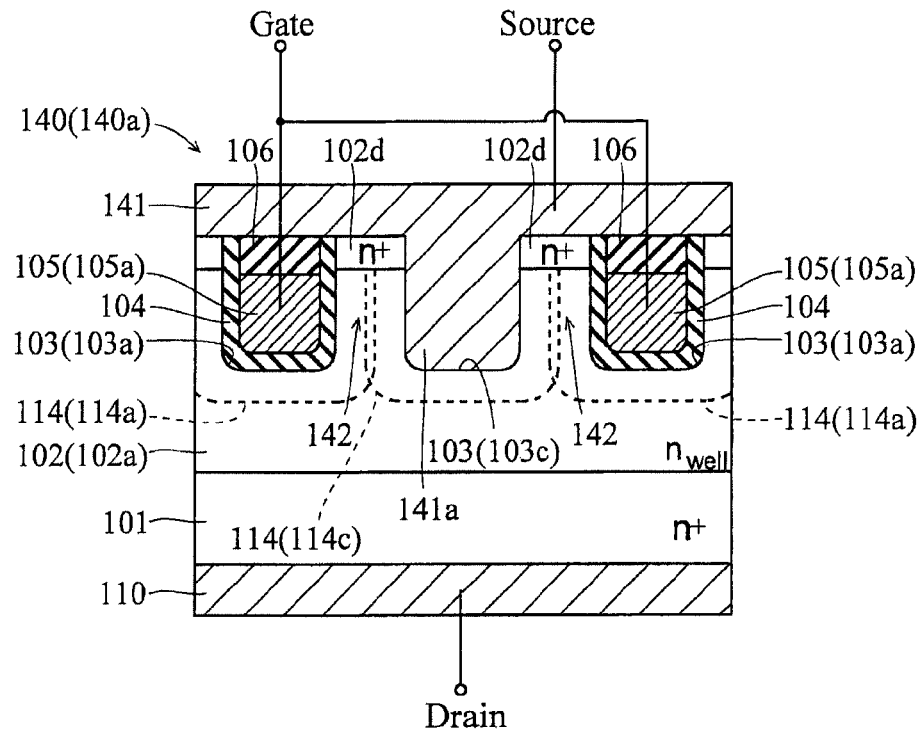
FIG. 24 is a cross sectional view illustrating a structure of a region functioning as a switching transistor of the semiconductor device according to a seventh embodiment of the present invention.

First, in case of the turned-off state, as illustrated in FIG. 24, a negative potential is applied to the embedded electrode 105a so that the depletion layer 114 (114a) is formed around the trench 103a. Thus, the current passage 142 is blocked with the depletion layers 114a and 114c, so that the current flowing through the current passage 142 can be interrupted.

Figure 25:
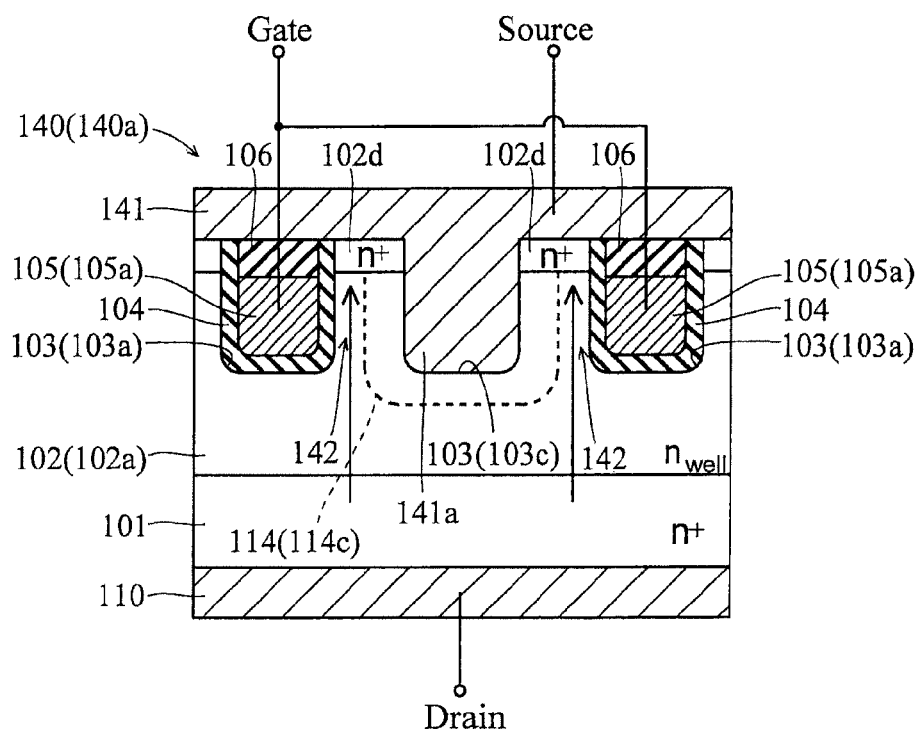
FIG. 25 is a cross sectional view illustrating an operation of a region functioning as a switching transistor of the semiconductor device according to the seventh embodiment of the present invention.

Further, in case of switching from the turned-off state to the turned-on state, as illustrated in FIG. 25, a positive potential is applied to the embedded electrode 105a, so that the depletion layer 114a illustrated in FIG. 24 is deleted. Thus, current can flow through the part on the embedded electrode 105a side (trench 103a side) of the current passage 142 in the arrow direction illustrated in FIG. 25.

The effect of the seventh embodiment is the same as the effect of the fifth embodiment.

Eighth Embodiment

Hereinafter, with reference to FIG. 26, a structure of a region 150a functioning as a switching transistor in a semiconductor device 150 according to an eighth embodiment will be described.

In the semiconductor device 150 of the eighth embodiment, the region 150a functioning as a switching transistor includes a trench 103 (103a) filled with the embedded electrode 105 (105a) to which a predetermined control signal (signal for switching on and off) is applied, and a P+ type diffusion region 151 in which P type impurity is doped at high concentration. The P+ type diffusion region 151 is disposed in each region between the neighboring trenches 103a with a predetermined space to the trench 103a by one to one. In addition, the P+ type diffusion region 151 has an ohmic contact with the source electrode 109. Note that the P+ type diffusion region 151 is an example of the "current passage interrupting diffusion region" in the present invention.

Further, in the eighth embodiment, when a voltage is applied between the source electrode 109 and the drain electrode 110, current flows between the source electrode 109 and the drain electrode 110 so as to pass through each region between the trench 103a and the P+ type diffusion region 151. In other words, in the eighth embodiment, each region between the trench 103a and the P+ type diffusion region 151 functions as a current passage 152.

Note that other structure of the region 150a functioning as a switching transistor in the semiconductor device 150 of the eighth embodiment is the same as the structure of the region 120a functioning as a switching transistor in the above-mentioned semiconductor device 120 of the fifth embodiment. In addition, a structure of the region functioning as a bidirectional Zener diode in the semiconductor device 150 of the eighth embodiment (not shown) is the same as the structure of the region 120b functioning as a bidirectional Zener diode in the above-mentioned semiconductor device 120 of the fifth embodiment.

Next, with reference to FIGS. 26 and 27, an operation of the region 150a functioning as a switching transistor in the semiconductor device 150 according to the eighth embodiment will be described.

Note that it is supposed that a negative potential and a positive potential are applied to the source electrode 109 and the drain electrode 110, respectively, in the following description of the operation. In other words, a depletion layer 114 (114d) is formed around the P+ type diffusion region 151 regardless of the turned-on state or the turned-off state.

Figure 26:
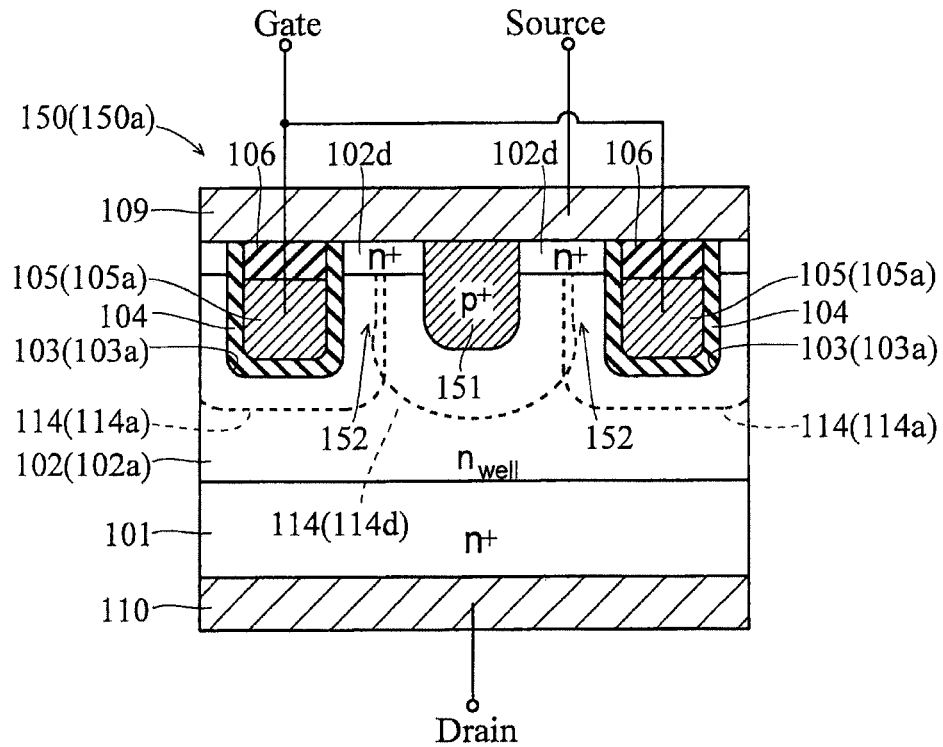
FIG. 26 is a cross sectional view illustrating a structure of a region functioning as a switching transistor of a semiconductor device according to an eighth embodiment of the present invention.

First, in case of the turned-off state, as illustrated in FIG. 26, a negative potential is applied to the embedded electrode 105a so that the depletion layer 114 (114a) is formed around the trench 103a. Thus, the current passage 152 is blocked with the depletion layers 114a and 114d, so that current flowing through the current passage 152 can be interrupted.

Figure 27:
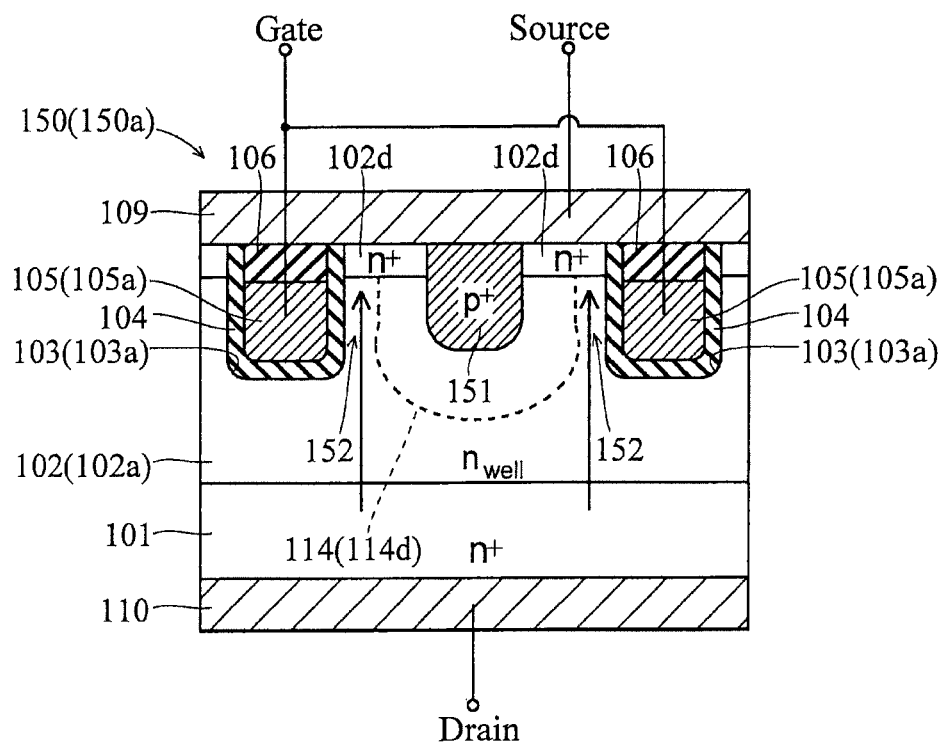
FIG. 27 is a cross sectional view illustrating an operation of the region functioning as a switching transistor of the semiconductor device according to the eighth embodiment of the present invention.

Further, in case of switching from the turned-off state to the turned-on state, as illustrated in FIG. 27, a positive potential is applied to the embedded electrode 105a, so that the depletion layer 114a illustrated in FIG. 26 is deleted. Thus, current can flow through the part of the current passage 152 on the embedded electrode 105a side (trench 103a side) in the arrow direction illustrated in FIG. 27.

The effect of the eighth embodiment is the same as the effect of the fifth embodiment described above.

Ninth Embodiment

Hereinafter, with reference to FIGS. 28 to 32, a structure of a semiconductor device 220 according to a ninth embodiment will be described.

Figure 28:
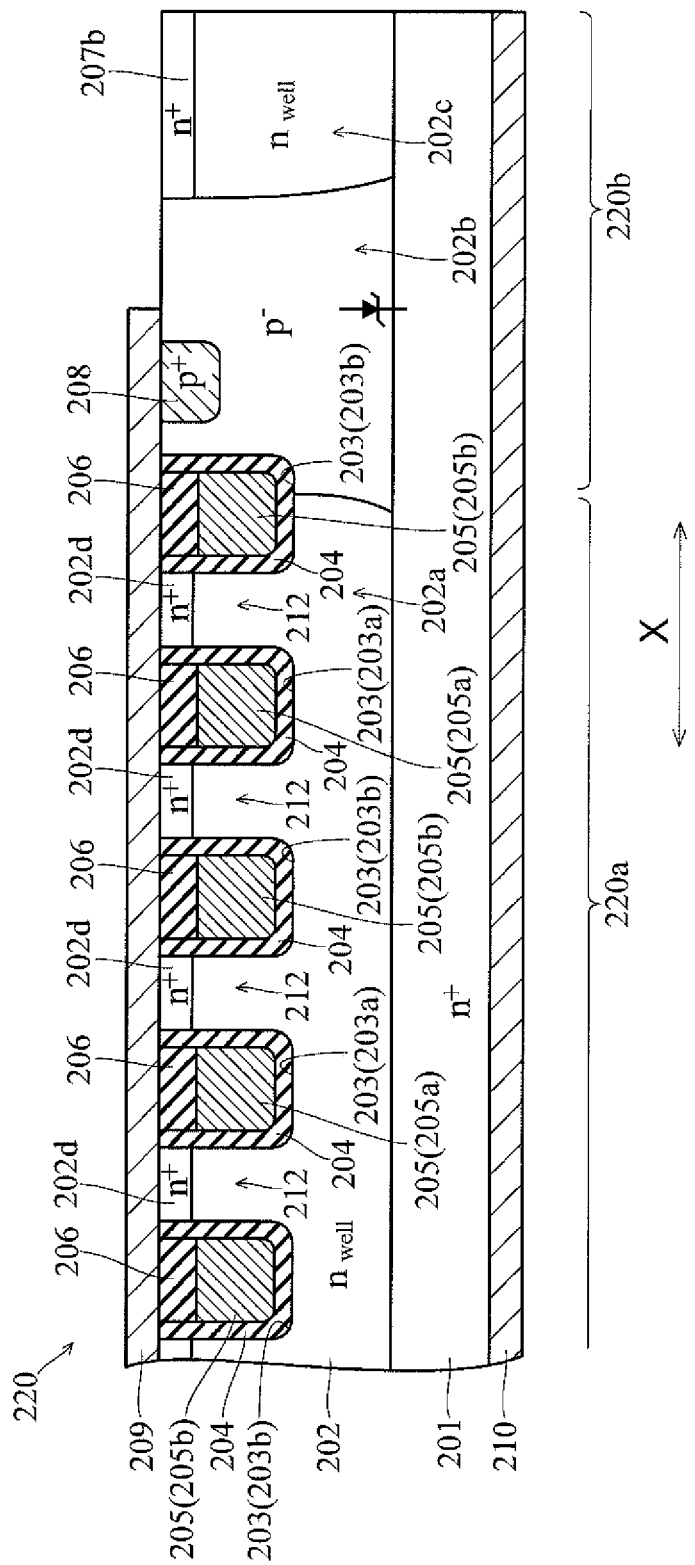
FIG. 28 is a cross sectional view illustrating a semiconductor device according to a ninth embodiment of the present invention.
Figure 29:
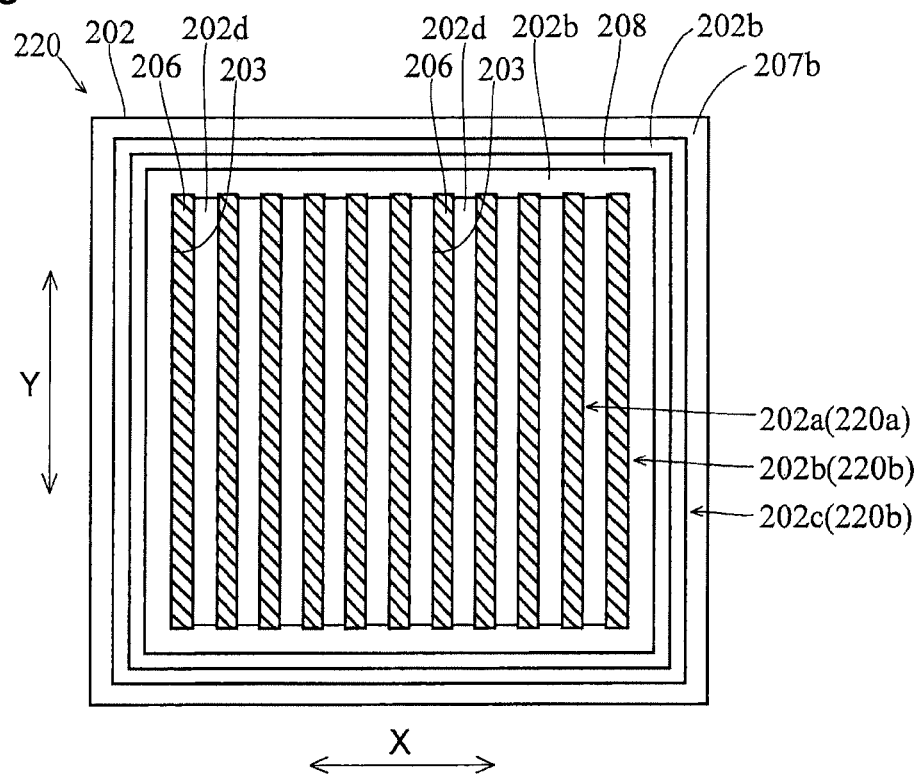
FIG. 29 is a plan view of the semiconductor device according to the ninth embodiment illustrated in FIG. 28.

As illustrated in FIGS. 28 and 29, the semiconductor device 220 of the ninth embodiment includes a region 220a and a region 220b disposed outside the region 220a. The regions 220a and 220b of the semiconductor device 220 are arranged so that the region 220b encloses the region 220a in a plan view. Further, the region 220a of the semiconductor device 220 is adapted to function as a normally-off type switching transistor, while the region 220b of the semiconductor device 220 is adapted to function as a Zener diode. In other words, the semiconductor device 220 of the ninth embodiment has a structure in which the switching transistor and the Zener diode are disposed integrally.

As a concrete structure, in the semiconductor device 220 of the ninth embodiment, as illustrated in FIG. 28, an epitaxial layer 202 made of P− type silicon having a thickness of approximately 1 to 10 nm is formed on the upper surface of the N+ type silicon substrate 201. N type impurity is doped in the N+ type silicon substrate 201 at high concentration so as to have a good ohmic contact with a drain electrode 210 that will be described later. Note that the N+ type silicon substrate 201 is an example of the "semiconductor layer" and the "first region of one conductivity type" in the present invention, and the epitaxial layer 202 is an example of the "semiconductor layer" in the present invention.

In addition, the epitaxial layer 202 includes N type well regions 202a and 202c, and a P− type region 202b. The N type well regions 202a and 202c in the epitaxial layer 202 are formed by doping the N type impurity by ion injection from the upper surface side of the epitaxial layer 202, and reach the upper surface of the N+ type silicon substrate 201. In addition, the P− type region 202b in the epitaxial layer 202 is constituted of the region in which the N type impurity is not doped by ion injection. Note that the N type impurity concentration of the N type well regions 202a and 202c in the epitaxial layer 202 is set to approximately $5 \times 10^{15}$ to $1 \times 10^{18}$ cm$^{-3}$, for example. In addition, the P type impurity concentration of the region in which the N type impurity is not doped by ion injection (P− type region 202b) in the epitaxial layer 202 is set to approximately $5 \times 10^{15}$ to $1 \times 10^{18}$ cm$^{-3}$, for example.

In addition, the N type well region 202a of the epitaxial layer 202 is formed in every region corresponding to the region 220a of the semiconductor device 220, and the N type well region 202c of the epitaxial layer 202 is formed at the outmost of the region corresponding to the region 220b of the semiconductor device 220. Therefore, the P− type region 202b of the epitaxial layer 202 is disposed inside the N type well region 202c in the region corresponding to the region 220b of the semiconductor device 220. Note that the N type well region 202a is an example of the "second region of one conductivity type" in the present invention, and the P− type region 202b is an example of the "third region of an inverse conductivity type" in the present invention.

In addition, the N type well region 202a of the epitaxial layer 202 includes a plurality of trenches 203 dug in the thickness direction of the epitaxial layer 202. The plurality of trenches 203 are formed by etching the epitaxial layer 202 from the upper surface (principal surface) side thereof. In other words, the opening end of each of the plurality of trenches 203 is disposed on the upper surface side of the epitaxial layer 202. Further, a depth of each of the plurality of trenches 203 is set to approximately 0.5 to 12 μm. The depth of the trench 203 in the ninth embodiment is set so as to be smaller than the thickness of the N type epitaxial layer 202 (approximately 1 to 10 μm). Note that the trench 203 may penetrate the N type epitaxial layer 202 and reach the N+ type silicon substrate 201 (not shown).

Figure 30:
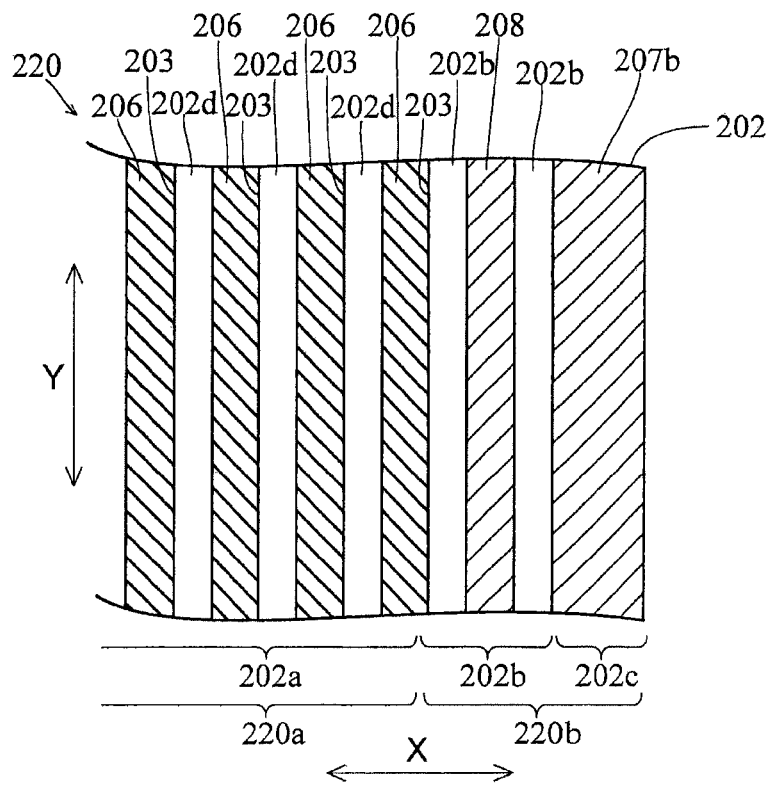
FIG. 30 is an enlarged view of a part of FIG. 29.

In addition, as illustrated in FIGS. 29 and 30, each of the plurality of trenches 203 is formed in an elongated shape so as to extend in a predetermined direction (Y direction) that is parallel to the upper surface of the epitaxial layer 202 in a plan view. In addition, the plurality of trenches 203 are arranged with spaces of approximately 0.05 to 0.3 µm in the direction (X direction) that is parallel to the upper surface of the epitaxial layer 202 and is perpendicular to the extending direction of the trench 203 (Y direction). In addition, a width of each of the plurality of trenches 203 in the X direction is set to approximately 0.1 to 1 µm. Further, among the plurality of trenches 203, the trench 203 positioned at the endmost position is arranged to straddle the boundary part between the N type well region 202a and the P⁻ type region 202b of the epitaxial layer 202.

In addition, as illustrated in FIG. 28, on the inner surface of each of the plurality of trenches 203, there is formed a silicon oxide film (insulator film) 204 that is obtained by thermal oxidation process of silicon forming the epitaxial layer 202 at a thickness of approximately 10 to 100 nm.

In addition, on the inner surface of each of the plurality of trenches 203, there is formed an embedded electrode 205 made of P type polysilicon via the silicon oxide film 204. Each of the plurality of embedded electrodes 205 is filled in the corresponding trench 203 to a halfway depth. Note that a metal or the like can be used instead of the P type polysilicon as a material of the embedded electrode 205.

In the structure of the ninth embodiment in which the plurality of embedded electrodes 205 are disposed as described above, the applied voltage to the plurality of embedded electrodes 205 is controlled so as to form the depletion layer around each of the plurality of trenches 203 or to delete the formed depletion layer. Further, in the ninth embodiment, a distance between the neighboring trenches 203 is set so that the depletion layers formed around the neighboring trenches 203 are overlapped with each other when the depletion layer is formed around each of the plurality of trenches 203. In other words, when the depletion layer is formed around each of the plurality of trenches 203, the depletion layers formed around the neighboring trenches 203 are connected to each other. Therefore, in the ninth embodiment, if the depletion layer is formed around each of the plurality of trenches 203, each region between the neighboring trenches 203 can be blocked with the depletion layers.

Figure 31:
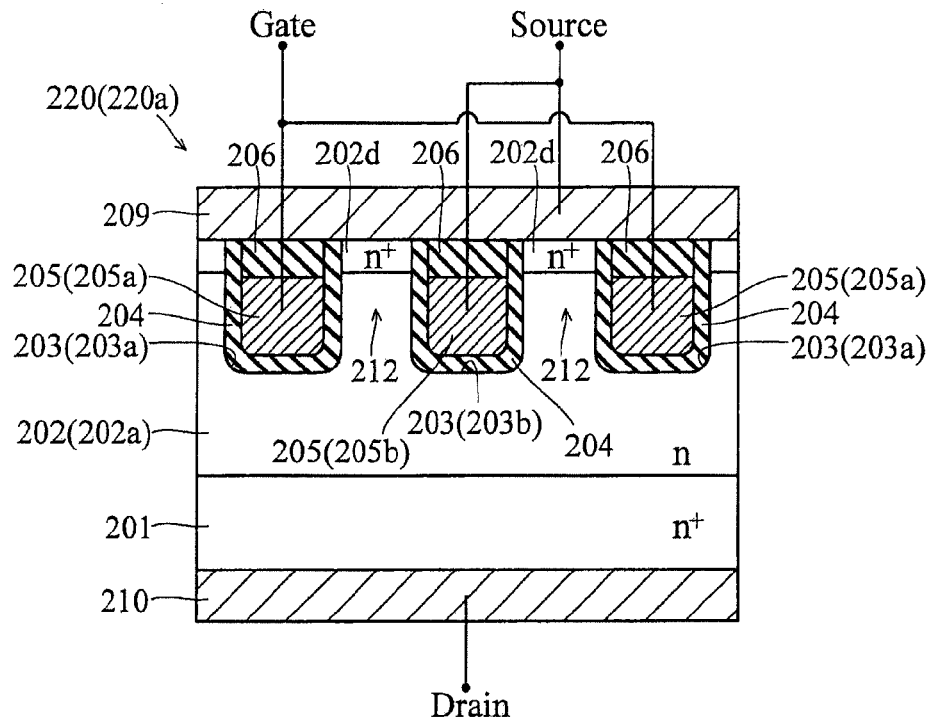
FIG. 31 is a cross sectional view illustrating connection positions of embedded electrodes of the semiconductor device according to the ninth embodiment illustrated in FIG. 28.

In addition, as illustrated in FIG. 31, the plurality of embedded electrodes 205 of the ninth embodiment include two types of embedded electrodes that are gate electrodes 205a and common electrodes 205b to which voltages are applied separately. One type embedded electrodes (gate electrodes) 205a are adapted to be applied with a voltage corresponding to a predetermined control signal (signal for switching on and off). In addition, other type embedded electrodes (common electrode) 205b are electrically connected to a source electrode 209 that will be described later. In other words, the other type embedded electrodes (common electrode) 205b are adapted to be the same potential as the source electrode 209. Note that the embedded electrodes 205a and 205b are example of the "first embedded electrode" and the "second embedded electrode" in the present invention, respectively.

In addition, as illustrated in FIG. 28, an interlayer insulator film 206 made of a silicon oxide film is filled in the remaining part that is not filled with the embedded electrode 205 in each of the plurality of trenches 203 (part over the embedded electrode 205). Each of the plurality of interlayer insulator films 206 is provided for insulating between the corresponding embedded electrode 205 and the source electrode 209 that will be described later. In addition, the thickness of each of the plurality of interlayer insulator films 206 is set to be the same as the depth of the remaining part that is not filled with the embedded electrode 205 of the corresponding trench 203 (part over the embedded electrode 205). Therefore, the upper surface of each of the plurality of interlayer insulator films 206 is flush with the upper surface of the epitaxial layer 202 (upper surface of the upper end portion of each region between the neighboring trenches 203).

In addition, on the upper surface portion of the N type well region 202a in the epitaxial layer 202 (upper end portion of each region between the neighboring trenches 203), there is formed a high concentration region 202d in which N type impurity is doped at high concentration by ion injection so that a low concentration region is not exposed on the upper surface side of the epitaxial layer 202. The concentration of the high concentration region 202d in the epitaxial layer 202 is set so that a good ohmic contact can be obtained with the source electrode 209 that will be described later, and is higher than the concentration in other part of the N type well region 202a in the epitaxial layer 202. Further, the thickness of the high concentration region 202d in the epitaxial layer 202 is set to be smaller than the thickness of the interlayer insulator film 206. In other words, the lower end portion of the high concentration region 202d in the epitaxial layer 202 is positioned higher than the upper end portion of the embedded electrode 205.

On the other hand, on at least a part of the P⁻ type region 202b on the upper surface side in the epitaxial layer 202, there is formed a P⁺ type diffusion region 208 in which P type impurity is doped by ion injection at high concentration (e.g., approximately $1 \times 10^{17}$ to $1 \times 10^{20}$ cm⁻³) so as to have a good ohmic contact with the source electrode 209 that will be described later. Further, on the upper surface side portion of the N type well region 202c in the epitaxial layer 202, there is formed an N⁺ type diffusion region 207b in which N type impurity is doped by ion injection at high concentration so that the N type well region 202c is not exposed on the upper surface of the epitaxial layer 202.

In addition, on the upper surface of the epitaxial layer 202, there is formed the source electrode 209 made of an aluminum layer or the like. The source electrode 209 has an ohmic contact with the high concentration region 202d of the epitaxial layer 202 (upper end portion of each region between the neighboring trenches 203) and the P⁺ type diffusion region 208. In other words, the N type well region 202a and the P⁻ type region 202b of the epitaxial layer 202 are electrically connected to each other via the source electrode 209. Note that the source electrode 209 is an example of the "electrode layer" in the present invention. In addition, on the back surface of the N⁺ type silicon substrate 201, there is formed the drain electrode 210 made of a multilayer structure in which a plurality of metal layers are laminated. The drain electrode 210 has an ohmic contact with the N⁺ type silicon substrate 201.

In the structure described above, when a voltage is applied between the source electrode 209 and the drain electrode 210, current flowing between the source electrode 209 and the drain electrode 210 (current flowing in the thickness direction of the epitaxial layer 202) passes through at least a part of each region between the neighboring trenches 203 in the epitaxial layer 202. In other words, at least a part of each region between the neighboring trenches 203 functions as a current passage (channel) 212 in the epitaxial layer 202.

Further, in the above-mentioned structure, a junction portion between the P⁻ type region 202b and the N⁺ type silicon substrate 201 functions as a Zener diode in the epitaxial layer 202.

Figure 32:
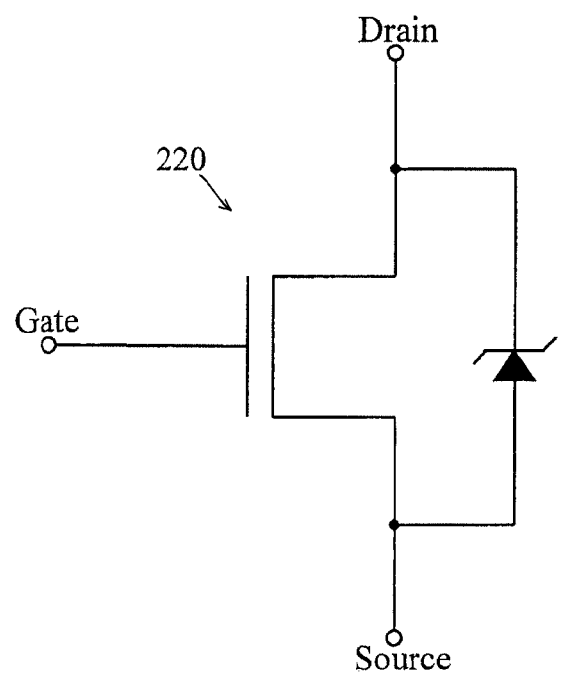
FIG. 32 is an equivalent circuit diagram of the semiconductor device according to the ninth embodiment illustrated in FIG. 28.

Note that the above-mentioned semiconductor device 220 of the ninth embodiment can be represented by an equivalent circuit illustrated in FIG. 32. In other words, as illustrated in FIG. 32, the semiconductor device 220 of the ninth embodiment has a circuit in which a Zener diode is connected between the source and the drain of a switching transistor so that the direction from the source to the drain of the switching transistor becomes a forward direction. Note that the part of the switching transistor in the semiconductor device 220 is represented by a circuit symbol of a MOSFET in FIG. 32 for convenience' sake.

Next, with reference to FIGS. 33 and 34, an operation of the region 220a functioning as a switching transistor of the semiconductor device 220 according to the ninth embodiment will be described. Note that FIG. 33 illustrates the case where the region 220a functioning as a switching transistor of the semiconductor device 220 is in the turned-off state, and FIG. 34 illustrates the case where the region 220a functioning as a switching transistor of the semiconductor device 220 is in the turned-on state.

Figure 33:
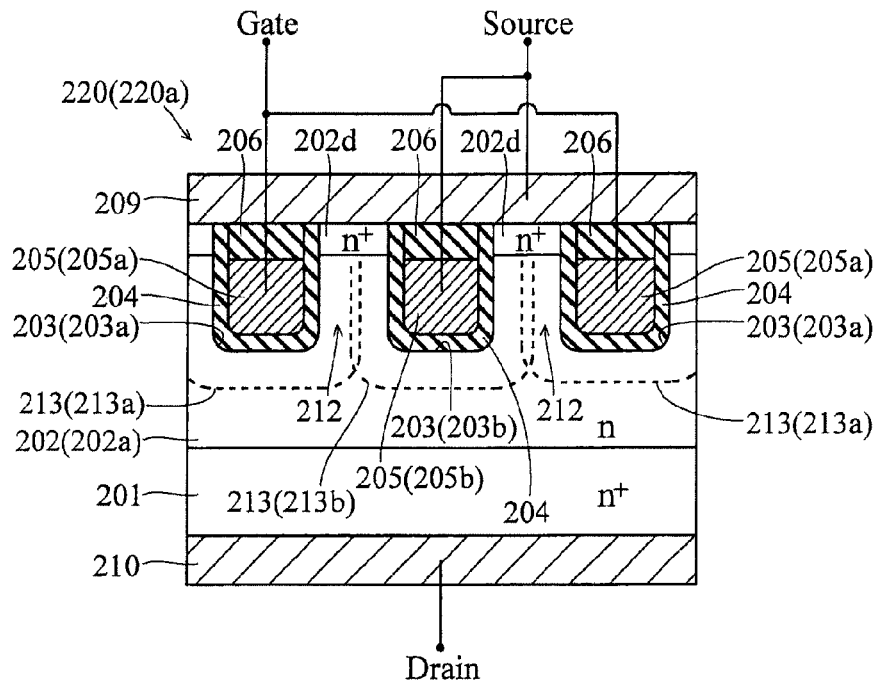
FIG. 33 is a cross sectional view illustrating an operation of the semiconductor device according to the ninth embodiment of the present invention.
Figure 34:
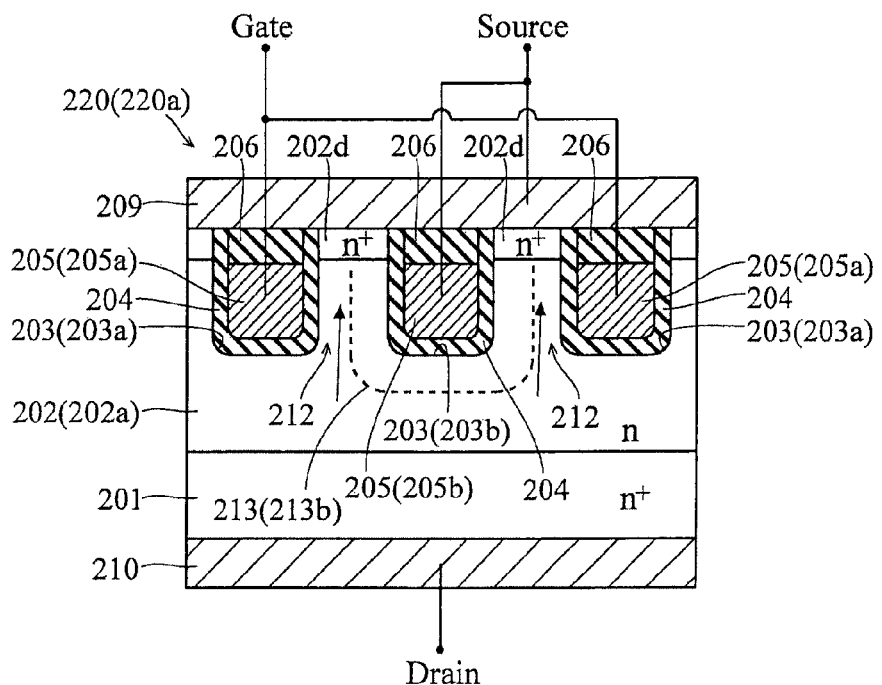
FIG. 34 is a cross sectional view illustrating an operation of the semiconductor device according to the ninth embodiment of the present invention.

First, as illustrated in FIGS. 33 and 34, it is supposed that a negative potential and a positive potential are applied to the source electrode 209 and the drain electrode 210, respectively. Then, the embedded electrode (common electrode) 205b is electrically connected to the source electrode 209, so the negative potential is applied to the embedded electrode (common electrode) 205b. Therefore, there is a state in which majority carrier is always decreased around the trench 203 filled with the embedded electrode (common electrode) 205b (hereinafter referred to as a trench 203b). In other words, a depletion layer 213 (213b) is always formed around the trench 203b regardless of the turned-on state or the turned-off state.

Further, in case of the turned-off state, as illustrated in FIG. 33, the applied voltage to the embedded electrode (gate electrode) 205a is controlled so that majority carrier existing around the trench 203 filled with the embedded electrode (gate electrode) 205a (hereinafter referred to as a trench 203a) is decreased. Thus, a depletion layer 213 (213a) is formed around the trench 203a similarly to the depletion layer 213b formed around the trench 203b.

In this case, in the region between the trench 203a and the trench 203b, the depletion layers 213a and 213b formed around the trench 203a and the trench 203b are overlapped with each other. In other words, in the region between the trench 203a and the trench 203b, the depletion layers 213a and 213b are connected to each other. Thus, the current passage 212 is blocked with the depletion layers 213a and 213b, so that current flowing through the current passage 212 can be interrupted.

Further, in case of switching from the turned-off state to the turned-on state, as illustrated in FIG. 34, a predetermined positive potential is applied to the embedded electrode (gate electrode) 205a, so that the depletion layer 213a formed around the trench 203a (see FIG. 33) is deleted. In other words, the depletion layer 213a that blocks the part of the current passage 212 on the embedded electrode (gate electrode) 205a side is deleted. Thus, current can flow through the part of the current passage 212 on the embedded electrode (gate electrode) 205a side, so as to be turned on.

In addition, in case of switching from the turned-on state to the turned-off state, the application of the predetermined positive potential to the embedded electrode (gate electrode) 205a is stopped. Thus, the state illustrated in FIG. 33 is restored so as to be turned off.

In the ninth embodiment, as described above, each region between the neighboring trenches 203 is blocked with the depletion layer 213 formed around the trench 203, so that the current passage 212 is interrupted. In contrast, at least a part of the depletion layer 213 formed around the trench 203 (depletion layer 213a formed around the trench 203a) is deleted so that the current passage 212 is opened. Thus, a formation state of the depletion layer 213 changes in accordance with the applied voltage to the embedded electrode 205. Therefore, by controlling the applied voltage to the embedded electrode 205, it is possible to switch from the turned-on state (in which the current passage 212 is opened) to the turned-off state (in which the current passage 212 is interrupted), and to switch in the opposite direction. In other words, the semiconductor device 220 can have a switching function. Further, in the above-mentioned structure, in the turned-on state, the entire part of the current passage 212 in which the depletion layer 213 is deleted can be used for the current to flow. Therefore, compared with the conventional semiconductor switch device (MOSFET) in which the very thin inversion layer functions as a current passage (channel), resistance against current can be reduced largely. Thus, compared with the conventional semiconductor switch device (MOSFET), on-resistance can be reduced largely.

In addition, in the ninth embodiment, as described above, the junction portion between the $N^+$ type silicon substrate 201 and the $P^-$ type region 202b of the epitaxial layer 202 becomes the Zener diode, so that the Zener diode is connected between the source and the drain of the switching transistor. Thus, even if surge voltage or the like enters the semiconductor device 220, the surge voltage or the like can be absorbed by the Zener diode. Therefore, it is possible to suppress dielectric breakdown or the like due to the surge voltage entering the semiconductor device 220. As a result, it is possible to suppress a breakage of the semiconductor device 220.

In addition, in the above-mentioned structure, the switching transistor and the Zener diode are integrated, so it is not necessary to dispose another region or the like for forming a wiring member for connecting the switching transistor with the Zener diode. Thus, an area of the circuit including the switching transistor and the Zener diode that are connected to each other can be reduced.

In addition, in the ninth embodiment, as described above, when the current passage 212 is to be interrupted, the depletion layers 213 formed around the neighboring trenches 203 are connected to each other, so that the current passage 212 can securely be blocked with the depletion layers 213 formed around the neighboring trenches 203.

In addition, in the ninth embodiment, as described above, a distance between the neighboring trenches 203 is set so that the depletion layers 213 formed around the neighboring trenches 203 are overlapped with each other, so that the depletion layers 213 formed around the neighboring trenches 203 can easily be connected to each other.

Tenth Embodiment

Hereinafter, with reference to FIGS. 35 to 38, a structure of a semiconductor device 230 according to a tenth embodiment will be described.

Figure 35:
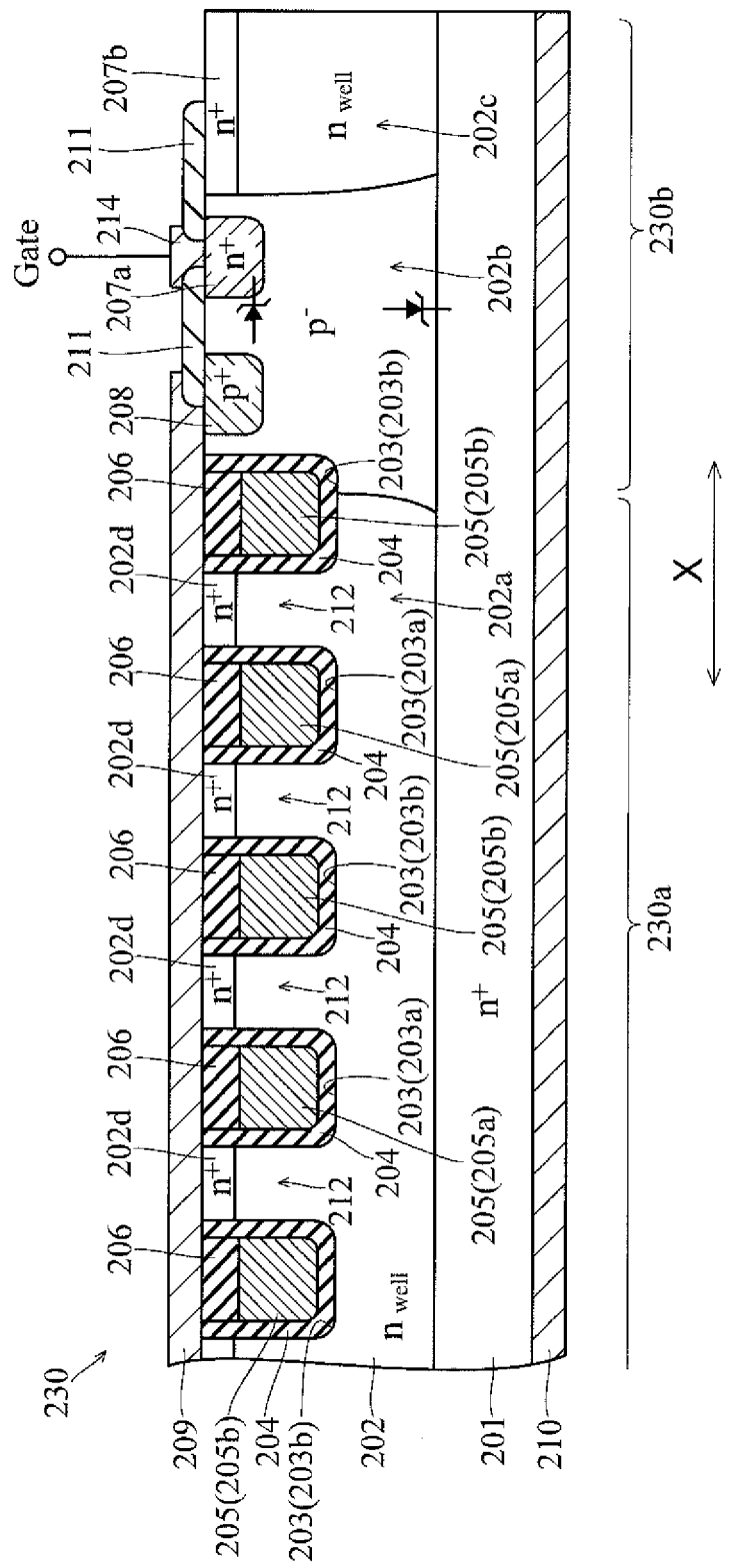
FIG. 35 is a cross sectional view illustrating a semiconductor device according to a tenth embodiment of the present invention.
Figure 36:
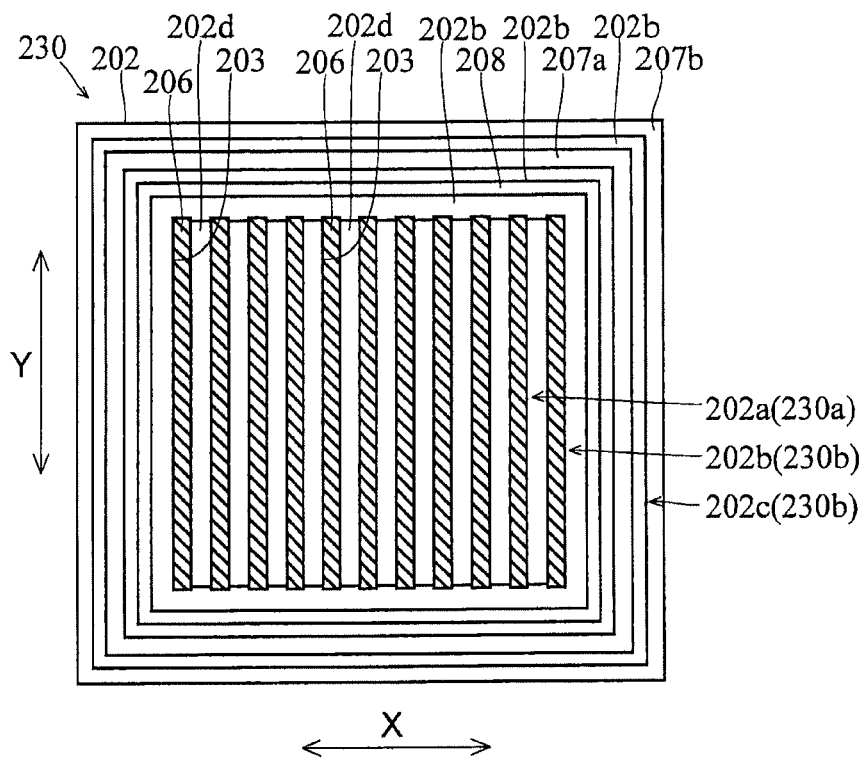
FIG. 36 is a plan view of a semiconductor device according to a tenth embodiment illustrated in FIG. 35.
Figure 37:
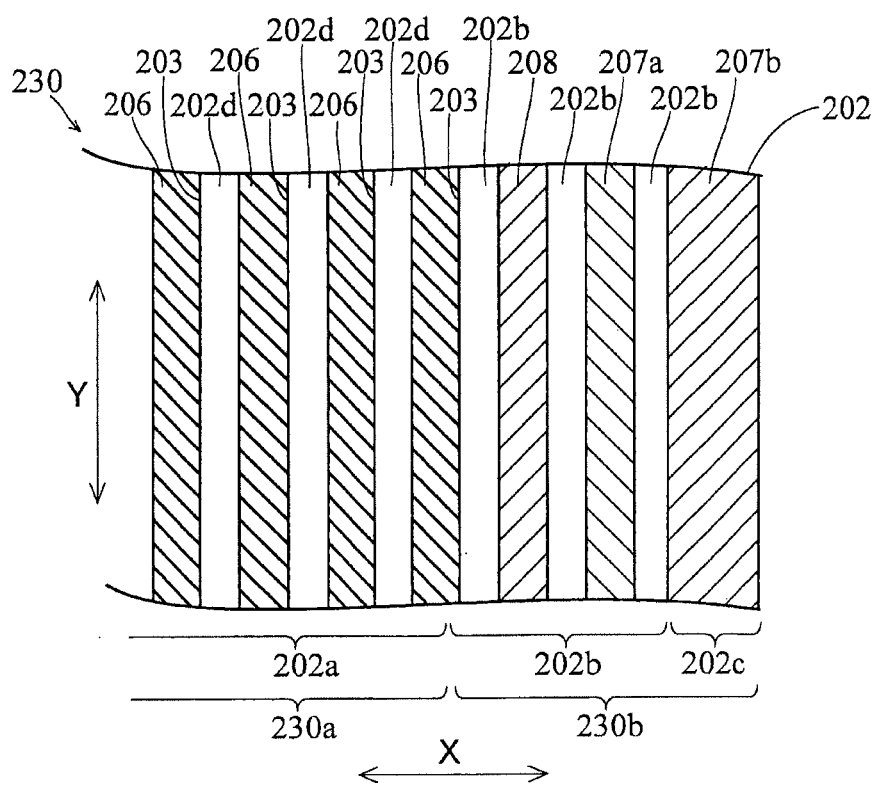
FIG. 37 is an enlarged view of a part of FIG. 36.

The semiconductor device 230 of the tenth embodiment includes a region 230a and a region 230b disposed so as to enclose the region 230a as illustrated in FIGS. 35 to 37. The regions 230a and 230b in the semiconductor device 230 are adapted to function as a switching transistor and a Zener diode, respectively.

Further, in the tenth embodiment, in the region corresponding to the region 230b of the semiconductor device 230, the $P^-$ type region 202b of the epitaxial layer 202 includes the $P^+$ type diffusion region 208 and an $N^+$ type diffusion region 207a in which N type impurity is doped by ion injection at high concentration (e.g., approximately $1 \times 10^{17}$ to $1 \times 10^{20}$ cm$^{-3}$). Note that the N$^+$ type diffusion region 207a is an example of the "Zener diode diffusion region" in the present invention.

The N$^+$ type diffusion region 207a of the epitaxial layer 202 is disposed at a predetermined part on the upper surface side of the P$^-$ type region 202b so as not to contact with the P$^+$ type diffusion region 208. Further, the N$^+$ type diffusion region 207a in the epitaxial layer 202 is electrically connected to the embedded electrode (gate electrode) 205a via a peripheral wiring 214. Note that the peripheral wiring 214 is insulated by the SiO$_2$ layer 211 from a part other than the N$^+$ type diffusion region 207a in the epitaxial layer 202.

Note that other structure of the tenth embodiment is the same as the above-mentioned ninth embodiment.

In the structure of the tenth embodiment, in addition to the junction portion between the P$^-$ type region 202b in the epitaxial layer 202 and the N$^+$ type silicon substrate 201, a junction portion between the P$^-$ type region 202b in the epitaxial layer 202 and the N$^+$ type diffusion region 207a also functions as a Zener diode.

Figure 38:
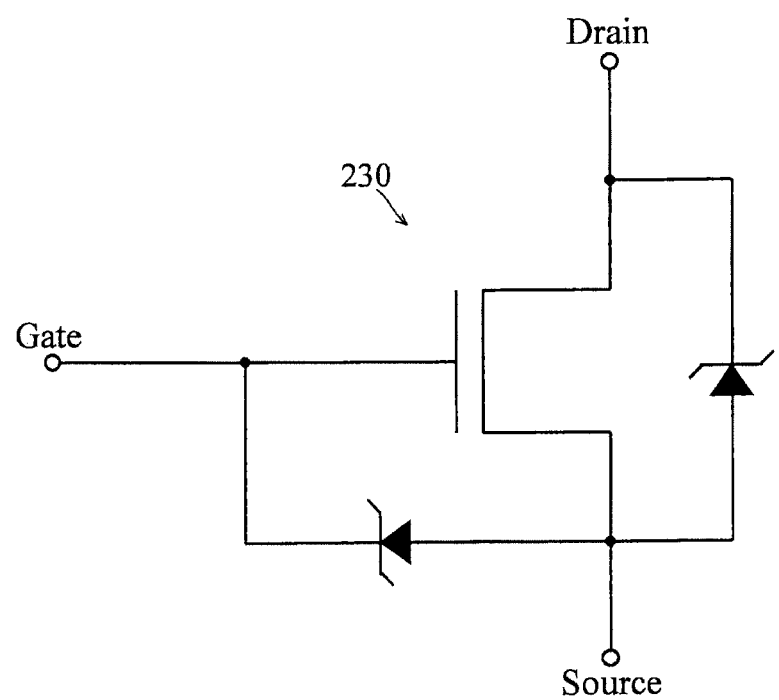
FIG. 38 is an equivalent circuit diagram of the semiconductor device according to the tenth embodiment illustrated in FIG. 35.

Further, the semiconductor device 230 of the tenth embodiment described above can be represented by an equivalent circuit as illustrated in FIG. 38. In other words, in the semiconductor device 230 of the tenth embodiment, as illustrated in FIG. 38, a Zener diode is connected between the source and the drain of the switching transistor so that the direction from the source to the drain of the switching transistor becomes the forward direction. In addition, another Zener diode is connected between the source and the gate of the switching transistor so that the direction from the source to the gate of the switching transistor becomes the forward direction. Note that the part of the switching transistor in the semiconductor device 230 is represented by a circuit symbol of a MOSFET for convenience' sake in FIG. 38.

In the tenth embodiment, with the above-mentioned structure, it is possible to connect the Zener diode also between the source and the gate of the switching transistor in addition to the Zener diode between the source and the drain of the switching transistor. Thus, even if surge voltage or the like enters the semiconductor device 230, the surge voltage or the like can be absorbed by the two types of Zener diodes. Thus, dielectric breakdown or the like due to the surge voltage entering the semiconductor device 230 can be further suppressed. As a result, a breakage of the semiconductor device 230 can be further suppressed.

Figure 39:
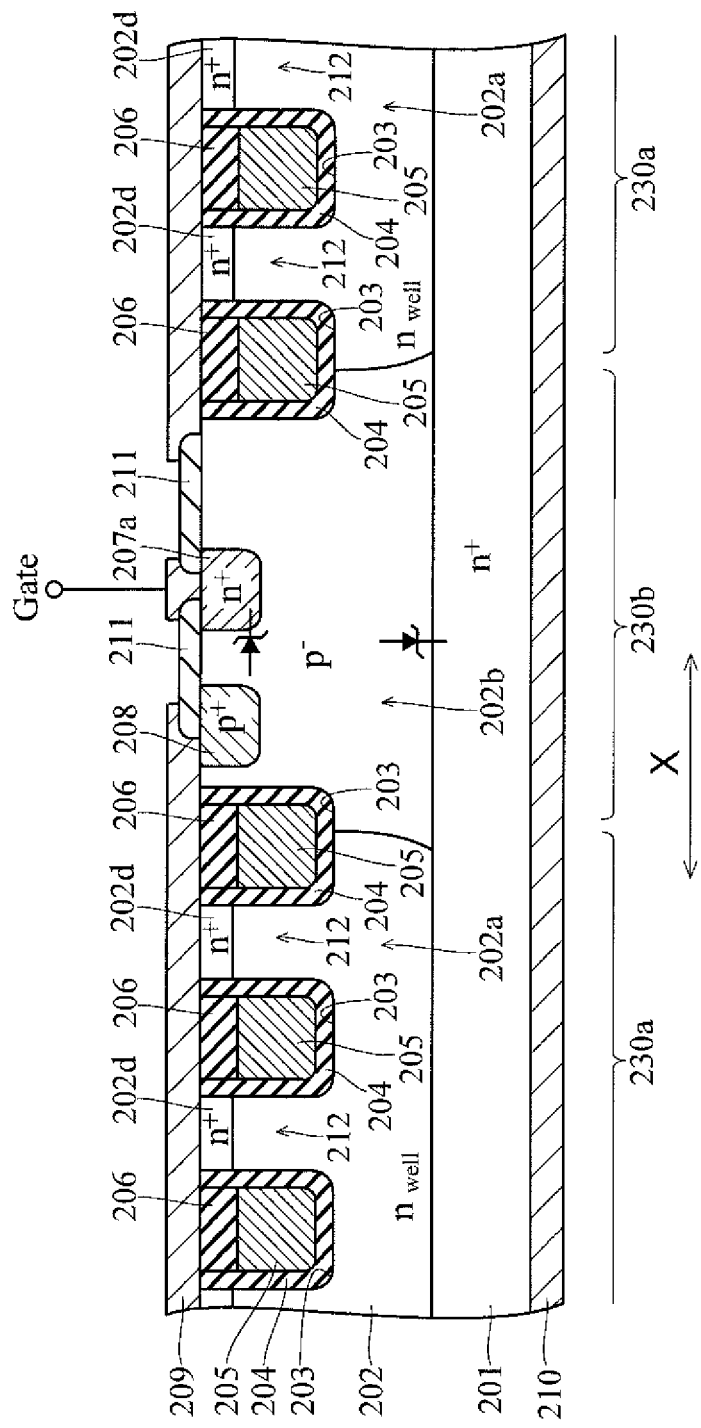
FIG. 39 is a cross sectional view of a semiconductor device according to a variation example of the tenth embodiment of the present invention.

In addition, it is possible to adopt another structure illustrated in FIG. 39 as a variation example of the tenth embodiment, in which the P$^-$ type region 202b is sandwiched between the N type well regions 202a.

Eleventh Embodiment

Hereinafter, with reference to FIG. 40, a structure of a region 240a functioning as a switching transistor of a semiconductor device 240 according to an eleventh embodiment will be described.

Figure 40:
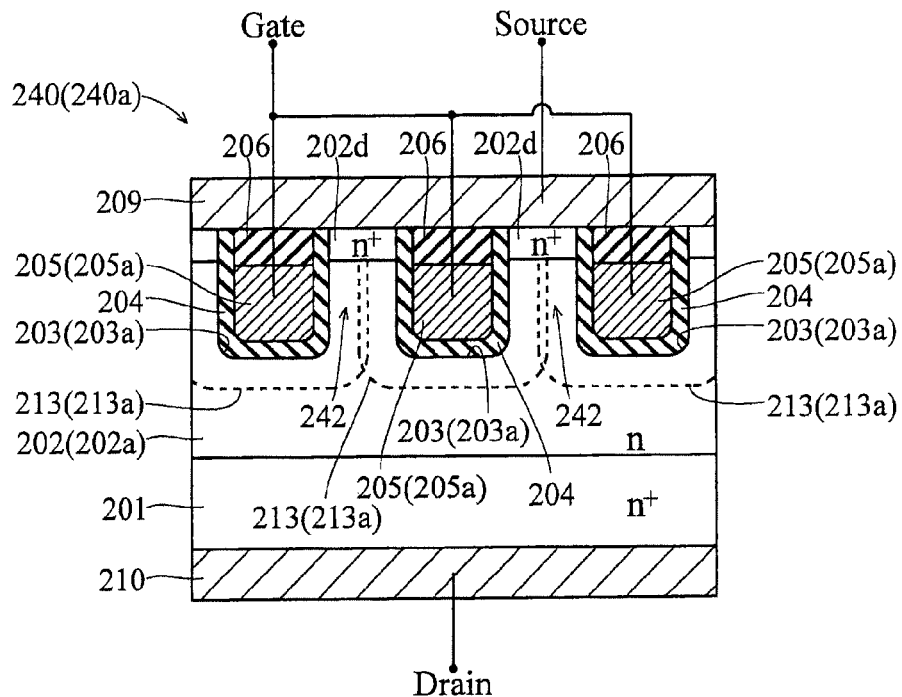
FIG. 40 is a cross sectional view illustrating a structure of a region functioning as a switching transistor of a semiconductor device according to an eleventh embodiment of the present invention.

In the semiconductor device 240 of the eleventh embodiment, as illustrated in FIG. 40, there is formed only the trench 203 (203a) filled with the embedded electrode 205 (205a) to which a predetermined control signal (signal for switching on and off) is applied in the region 240a functioning as a switching transistor.

Further, in the eleventh embodiment, when a voltage is applied between the source electrode 209 and the drain electrode 210, current flowing between the source electrode 209 and the drain electrode 210 passes through each region between the neighboring trenches 203a. In other words, in the eleventh embodiment, each region between the neighboring trenches 203a functions as a current passage 242.

Note that other structure of the region 240a functioning as a switching transistor of the semiconductor device 240 of the eleventh embodiment is the same as the structure of the region 220a functioning as a switching transistor of the semiconductor device 220 of the ninth embodiment described above. In addition, a structure of the region functioning as a Zener diode of the semiconductor device 240 of the eleventh embodiment (not shown) is the same as the structure of the region 220b functioning as a Zener diode of the semiconductor device 220 of the ninth embodiment described above or the region 230b functioning as a Zener diode of the semiconductor device 230 of the tenth embodiment described above.

Next, with reference to FIGS. 40 and 41, an operation of the region 240a functioning as a switching transistor of the semiconductor device 240 of the eleventh embodiment will be described.

First, in case of the turned-off state, as illustrated in FIG. 40, a negative potential is applied to every embedded electrode 205a so that the depletion layer 213 (213a) is formed around every trench 203a. Thus, the current passage 242 is blocked with the depletion layer 213a, so that the current flowing through the current passage 242 can be interrupted.

Figure 41:
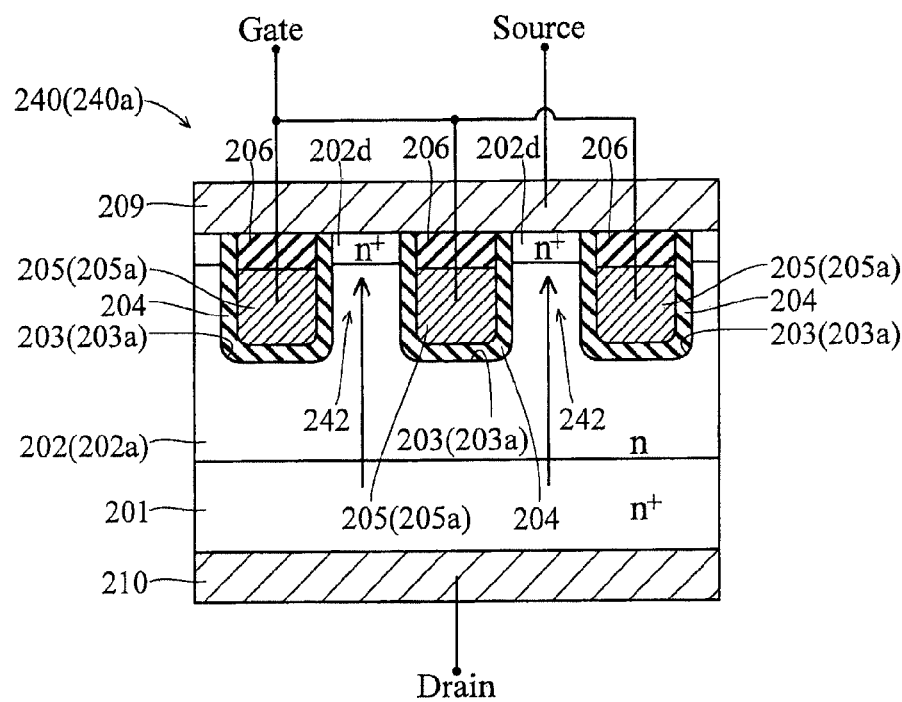
FIG. 41 is a cross sectional view illustrating an operation of the region functioning as a switching transistor of the semiconductor device according to the eleventh embodiment of the present invention.

Further, in case of switching from the turned-off state to the turned-on state, as illustrated in FIG. 41, a positive potential is applied to every embedded electrode 205a, so that every depletion layer 213a illustrated in FIG. 40 is deleted. Thus, if a negative potential and a positive potential are applied to the source electrode 209 and the drain electrode 210 respectively, current can flow through the current passage 242 in the arrow direction illustrated in FIG. 41.

The effect of the eleventh embodiment is the same as the effect of the ninth embodiment described above.

Twelfth Embodiment

Hereinafter, with reference to FIG. 42, a structure of a region 250a functioning as a switching transistor of a semiconductor device 250 according to a twelfth embodiment will be described.

Figure 42:
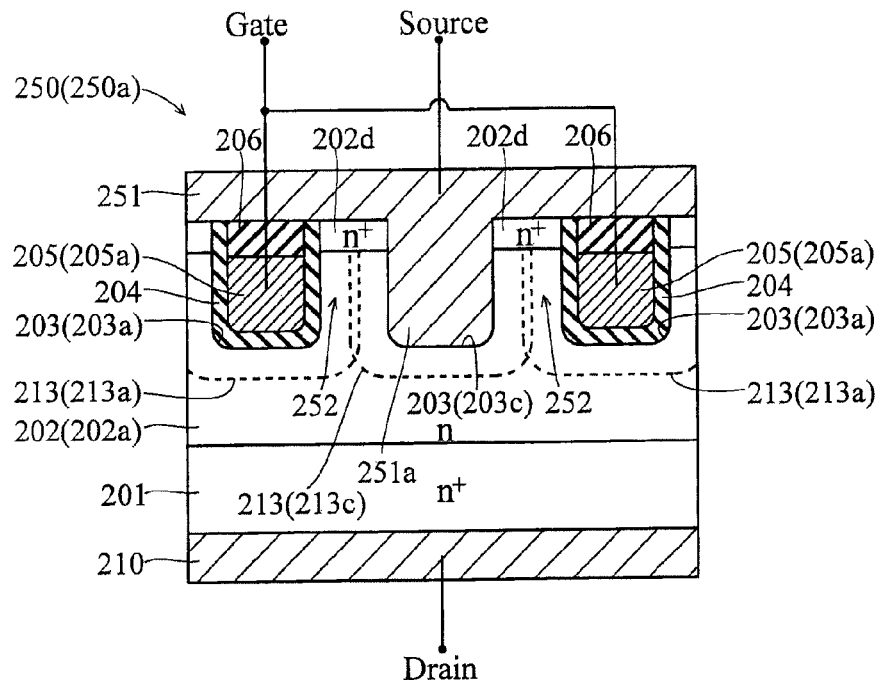
FIG. 42 is a cross sectional view illustrating a structure of a region functioning as a switching transistor of a semiconductor device according to a twelfth embodiment of the present invention.

In the semiconductor device 250 of the twelfth embodiment, as illustrated in FIG. 42, the region 250a functioning as a switching transistor includes a trench 203 (203a) filled with the embedded electrode 205 (205a) to which a predetermined control signal is applied, and a trench 203 (203c) filled with a part of the source electrode 251 (hereinafter referred to as an embedded portion 251a). The trenches 203a and 203c are arranged with predetermined spaces alternately one by one. In addition, the embedded portion 251a of the source electrode 251 has a Schottky contact with the epitaxial layer 202 inside the trench 203c. Note that the source electrode 251 is an example of the "electrode layer" in the present invention, and the embedded portion 251a is an example of the "second embedded electrode" in the present invention.

Further, in the twelfth embodiment, when a voltage is applied between the source electrode 251 and the drain electrode 210, current flows between the source electrode 251 and the drain electrode 210 so as to pass through each region between the trench 203a and the trench 203c. In other words, in the twelfth embodiment, each region between the trench 203a and the trench 203c functions as a current passage 252.

Note that other structure of the region 250a functioning as a switching transistor in the semiconductor device 250 of the twelfth embodiment is the same as the structure of the region 220a functioning as a switching transistor in the semiconductor device 220 of the ninth embodiment described above. In addition, a structure of the region functioning as a diode in the semiconductor device 250 of the twelfth embodiment (not shown) is the same as the structure of the region 220b functioning as a diode in the semiconductor device 220 of the ninth embodiment described above or the region 230b functioning as a Zener diode in the semiconductor device 230 of the tenth embodiment described above.

Next, with reference to FIGS. 42 and 43, an operation of the region 250a functioning as a switching transistor in the semiconductor device 250 according to the twelfth embodiment will be described.

Note that it is supposed in the following description of the operation that a negative potential and a positive potential are applied to the source electrode 251 and the drain electrode 210, respectively. In other words, a depletion layer 213 (213c) is formed around the trench 203c filled with the embedded portion 251a of the source electrode 251 regardless of the turned-on state or the turned-off state.

First, in case of the turned-off state, as illustrated in FIG. 42, a negative potential is applied to the embedded electrode 205a so that the depletion layer 213 (213a) is formed around the trench 203a. Thus, the current passage 252 is blocked with the depletion layers 213a and 213c, so that the current flowing through the current passage 252 can be interrupted.

Figure 43:
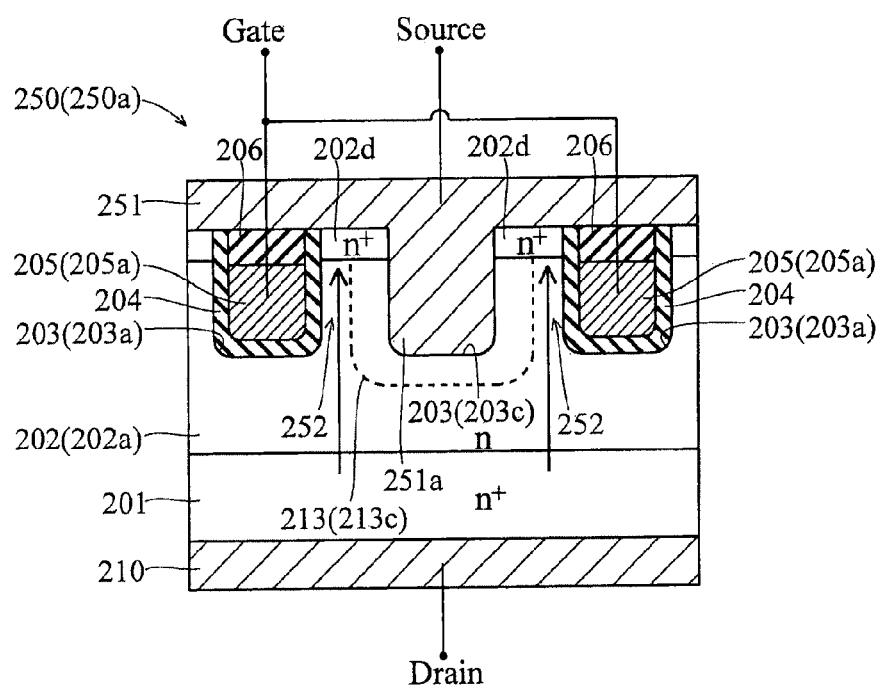
FIG. 43 is a cross sectional view illustrating an operation of the region functioning as a switching transistor of the semiconductor device according to the twelfth embodiment of the present invention.

Further, in case of switching from the turned-off state to the turned-on state, as illustrated in FIG. 43, a positive potential is applied to the embedded electrode 205a so that the depletion layer 213a illustrated in FIG. 42 is deleted. Thus, current can flow through the part of the current passage 252 on the embedded electrode 205a side in the arrow direction illustrated in FIG. 43.

The effect of the twelfth embodiment is the same as the effect of the ninth embodiment as described above.

Thirteenth Embodiment

Hereinafter, with reference to FIG. 44, a structure of a region 260a functioning as a switching transistor of a semiconductor device 260 according to a thirteenth embodiment will be described.

Figure 44:
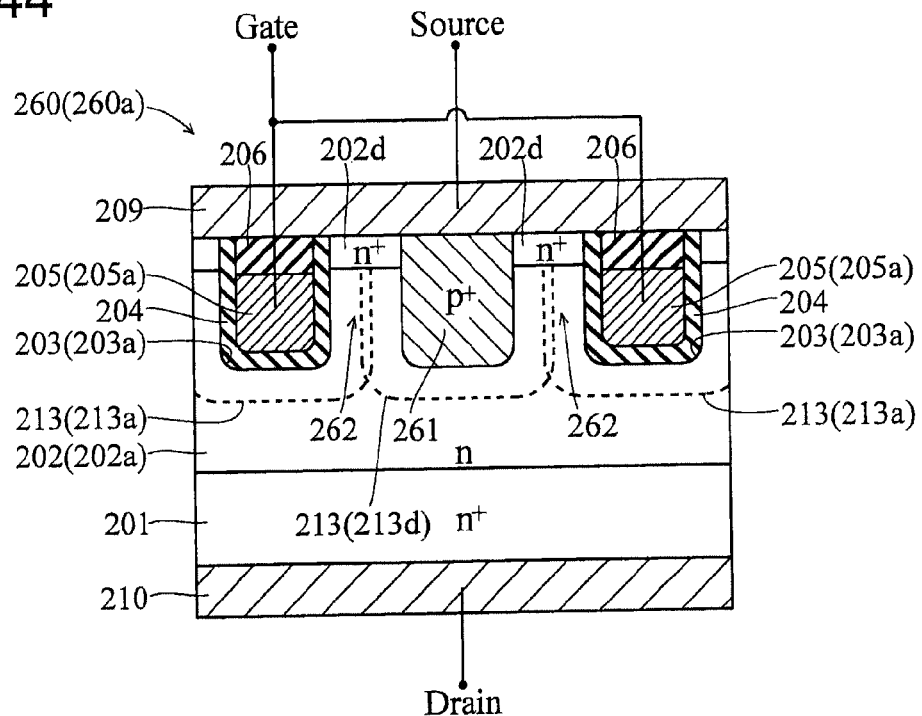
FIG. 44 is a cross sectional view illustrating a structure of a region functioning as a switching transistor of a semiconductor device according to a thirteenth embodiment of the present invention.

In the semiconductor device 260 of the thirteenth embodiment, as illustrated in FIG. 44, the region 260a functioning as a switching transistor includes the trench 203 (203a) filled with the embedded electrode 205 (205a) to which the predetermined control signal is applied, and also a P+ type diffusion region 261 in which P type impurity is doped at high concentration. The P+ type diffusion region 261 is disposed in each region between the neighboring trenches 203a with a predetermined space to the trench 203a one to one. In addition, the P+ type diffusion region 261 has an ohmic contact with the source electrode 209. Note that the P+ type diffusion region 261 is an example of the "current passage interrupting diffusion region" in the present invention.

Further, in the thirteenth embodiment, when a voltage is applied between the source electrode 209 and the drain electrode 210, current flows between the source electrode 209 and the drain electrode 210 so as to pass through each region between the trench 203a and the P+ type diffusion region 261. In other words, in the thirteenth embodiment, each region between the trench 203a and the P+ type diffusion region 261 functions as a current passage 262.

Note that other structure of the region 260a functioning as a switching transistor in the semiconductor device 260 of the thirteenth embodiment is the same as the structure of the region 220a functioning as a switching transistor in the semiconductor device 220 of the ninth embodiment described above. In addition, a structure of the region functioning as a Zener diode in the semiconductor device 260 of the twelfth embodiment (not shown) is the same as the structure of the region 220b functioning as a Zener diode in the semiconductor device 220 of the ninth embodiment or the region 230b functioning as a Zener diode in the semiconductor device 230 of the tenth embodiment.

Next, with reference to FIGS. 44 and 45, an operation of the region 260a functioning as a switching transistor in the semiconductor device 260 according to the thirteenth embodiment will be described.

Note that it is supposed that a negative potential and a positive potential are applied to the source electrode 209 and the drain electrode 210, respectively in the following description of the operation. In other words, a depletion layer 213 (213d) is formed around the P+ type diffusion region 261 regardless of the turned-on state or the turned-off state.

First, in case of the turned-off state, as illustrated in FIG. 44, a negative potential is applied to the embedded electrode 205a so that the depletion layer 213 (213a) is formed around the trench 203a. Thus, the current passage 262 is blocked with the depletion layers 213a and 213d, so that current flowing through the current passage 262 can be interrupted.

Figure 45:
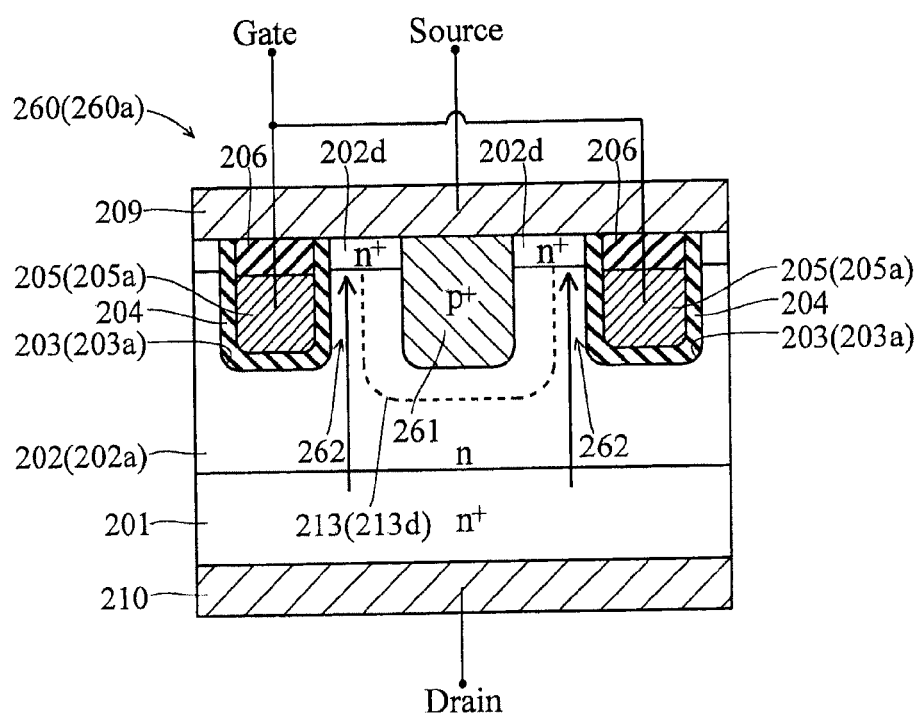
FIG. 45 is a cross sectional view illustrating an operation of a region functioning as a switching transistor of the semiconductor device according to the thirteenth embodiment of the present invention.
Figure 46:
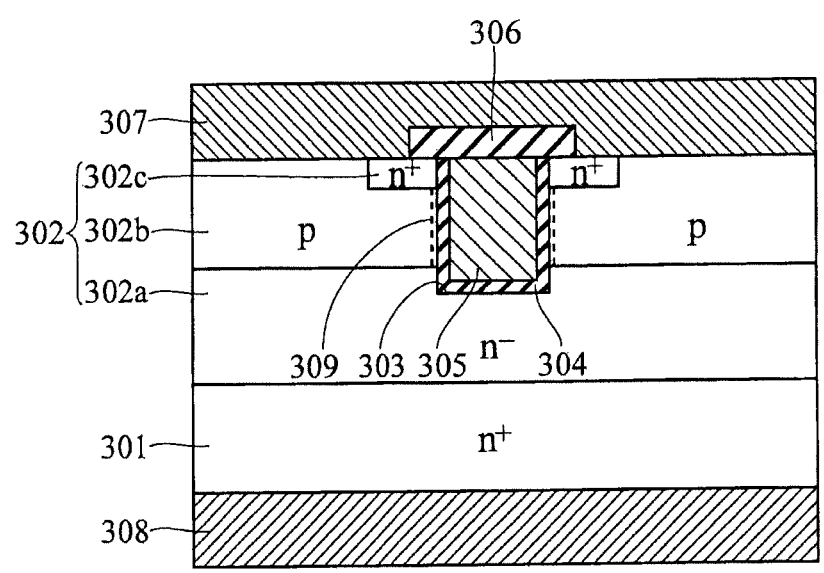
FIG. 46 is a cross sectional view illustrating a structure of a conventional MOSFET (semiconductor device).

Further, in case of switching from the turned-off state to the turned-on state, as illustrated in FIG. 45, a positive potential is applied to the embedded electrode 205a, so that the depletion layer 213a illustrated in FIG. 44 is deleted. Thus, current can flow through the part of the current passage 262 on the embedded electrode 205a side in the arrow direction in FIG. 45.

The effect of the thirteenth embodiment is the same as the effect of the ninth embodiment.

Note that the embodiments disclosed here are merely examples in all points and should not be interpreted as a limitation. The scope of the present invention is defined not by the above description of the embodiments but by the claims, which includes every modification within the meaning and the range that are equivalent to the claims.

For instance, the first to the thirteenth embodiments have the structure in which the upper surface of the interlayer insulator film is flush with the upper surface of the N type epitaxial layer, but the present invention is not limited to this structure. The upper surface of the interlayer insulator film may be positioned higher than the upper surface of the N type epitaxial layer, or the upper surface of the interlayer insulator film may be positioned lower than the upper surface of the N type epitaxial layer.

In addition, the first to the thirteenth embodiments have the structure in which the depth of the trench is smaller than the thickness of the epitaxial layer, but the present invention is not limited to this structure. The trench may penetrate the epitaxial layer and reach the N+ type silicon substrate. For instance, the depth of the trench may be approximately 12 μm.

In addition, the first to the thirteenth embodiments exemplify the structure using a silicon substrate as the substrate, but the present invention is not limited to this structure. A substrate made of SiC or the like (semiconductor substrate) may be used.

In addition, the first to the fourth embodiments use the N type epitaxial layer as the semiconductor layer of one conductivity type, but the present invention is not limited to this structure. A P type epitaxial layer may be used as the semiconductor layer of one conductivity type.

In addition, the fifth to the thirteenth embodiment have the structure in which the plurality of trenches are formed in the N type well region so that at least a part of each region between the neighboring trenches in the N type well region functions as the current passage (channel), but the present invention is not limited to this structure. The plurality of trenches may be formed in a P type well region so that least a part of each region between the neighboring trenches in the P type well region functions as the current passage (channel). In other words, it is possible to adopt a structure in which the conductivity types are reversed.

What is claimed is:

1. A semiconductor device comprising:
   a first region of one conductivity type;
   a second region of the one conductivity type provided on the first region;
   a third region of an inverse conductivity type provided on the first region so as to be contiguous with the second region and the first region; and
   a switching device provided in the second region,
   wherein a first diffusion region of the one conductivity type electrically connected to the second region is formed in an upper region within the third region opposite from the first region,
   wherein a trench in which a gate electrode is embedded is formed in the second region, and the gate electrode is embedded so as to fill the trench halfway across a depth thereof, and
   wherein an interlayer insulator film is embedded in a remaining part of the trench where the gate electrode is not embedded.

2. The semiconductor device according to claim 1, wherein an electrode layer which makes ohmic contact with the second region is formed above the second region,
   the electrode layer extends to reach, and makes ohmic contact with, the first diffusion region electrically connected to the second region, and
   the second region and the first diffusion region are electrically connected to each other via the electrode layer.

3. The semiconductor device according to claim 1, wherein the first diffusion region comprises a plurality of first diffusion regions of the one conductivity type, and the plurality of first diffusion regions and a plurality of second diffusion regions of the inverse conductivity type are formed in the third region,
   the plurality of first diffusion regions and the plurality of second diffusion regions are arranged alternately one by one from a second region side outward away from the second region side, with one of the first diffusion regions located at an innermost position closest to the second region, and
   the first diffusion region located at the innermost position is the first diffusion region electrically connected to the second region.

4. The semiconductor device according to claim 3, wherein the switching device provided in the second region includes a gate electrode, and
   one of the plurality of first diffusion regions located between the second diffusion regions is electrically connected to the gate electrode.

5. The semiconductor device according to claim 3, wherein the plurality of first diffusion regions and the plurality of second diffusion regions are so arranged that one of the first diffusion regions is located at an outermost position farthest away from the second region, and
   the first diffusion region located at the outermost position is electrically connected to the first region.

6. The semiconductor device according to claim 5, further comprising a fourth region provided on the first region and arranged outside the third region opposite from the second region, wherein
   the first diffusion region located at the outermost position is formed so as to extend from the third region to the fourth region, and is electrically connected via the fourth region to the first region.

7. The semiconductor device according to claim 3, wherein the plurality of first diffusion regions and the plurality of second diffusion regions are formed so as to surround the second region.

8. The semiconductor device according to claim 3, wherein the plurality of first diffusion regions and the plurality of second diffusion regions are diffusion regions formed by injecting an impurity into the third region from an upper surface side thereof, and
   a thickness of the plurality of second diffusion regions from an upper surface of the third region is larger than a thickness of the plurality of first diffusion regions from the upper surface of the third region.

9. The semiconductor device according to claim 1, wherein as seen in a sectional view, a width of the third region is larger than a width of the trench.

10. The semiconductor device according to claim 1, wherein
    an upper surface of the interlayer insulator film embedded in the trench is flush with an upper surface of the second region.

* * * * *